(12) United States Patent
Watanabe et al.

(10) Patent No.: US 7,880,215 B2
(45) Date of Patent: Feb. 1, 2011

(54) NONVOLATILE SEMICONDUCTOR STORAGE UNIT AND PRODUCTION METHOD THEREFOR

(75) Inventors: Hirohito Watanabe, Tokyo (JP); Motofumi Saitou, Tokyo (JP); Hiroshi Sunamura, Tokyo (JP)

(73) Assignee: NEC Corporation, Tokyo (JP)

( * ) Notice: Subject to any disclaimer, the term of this patent is extended or adjusted under 35 U.S.C. 154(b) by 815 days.

(21) Appl. No.: 11/667,736

(22) PCT Filed: Nov. 16, 2005

(86) PCT No.: PCT/JP2005/021047

§ 371 (c)(1), (2), (4) Date: May 15, 2007

(87) PCT Pub. No.: WO2006/054605

PCT Pub. Date: May 26, 2006

(65) Prior Publication Data

US 2008/0144377 A1 Jun. 19, 2008

(30) Foreign Application Priority Data

Nov. 16, 2004 (JP) ............................ 2004-331320

(51) Int. Cl.
*H01L 29/76* (2006.01)
*H01L 29/788* (2006.01)

(52) U.S. Cl. ....................................... 257/314; 257/316

(58) Field of Classification Search ......... 257/314–324, 257/E29.129
See application file for complete search history.

(56) References Cited

U.S. PATENT DOCUMENTS 6,465,833 B1 * 10/2002 Jung et al. .................. 257/314
6,897,520 B2 * 5/2005 Vora .......................... 257/316

FOREIGN PATENT DOCUMENTS

| JP | 1-191480 | 8/1989 |
|---|---|---|
| JP | 5-251710 | 9/1993 |

OTHER PUBLICATIONS

"Dictionary of Semiconductor Terms" supervised by Junichi Nishizawa, Nikkan Kogyo Shimbun, Mar. 20, 1999, pp. 970-972).

* cited by examiner

*Primary Examiner*—Cuong Q Nguyen
(74) *Attorney, Agent, or Firm*—McGinn IP Law Group, PLLC

(57) ABSTRACT

A diffusion layer (102) is formed in the surface region of a semiconductor substrate (101). A control gate electrode (103) is formed on the substrate. An interlayer dielectric film (108) covers the entire surface of the substrate. A drain leader line (104) made of a semiconductor such as n-type polysilicon is led from the drain region, and a source leader line (107) is led from the source region through the interlayer dielectric film. The drain leader line is surrounded by an annular floating gate (105). In erase, for example, the control gate is set to a ground potential, and a positive voltage is applied to the drain leader line to remove electrons in the floating gate to the drain leader line. In write, positive voltages are applied to the control gate electrode and drain leader line to generate CHE and inject hot electrons into the floating gate. This allows to thin the gate insulating film of a flash memory, increase the degree of integration of a nonvolatile memory, and lower the driving voltage.

24 Claims, 68 Drawing Sheets

NONVOLATILE SEMICONDUCTOR STORAGE UNIT AND PRODUCTION METHOD THEREFOR

TECHNICAL FIELD

The present invention relates to a nonvolatile semiconductor storage unit and a production method therefor and, more particularly, to a nonvolatile semiconductor storage unit called a flash memory that executes flash erase and a production method therefor.

BACKGROUND ART

Although nonvolatile semiconductor storage units of various schemes have now been put into practical use, a flash EEPROM (flash electrically erasable and programmable read only memory) that electrically executes flash erase is still the mainstream. Several kinds of cell structures have been released in association with the flash EEPROM. A stacked cell is generally used, in which a control gate electrode is stacked on a floating gate, as described in reference 1 ("Dictionary of Semiconductor Terms" supervised by Junichi Nishizawa, Nikkan Kogyo Shimbun, Mar. 20, 1999, pp. 970-972). FIG. 37A shows the structure. As shown in FIG. 37A, in the conventional cell structure, diffusion layers 202 serving as source and drain regions are formed in the surface region of a p-type silicon substrate 201. A gate insulating film 203 made of a silicon oxide film is formed on the substrate, and a floating gate 204 is stacked on the gate insulating film 203. An inter-gate insulating film 205 having, e.g., an ONO (silicon oxide film/silicon nitride film/silicon oxide film) structure is formed on the floating gate 204. A control gate electrode 206 is stacked on the inter-gate insulating film 205.

The erase and write for the memory cell are executed in the following way. In the erase, as shown in FIG. 37B, the control gate electrode is grounded, and the drain floats. A voltage of 12 V is applied to the source to apply a high electric field to the gate insulating film 203 so that electrons accumulated in the floating gate 204 are removed to the source by the FN (Fowler-Nordheim) current. In the write, a ground potential and a voltage of 5 V are applied to the source and drain, respectively. A voltage of 12 V is applied to the control gate electrode 206 to generate CHE (Channel Hot Electrons) in the channel, and some of them are injected into the floating gate.

DISCLOSURE OF INVENTION

Problems to be Solved by the Invention

One problem of the conventional flash memory is that downsizing conforming to the scaling law is impossible. The reason for this is as follows. Charges injected into the floating gate need to be held for, e.g. about 10 years. To meet this requirement, the gate insulating film 203 must not have a predetermined thickness or less. The write and erase are done by injecting and removing electrons via the gate insulating film. This cycle degrades the insulating film. To suppress this degradation and guarantee a predetermined number of cycles or more, it is no longer possible to thin the gate insulating film.

In the stack memory structure, the control gate electrode must control the channel potential via the floating gate. For this reason, a high voltage of, e.g., 12 V is applied in the write. This voltage cannot be lowered by downsizing. The reason is as follows. Even when the channel length decreases, the gate insulating film cannot be thin, as described above. Hence, as a conventional measure against punch-through for a short channel length, the channel impurity concentration is increased. As a result, the threshold voltage rises, resulting in a higher gate voltage. To prevent electron removal from the floating gate upon high voltage application to the control gate electrode, the inter-gate insulating film must have a predetermined thickness or more.

As another problem of the prior art, a write error occurs at a high probability due to so-called gate disturbance in the write. In the write, the control gate electrodes of unselected cells connected to the same word line as a selected cell receive a voltage of, e.g., 12 V which is equal to the voltage applied to the selected cell. At this time, the source of each unselected cell is grounded while the drain floats. The high voltage application to the control gate electrode increases the possibility of electron injection from the channel to the floating gate or electron removal from the floating gate to the control gate electrode.

The present invention has been made to solve the above-described problems of the prior art, and has as the first object to realize downsizing conforming to the scaling law, as the second object to lower the driving voltage, and as the third object to provide a memory with minimum write errors.

Means of Solution to the Problems

In order to achieve the above-described object, a nonvolatile semiconductor storage unit of the present invention comprises a control transistor having a control gate electrode formed on a semiconductor substrate, and source and drain regions formed in the semiconductor substrate to sandwich the control gate electrode, and a switching element having a leader line led from one of the source and drain regions, and a floating gate which controls an ON/OFF state of the leader line by a charge accumulation state.

In order to achieve the above-described object, a nonvolatile semiconductor storage unit of the present invention comprises a control transistor having a control gate electrode formed on a semiconductor substrate, and source and drain regions formed in the semiconductor substrate to sandwich the control gate electrode, and a switching element having a leader line led from one of the source and drain regions and at least partially made of a semiconductor material, and a floating gate formed in the vicinity of the leader line.

In order to achieve the above-described object, a nonvolatile semiconductor storage unit of the present invention comprises a control transistor having a control gate electrode, and a switching element having a floating gate and connected in series to the control transistor, wherein the current path of the switching element is formed into a shape perpendicular or almost perpendicular to a surface of the semiconductor substrate.

Effect of the Invention

In a memory cell of the present invention with the above-described arrangement, the control gate electrode and floating gate are not stacked, and a switching element controlled by the floating gate using the drain leader line of the control transistor with the control gate electrode is formed. According to this structure, the control gate electrode directly faces the channel on the semiconductor substrate. For this reason, the gate insulating film between them need not have either retention or endurance, and thin film formation conforming to the scaling law is possible. Additionally, since the control gate electrode directly faces the channel, the gate insulating film can be thinner, and the concentration of the channel can be lower. Accordingly, the gate application voltage can be made low. It is also possible to relax gate disturbance that poses a serious problem in the prior art. Since a silicon oxide film need not always be used as the gate insulating film on the silicon substrate, a high-K insulating film can be employed as the gate insulating film of the control transistor.

Hence, according to the present invention, a nonvolatile semiconductor memory that ensures high density, high speed, and high reliability can be provided.

BEST MODE FOR CARRYING OUT THE INVENTION

An embodiment of the present invention will be described next in detail with reference to the accompanying drawings.

Figure 1A:
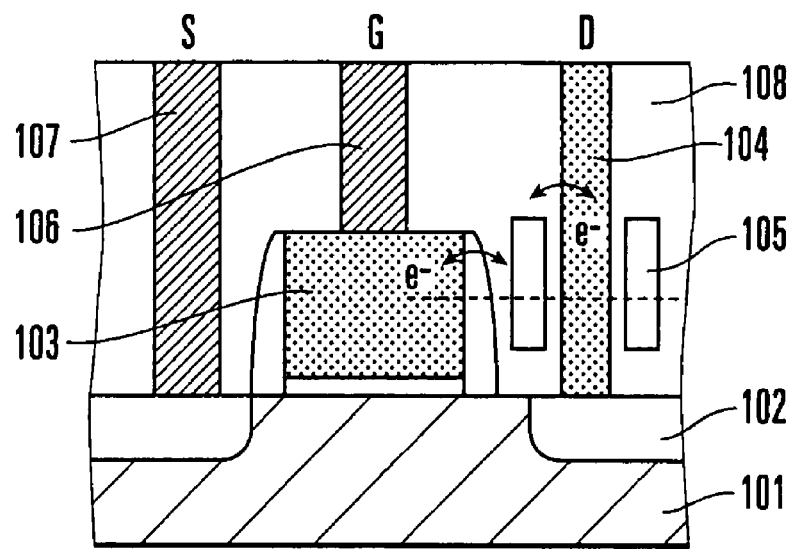
FIG. 1A is a longitudinal sectional view showing the main part of an embodiment of the present invention.

FIG. 1A is a sectional view of a memory cell according to an embodiment of the present invention.

Figure 1B:
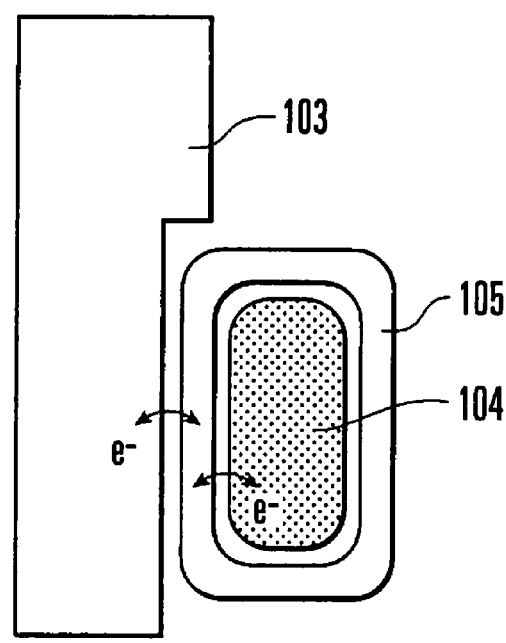
FIG. 1B is a cross-sectional view showing the main part of the embodiment of the present invention.

FIG. 1B is a sectional view taken along a line A-A in FIG. 1A. Referring to FIGS. 1A and 1B, reference numeral 101 denotes a semiconductor substrate; 102, diffusion layers serving as source and drain regions; 103, a control gate-electrode; 104, a drain leader line that is mainly made of a semiconductor and serves as the current path of a switching element controlled by a floating gate 105; 106, a gate leader line; 107, a source leader line; and 108, an interlayer dielectric film. The transistor formed by the control gate electrode 103 and diffusion layers 102 is a MOSFET with a normal structure which can be designed like the transistor of a DRAM. Hence, the gate insulating film can be made of a high-K insulating film.

The source and drain can exchange their positions depending on the operation mode of the transistor. In this specification, however, the diffusion layer on the left in a drawing is called a source, and that on the right is called a drain, for the descriptive convenience.

Typically, a p-type silicon substrate or a silicon substrate having a p-well is used as the semiconductor substrate 101. However, the present invention is not limited to this. An SOI substrate and a silicon substrate having an SiGe layer are also usable. The control gate electrode 103 is an interconnection serving as a word line in a cell array. N-type polysilicon is suitably used, and even polycide, silicide, and a refractory metal are also usable. When the upper surface of the control gate electrode 103 is made to face the lower surface of the floating gate 105 to inject electrons from the control gate electrode 103 to the floating gate by using an FN current or PF (Poole-Frenkel) current in the write, the write voltage can be made low by forming at least the upper surface part of the control gate electrode 103 from a metal with a small work function. The metal preferably has a work function of 4.1 eV or less. Examples of the metal are Sr, Y, Gd, Lu, Hf, Ti, Sm, Eu, Nd, Ce, Ba, Cs, and an alloy thereof.

A silicide layer of, e.g., nickel silicide or cobalt silicide is preferably formed on the interface between each diffusion layer 102 serving as the source/drain region and the leader line to reduce the contact resistance. The silicide layer may cover the whole surface of the source and drain regions. When a contact hole is formed, a silicide layer may be formed on its bottom surface.

The drain leader line 104 serves as the current path of the switching element having the floating gate 105, as described above. The drain leader line 104 may be made of n-type polysilicon if the drain is an n-type diffusion layer. The drain leader line 104 may be made of n-p polysilicon or n-p-n polysilicon. Alternatively, n-i-p polysilicon, n-i-n polysilicon, or m-i-m or m-s-m (i indicates an insulating film; m, a metal or silicide; and s, a semiconductor) may be used. If the drain leader line 104 has an i-layer or an n-p-n structure, the floating gate is arranged at a portion opposing the i-layer or p-layer. Otherwise, the floating gate is arranged at a portion opposing the n-layer. The i-layer may be omitted, or the semiconductor layer under the i-layer may be made of a single-crystal silicon film. To suppress the drain leader resistance, the impurity concentration of the n-type silicon film is preferably $1 \times 10^{18}/\text{cm}^3$ or more.

If the drain leader line 104 partially includes an insulating film, and the carriers of the drain leader line 104 are electrons, a material with a low Electron barrier such as BST (Barium Strontium Titanate), tantalum oxide, zirconium oxide, or hafnium oxide is preferably used as the material of the insulating film. If the carriers are holes, a material with a low hole barrier such as silicon nitride is preferably used.

The floating gate can be formed by using undoped polysilicon or doped polysilicon. The floating gate may be formed by using a silicon nitride film ($Si_3N_4$) or aluminum oxide film ($Al_2O_3$) serving as an electron trap film. The floating gate preferably has an annular shape surrounding the drain leader line, as shown in FIG. 1B, to control the current better. The floating gate may partially overlap the control gate electrode. Conversely, the control gate electrode may partially overlap the floating gate. The overlap between the floating gate and the control gate electrode facilitates carrier injection or removal from the control gate electrode to the floating gate. The floating gate may be formed from an electron trap film made of an insulator. Examples of preferable materials are aluminum oxide and silicon nitride. A ferroelectric film is also usable. The floating gate is preferably thin to ensure a large voltage change with respect to a change in charges accumulated in it. In this sense, the thickness is preferably 50 nm or less. The floating gate need not always be formed from a continuous film but may be formed as a number of dots.

The gate leader line 106 and source leader line 107 are plugs made of, e.g., doped polysilicon or W/Ti/TiN. These leader lines need not always exist in each cell. One leader line may be provided for a plurality of cells depending on the cell array structure.

Figure 1C:
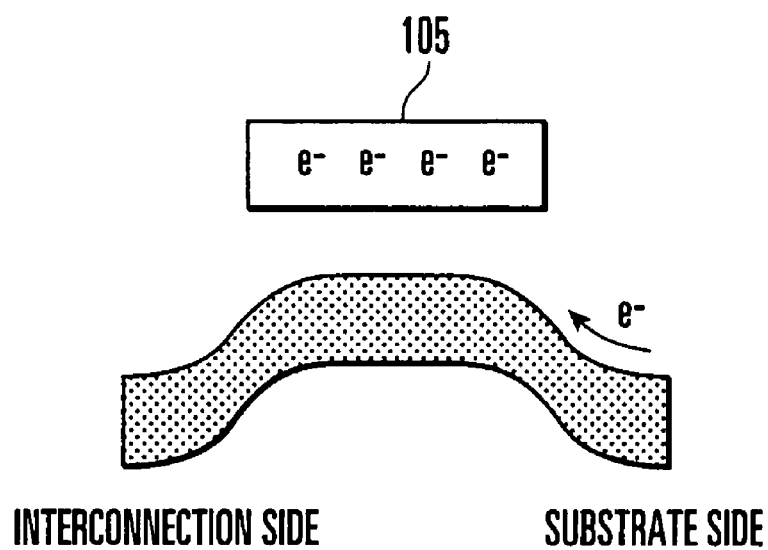
FIGS. 1C and 1D are explanatory views of the operation of the embodiment of the present invention.
Figure 1D:
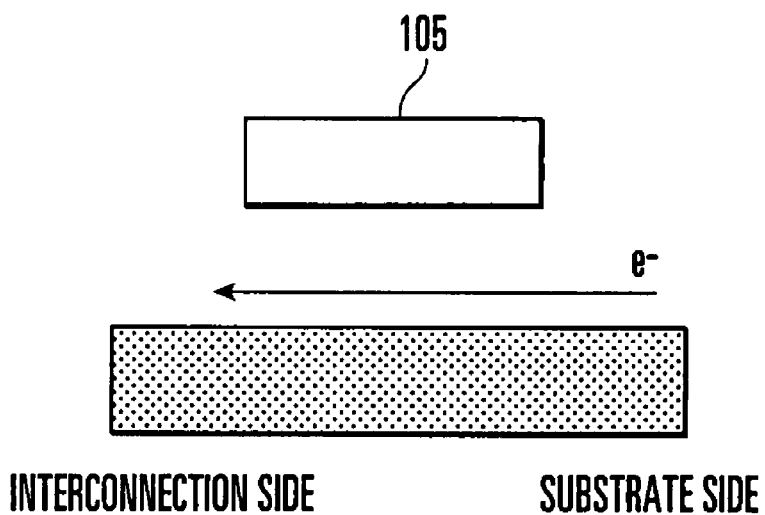

The principle of information read from a memory cell according to this embodiment will be described next. Assume that the transistor is an n-channel MOS transistor, and the drain leader line is made of n-type polysilicon. In this case, the read is done by, e.g., applying a voltage of 2 V to the gate electrode, grounding the source leader line, and applying a voltage of 1 V to the drain leader line. FIGS. 1C and 1D are views showing the band states of the drain leader line. FIG. 1C shows a state wherein elections are accumulated in the floating gate. FIG. 1D shows a state wherein no electrons are accumulated in the floating gate. When electrons are accumulated in the floating gate, the band of the region surrounded by the floating gate is lifted (converted into pseudo p-type), and an electron barrier is formed in this part. Hence, no current flows to the drain leader line. Alternatively, only a slight current flows because the drain leader line exhibits a high resistance. When no electrons are accumulated in the floating gate, no electron barrier is formed in the drain leader line, and a large current flows to the drain leader line.

Stored information is identified by detecting ON/OFF or the magnitude of the current flowing to the drain leader line.

The erase and write for the memory cell according to this embodiment will be described next.

The erase is flash erase and is done by removing carriers from the floating gate to the drain leader line or control gate electrode or to both the drain leader line and control gate electrode. To remove electrons to the drain leader line, a positive high voltage is applied to the drain leader line. At this time, a ground potential or an appropriate intermediate potential is applied to the control gate electrode. To remove electrons to the control gate electrode, a positive high voltage is applied to the control gate electrode. At this time, the drain leader line is grounded or opened. To remove electrons to both the drain leader line and control gate electrode, a positive high voltage is applied to both of them. At this time, the substrate potential is preferably 0. In the erase, the source is opened or grounded. If the drain leader line has a p-n junction, the erase may be done by causing avalanche breakdown in the drain leader line to inject hot carriers.

The write is executed by hot electron injection in each cell or by using an FN current or PF current. To do the write by CHE injection in the transistor with the control gate electrode, the transistor is turned on by applying a voltage to the control gate electrode. Additionally, a high voltage is applied to the drain to generate CHE and inject hot electrons into the floating gate. If the drain leader line has a p-n junction, CHE generated in it may be used. For example, assume that the drain leader line is of p-type on the interconnection side and of n-type on the substrate side. In this case, it is possible to generate CHE in the p-n junction by turning on the transistor with the control gate electrode and applying a negative voltage of a predetermined value or more to the drain leader line. Hot electrons are injected by using this.

In the write using an FN current or PF current, electrons are injected into the floating gate by applying a high electric field between the floating gate and the control gate electrode, drain leader line, or substrate. For example, a voltage of −4 V is applied to the drain leader line, and a voltage of +6 V is applied to the control gate electrode to flow an FN current between the drain leader line and the floating gate, thereby executing the write.

In the write, charges accumulated in the floating gate may be complemented by injecting electrons even to the insulating film (gate insulating film) between the drain leader line and the floating gate.

A nonvolatile memory device is formed by arraying a plurality of memory cells shown in FIG. 1A on a substrate. In addition to power and ground lines, a data bus, address bus, and control lines are laid out on the nonvolatile memory device. Circuits such as a control circuit, address register, program voltage generation circuit, erase control circuit, write circuit, sense amplifier, and input/output buffer are provided. Control signals such as WEbar, CEbar, and OEbar are input to the control circuit. The control circuit controls the operation of each unit on the basis of the control signals. An address signal is input from an external device to the address register. X and Y decoders decode the address signal. The X decoder selects a word line of the memory cell array. A cell connected to the word line is selected. The memory cell also connects to a bit line. The bit line is selected by a Y gate controlled by the Y decoder, and connected to the write circuit and sense amplifier. The write circuit and sense amplifier connect to the input/output buffer. In the write, externally input data is transmitted to the bit line via the input/output buffer and write circuit and written in the cell selected by the word line. In the data read, a signal read to the bit line is amplified by the sense amplifier and output to the outside via the input/output buffer. In the erase, data in all memory cells or in a block of memory cells are erased at once via the erase control circuit. However, in the present invention, the erase may be executed individually in each cell.

The memory cell according to the present invention can be used to form such a single memory device. The memory cell is also usable for a memory unit formed on the same substrate as a logic circuit unit to form a so-called embedded device.

Examples of the present invention will be described next.

EXAMPLE 1

Figure 2A:
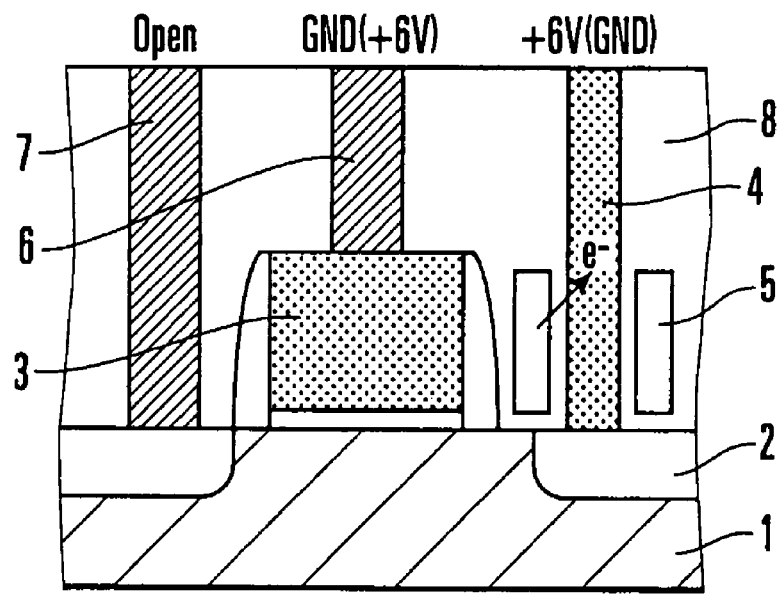
FIGS. 2A to 2D are sectional views showing the main part of Example 1 of the present invention.
Figure 2B:
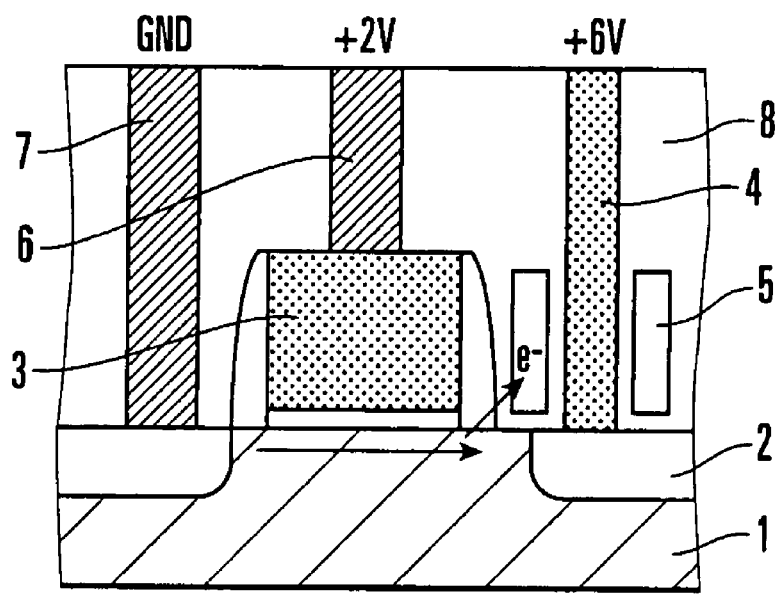
Figure 2C:
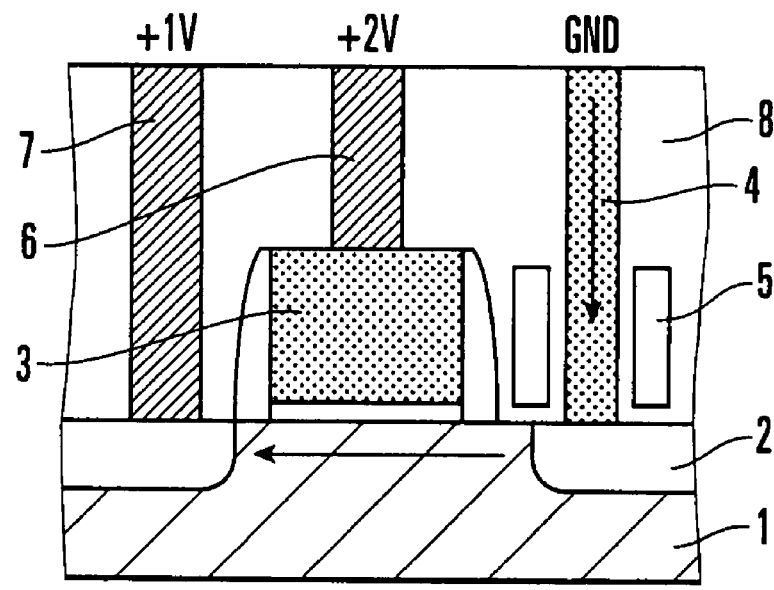
Figure 2D:
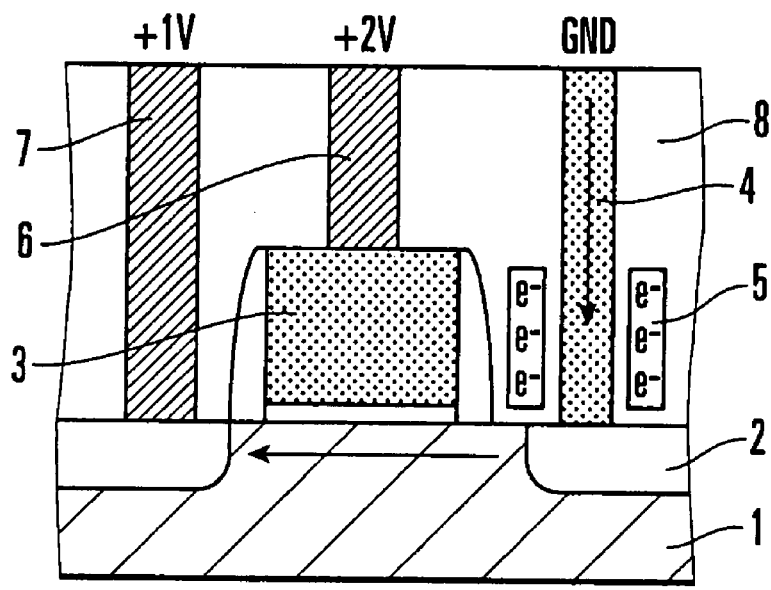

FIGS. 2A to 2D are sectional views showing the main part of Example 1 of the present invention. FIG. 2A shows a state in the erase, FIG. 2B shows a state in the write, and FIGS. 2C and 2D show states in the read. As shown in FIGS. 2A to 2D, n-type diffusion layers 2 serving as source and drain regions are formed in the surface region of a p-type silicon substrate 1. A control gate electrode 3 is formed on the substrate. An interlayer dielectric film 8 covers the entire upper surface of the substrate. A drain leader line 4 made of n-type polysilicon, a gate leader line 6 having a W/Ti/TiN structure, and a source leader line 7 having a W/Ti/TiN structure are led from the drain region, control gate electrode 3, and source region, respectively, through the interlayer dielectric film 8.

In the erase, as shown in FIG. 2A, the source is opened, the control gate electrode is grounded, and a voltage of +6 V is applied to the drain leader line to apply a high electric field to the gate insulating film between the floating gate and the drain leader line, thereby removing electrons in the floating gate to the drain leader line. Alternatively, the drain leader line is grounded, and a voltage of +6 V is applied to the control gate electrode to apply a high electric field to the insulating film between the floating gate and the control gate electrode, thereby removing electrons in the floating gate to the control gate electrode. A high voltage may be applied to both the control gate electrode and the drain leader line to remove electrons to both of them. In the write, as shown in FIG. 2B, a voltage of +2 V is applied to the control gate electrode, the source is grounded, and a voltage of +6 V is applied to the drain leader line to generate CHE in the transistor with the control gate electrode, thereby injecting hot electrons into the floating gate.

The read is done by applying a voltage of +2 V to the control gate electrode and a voltage of +1 V to the drain leader line and grounding the source (reverse read). When the cell is in the erase state, no electron barrier is formed in the drain leader line. Hence, the switching element formed in the drain leader line is in the ON state [FIG. 2C]. When the cell is write-accessed, an electron barrier is formed in the drain leader line near the substrate-side end face of the floating gate. Hence, the switching element formed in the drain leader line is turned off [FIG. 2D]. The read can also be done by applying a voltage of +2 V to the control gate electrode and a voltage of +1 V to the source and grounding the drain leader line (forward read).

EXAMPLE 2

Figure 3A:
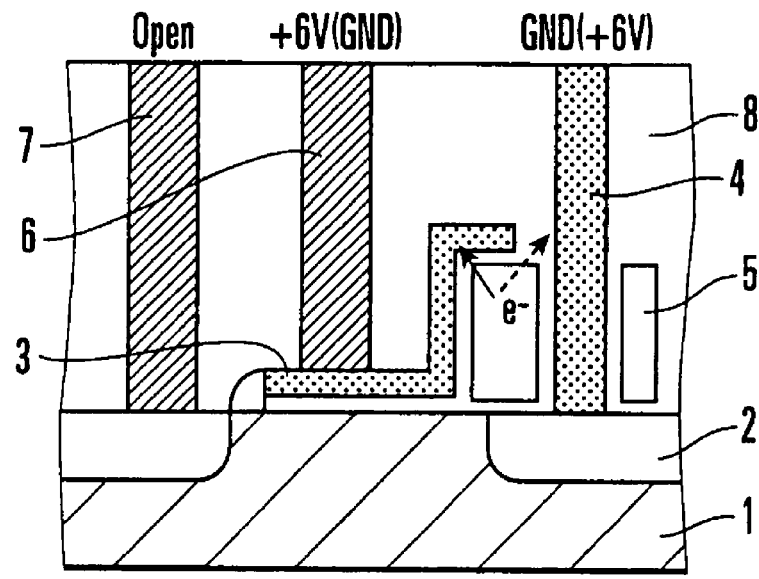
FIGS. 3A to 3D are sectional views showing the main part of Example 2 of the present invention.
Figure 3B:
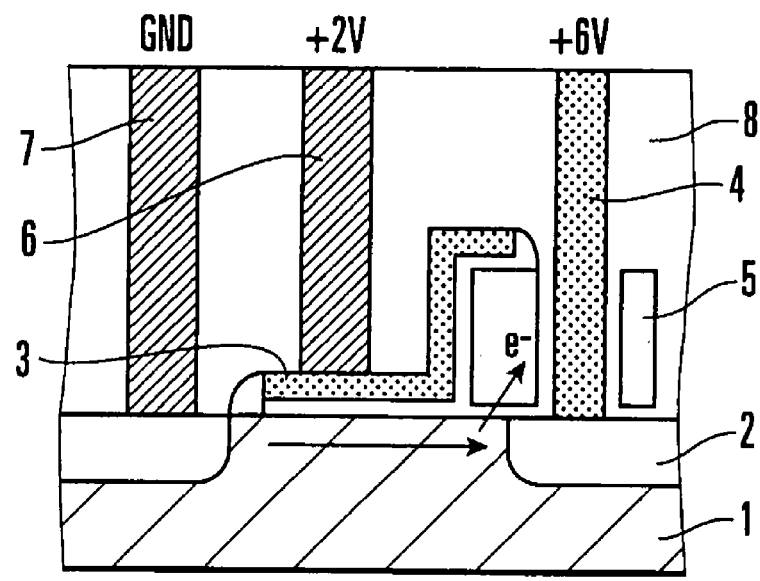
Figure 3C:
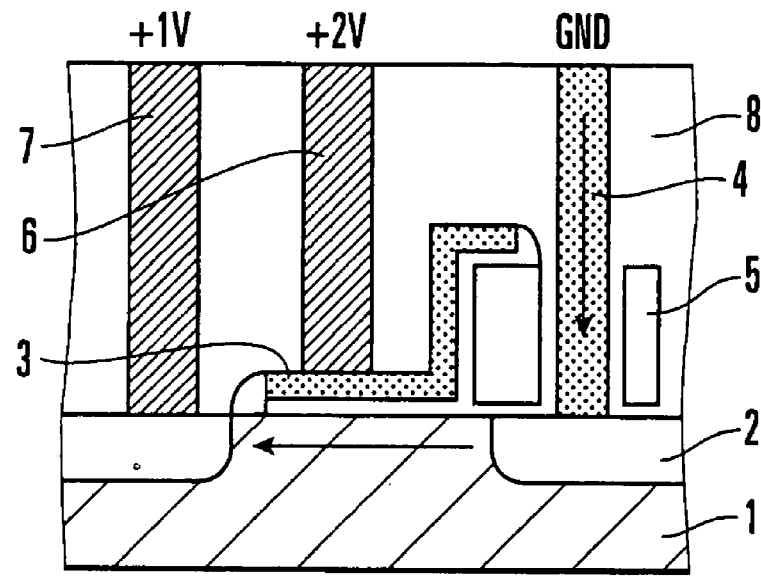
Figure 3D:
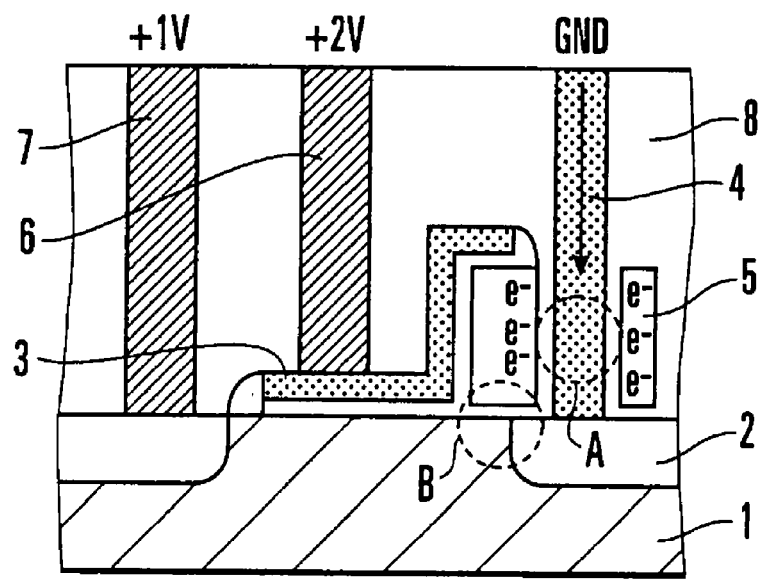

FIGS. 3A to 3D are sectional views showing the main part of Example 2 of the present invention. FIG. 3A shows a state in the erase, FIG. 3B shows a state in the write, and FIGS. 3C and 3D show states in the read. The same reference numerals as in FIGS. 2A to 2D denote parts with the same functions in FIGS. 3A to 3D, and a repetitive description will be omitted as needed (this also applies to the following examples). Example 2 is different from Example 1 shown in FIGS. 2A to 2D in that a control gate electrode 3 has a crank-shaped section so as to partially overlap a floating gate 5. Another different point is that the floating gate 5 covers part of the channel region of the transistor controlled by the control gate electrode 3.

In the erase, as shown in FIG. 3A, a voltage of +6 V is applied to one of the control gate electrode 3 and a drain leader line 4, and the other is grounded to apply a high electric field to the insulating film between the floating gate and the drain leader line or between the floating gate and the control gate electrode, thereby removing electrons in the floating gate to the drain leader line 4 or control gate electrode 3. In the write, as shown in FIG. 3B, a voltage of +2 V is applied to the control gate electrode, the source is grounded, and a voltage of +6 V is applied to the drain leader line to generate CHE in the transistor with the control gate electrode, thereby injecting hot electrons into the floating gate.

The read is done by applying a voltage of +2 V to the control gate electrode and a voltage of +1 V to the source and grounding the drain leader line. When the cell is in the erase state, no electron barrier is formed in the drain leader line. Hence, the switching element: formed in the drain leader line is in the ON state [FIG. 3C]. When the cell is write-accessed, an electron barrier is formed in the drain leader line to suppress the current flowing through the drain leader line. Simultaneously, the floating gate 5 also suppresses the current flowing through the channel of the transistor controlled by the control gate electrode 3. That is, according to the cell structure of this example, in the write state, the current is suppressed at two points A and B shown in FIG. 3D. This example allows to more easily identify the ON/OFF (or magnitude) of the current. Even in this example, the reverse read described in Example 1 can be executed. As the voltage applied to the transistor, an optimum voltage for the read is set, as a matter of course. In the following examples, a read in one direction will be described. However, either reverse read or forward read can be selected depending on the intention of the circuit designer.

EXAMPLE 3

Figure 4A:
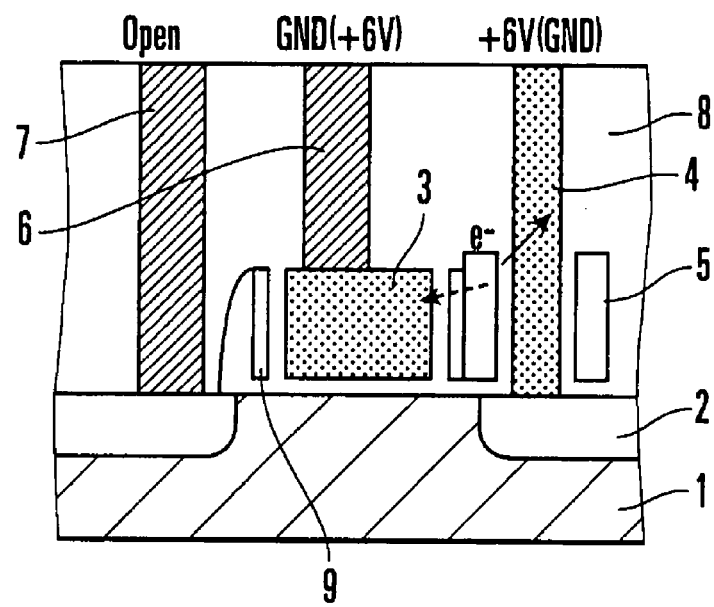
FIGS. 4A to 4D are sectional views showing the main part of Example 3 of the present invention.
Figure 4B:
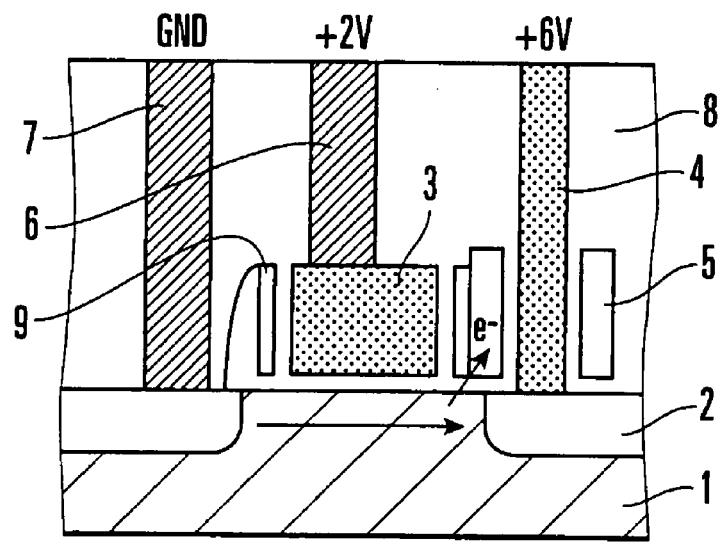
Figure 4C:
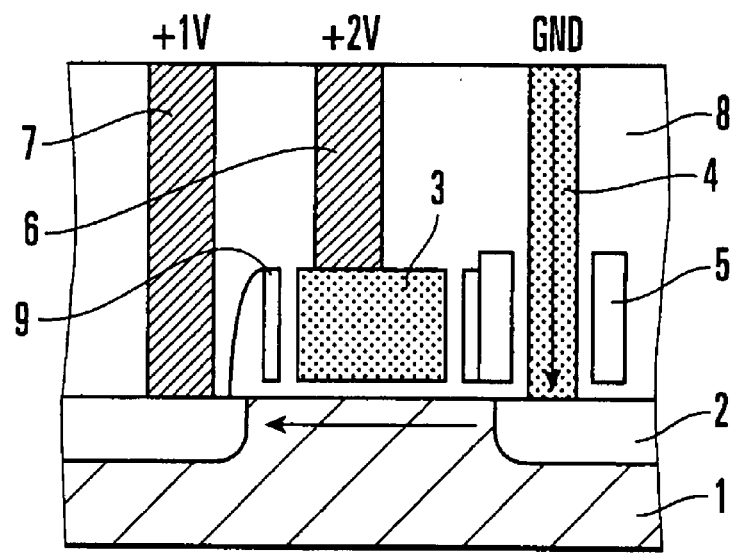
Figure 4D:
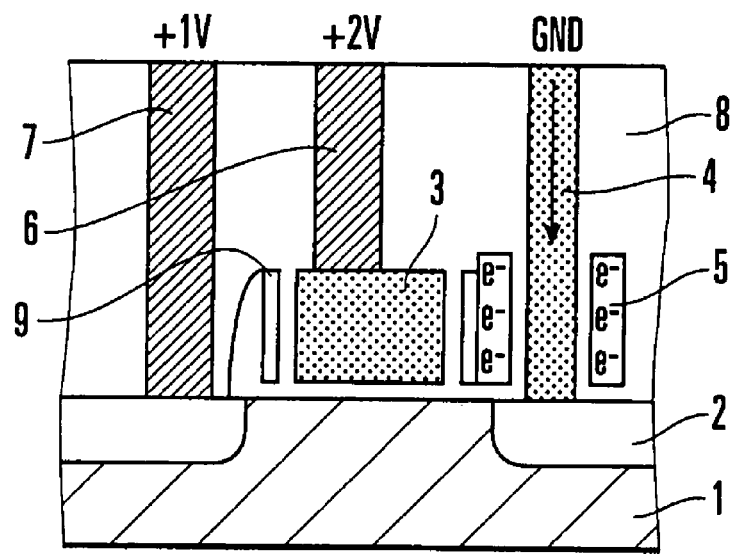

FIGS. 4A to 4D are sectional views showing the main part of Example 3 of the present invention. FIG. 4A shows a state in the erase, FIG. 4B shows a state in the write, and FIGS. 4C and 4D show states in the read. Example 3 is different from Example 1 shown in FIGS. 2A to 2D in that a sidewall formed on the side surface of a control gate electrode 3 includes a polysilicon film which combines with a floating gate 5 and forms part of it on the side of the drain leader line. That is, a sidewall silicon film 9 formed on the side surface of the control gate electrode 3 forms part of the floating gate 5 on the side of the drain leader line.

With this structure, it is possible to accurately control the distance between the control gate electrode 3 and the floating gate 5. For example, in removing electrons in the floating gate to the control gate electrode in the erase, the variation in charges in the floating gate after removal can be minimized. That is, the characteristic variation of the cell can be suppressed.

The erase method, write method, and read method of this example are the same as in Example 2.

EXAMPLE 4

FIGS. 5A to 5D are sectional views showing the main part of Example 4 of the present invention.

Figure 5A:
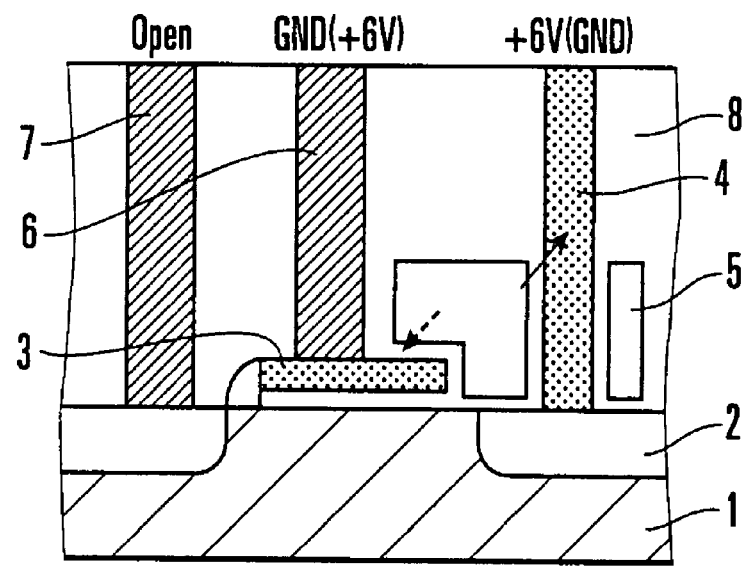
FIGS. 5A to 5D are sectional views showing the main part of Example 4 of the present invention.
Figure 5B:
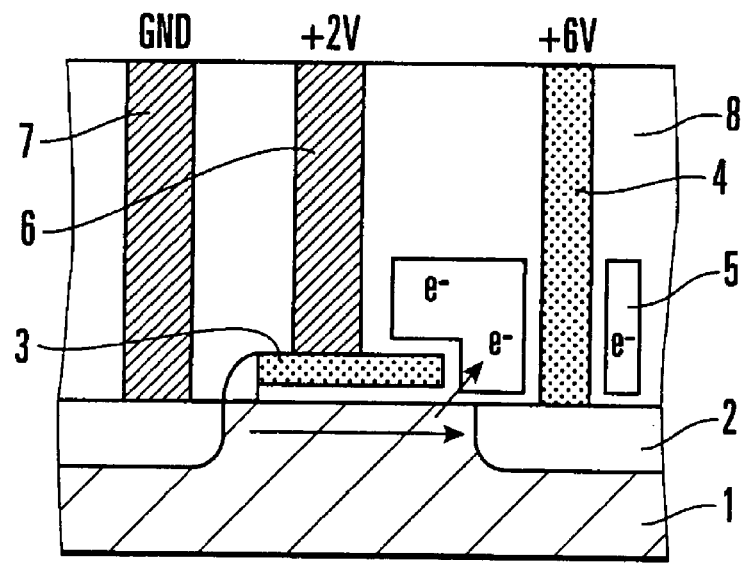
Figure 5C:
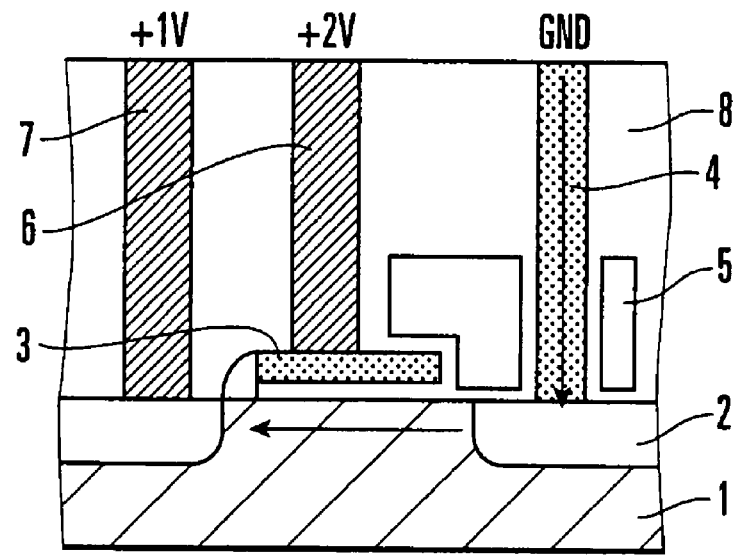
Figure 5D:
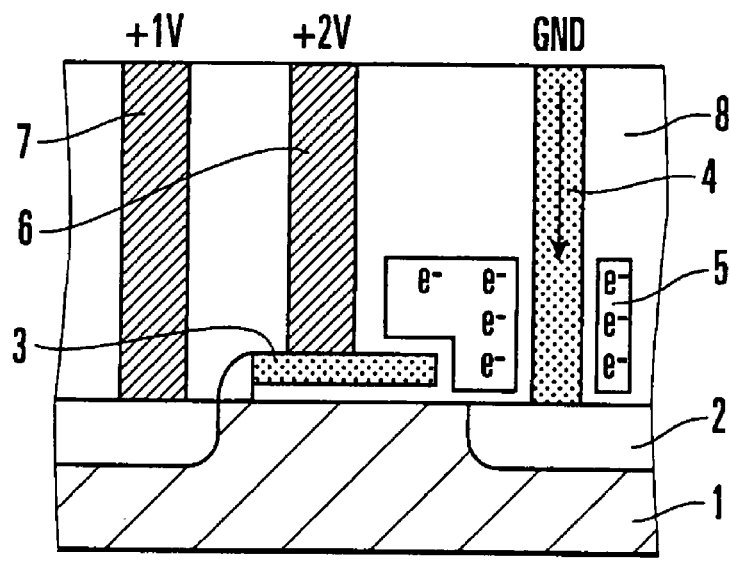

FIG. 5A shows a state in the erase, FIG. 5B shows a state in the write, and FIGS. 5C and 5D show states in the read. Example 4 is different from Example 1 shown in FIGS. 2A to 2D in that a floating gate 5 has an inverted L-shaped section so as to partially overlap a control gate electrode 3.

With this structure, it is possible to accurately control the distance between the control gate electrode 3 and the floating gate 5. For example, in removing electrons in the floating gate to the control gate electrode in the erase, the variation in charges in the floating gate after removal can be minimized. That is, the characteristic variation of the cell can be suppressed.

The erase method, write method, and read method of this example are the same as in Example 2.

EXAMPLE 5

Figure 6A:
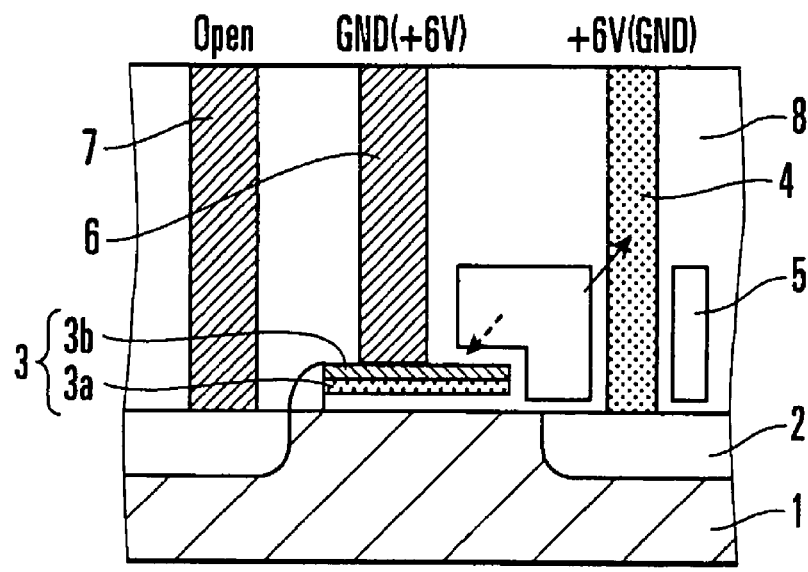
FIGS. 6A to 6D are sectional views showing the main part of Example 5 of the present invention.
Figure 6B:
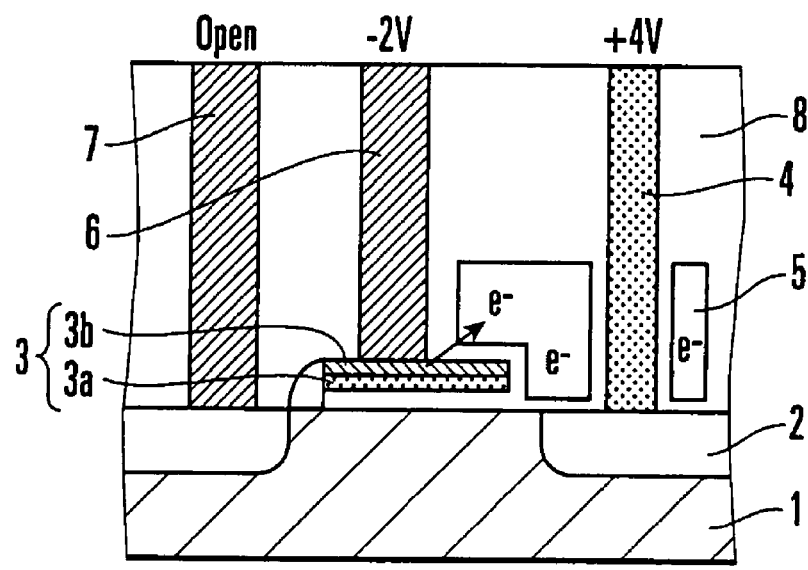
Figure 6C:
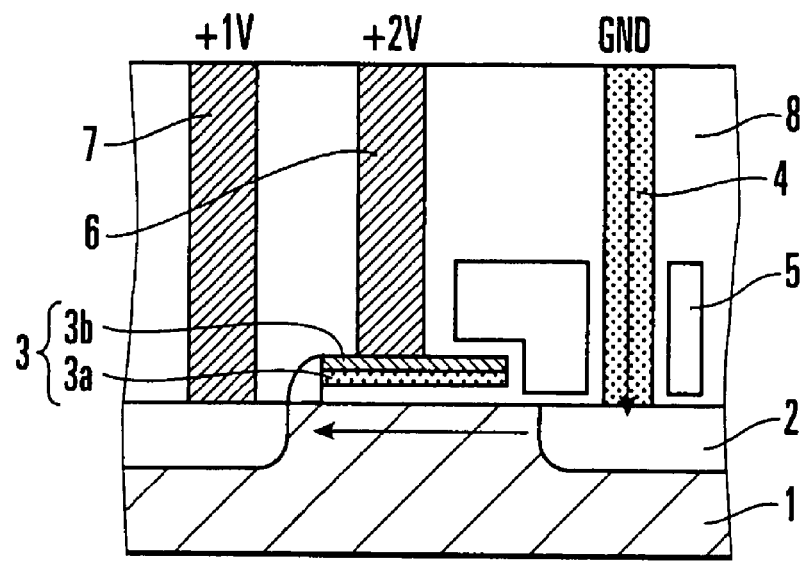
Figure 6D:
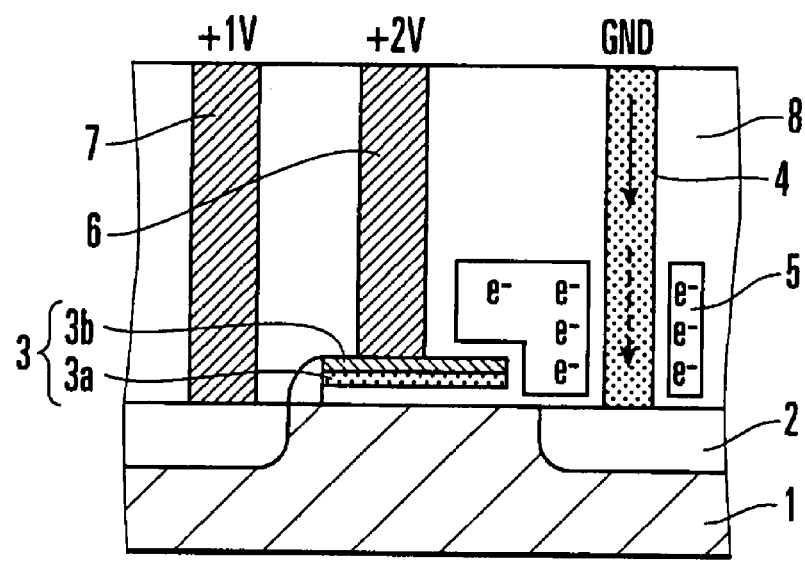

FIGS. 6A to 6D are sectional views showing the main part of Example 5 of the present invention. FIG. 6A shows a state in the erase, FIG. 6B shows a state in the write, and FIGS. 6C and 6D show states in the read. Example 5 is different from Example 4 shown in FIGS. 5A to 5D in that the lower portion of a control gate electrode 3 is made of a polysilicon film 3a, and the upper portion, i.e., the portion facing a floating gate 5 is made of a metal film 3b. The metal film 3b is made of a metal with a small work function.

The erase method and read method of this example are the same as in Example 4. The write is done by using an FN current from the control gate electrode 3. More specifically, a voltage of −2 V is applied to the control gate electrode, and a voltage of +4 V is applied to the drain leader line to inject electrons from the control gate electrode 3. According to this example, since the write is executed by flowing the FN current via the metal film 3b made of a material with a small work function, the write voltage can be low. In addition, since the write is done by using the FN current, current consumption for the write can be reduced.

EXAMPLE 6

Figure 7A:
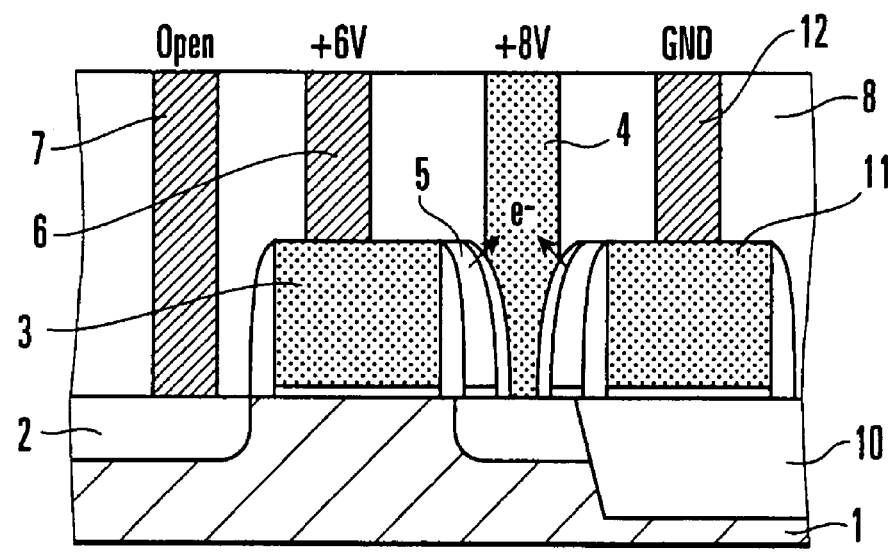
FIGS. 7A to 7E are sectional views showing the main part of Example 6 of the present invention.
Figure 7B:
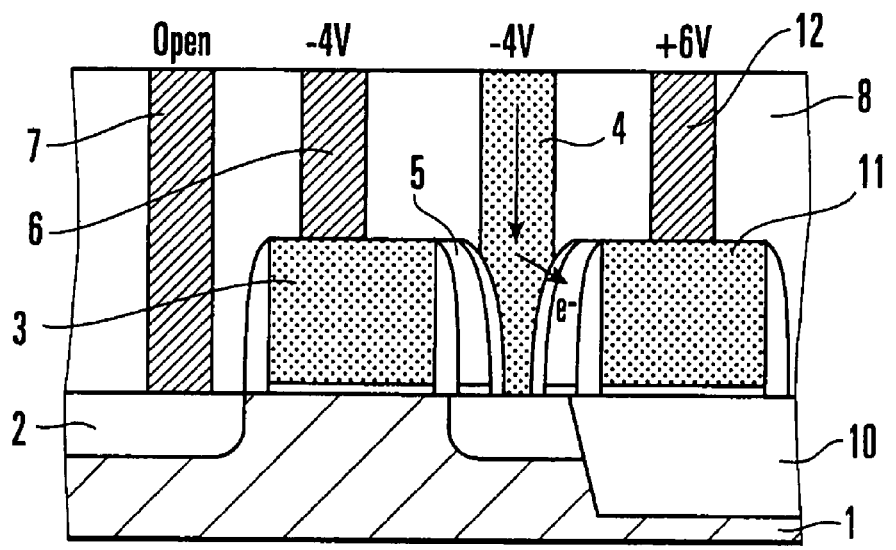
Figure 7C:
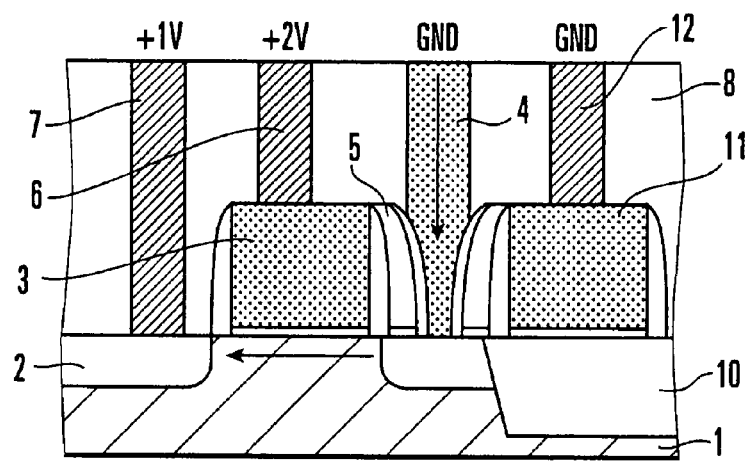
Figure 7D:
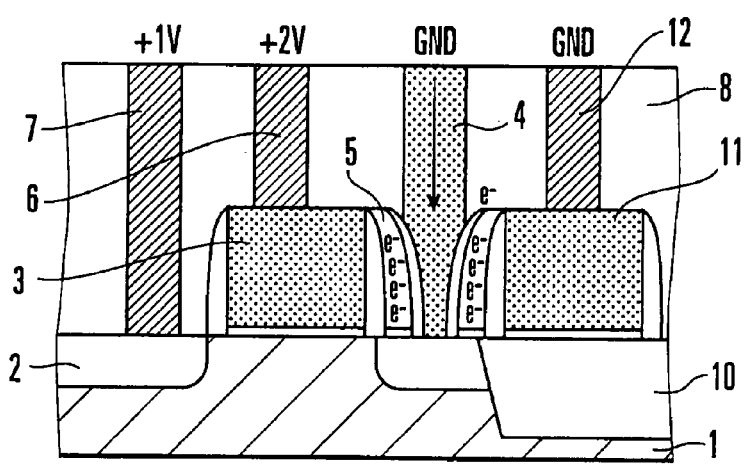
Figure 7E:
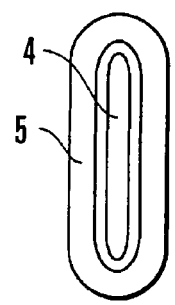

FIGS. 7A to 7E are sectional views showing the main part of Example 6 of the present invention. FIG. 7A shows a state in the erase, FIG. 7B shows a state in the write, FIGS. 7C and 7D show states in the read, and FIG. 7E shows the section of the contact portion. Example 6 is different from Example 1 shown in FIGS. 2A to 2D in that a write/erase control interconnection is provided adjacent to a control gate electrode, and a drain leader line is formed between the control gate electrode and the write/erase control interconnection. More specifically, as shown in FIGS. 7A to 7E, a write/erase control interconnection 11 having the same shape as a control gate electrode 3 is provided on an element isolation region 10. A write/erase control interconnection leader line 12 is led from the write/erase control interconnection 11. A floating gate 5 and a drain leader line 4 are formed between the control gate electrode 3 and the write/erase control interconnection 11.

The floating gate and drain leader line are formed between the control gate electrode and the write/erase control interconnection. This allows to suppress the variation in the process of forming them and form them into stable shapes. Especially when the space between the control gate electrode and the write/erase control interconnection serves as a contact hole in itself, the influence of misalignment can be eliminated by forming the contact hole using a self-aligning contact method. This increases the position accuracy of the contact hole. Since a long contact portion can be formed by using the self-aligning method, the controllability by the floating gate can be improved. When the leader line is led from the write/erase control interconnection 11, it is possible to more efficiently execute the erase and write by using the write/erase control interconnection.

In the erase, as shown in FIG. 7A, the source is opened, and voltages of +6 V, +8 V, and 0 V are applied to the control gate electrode 3, drain leader line 4, and write/erase control interconnection leader line 12, respectively, to apply a high electric field to the gate insulating film between the floating gate and the drain leader line on the side of the write/erase control interconnection, thereby removing electrons in the floating gate to the drain leader line 4. In the write, as shown in FIG. 7B, the source is opened, a voltage of −4 V is applied to the control gate electrode and drain leader line, and a voltage of +6 V is applied to the write/erase control interconnection to apply a high electric field to the gate insulating film between the floating gate and the drain leader line, thereby injecting electrons into the floating gate by an FN current.

The erase may be done by applying a voltage of 0 V to the control gate electrode. In this case, however, a current flows to the drain through the gate insulating film under the control gate electrode, resulting in degradation of the gate insulating film. To prevent this, a voltage close to that of the drain leader line is preferably applied to the control gate electrode. Similarly, the write may be done by applying a voltage of +6 V to the control gate electrode. However, it is more preferable to execute the write by applying a voltage close to that of the drain leader line to the control gate electrode.

By setting the thicknesses and types of the insulating film between the drain leader line and the floating gate and that between the write/erase control interconnection and the floating gate, the write and erase for the floating gate can be done by using only one of the insulating films. For example, if the insulating film between the drain leader line and the floating gate is thicker than that between the write/erase control interconnection and the floating gate, charges readily pass through the insulating film between the write/erase control interconnection and the floating gate. Hence, the write is readily mainly executed through the insulating film between the write/erase control interconnection and the floating gate. Applying a film with a low electron barrier to one of the insulating films makes it possible to supply/remove electrons to/from the floating gate mainly by using the film with the low electron barrier.

The read is done by grounding the drain leader line and write/erase control interconnection and applying a voltage of +2 V to the control gate electrode and a voltage of +1 V to the source. When the cell is in the erase state, no electron barrier is formed in the drain leader line. Hence, the switching element formed in the drain leader line is in the ON state [FIG. 7C]. When the cell is write-accessed, an electron barrier is formed in the drain leader line to suppress the current flowing through the drain leader line [FIG. 7D].

In this embodiment, the floating gate and write/erase control interconnection do not overlap each other. However, the floating gate may partially overlap the write/erase control interconnection. In this case, a metal film may be formed on the upper surface of the write/erase control interconnection. The condition of the metal material is the same as in Example 5 (FIGS. 6A to 6D).

EXAMPLE 7

Figure 8A:
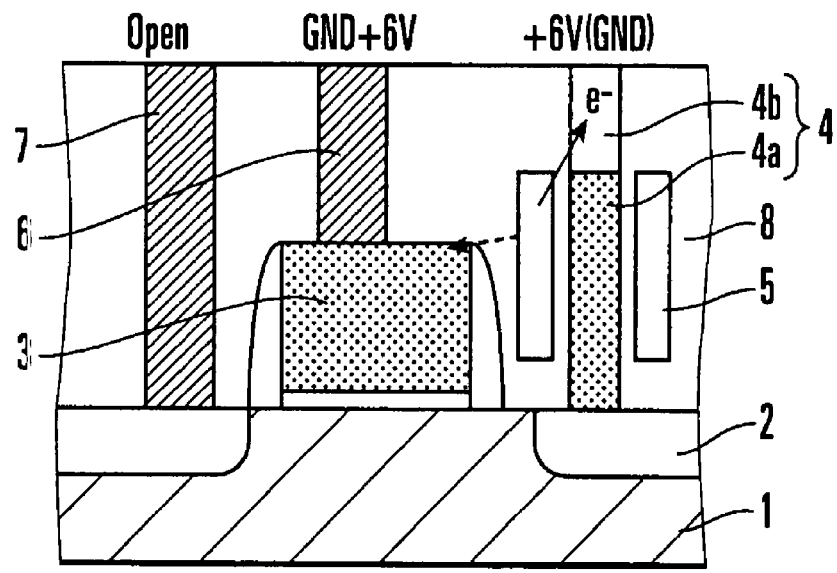
FIGS. 8A to 8D are sectional views showing the main part of Example 7 of the present invention.
Figure 8B:
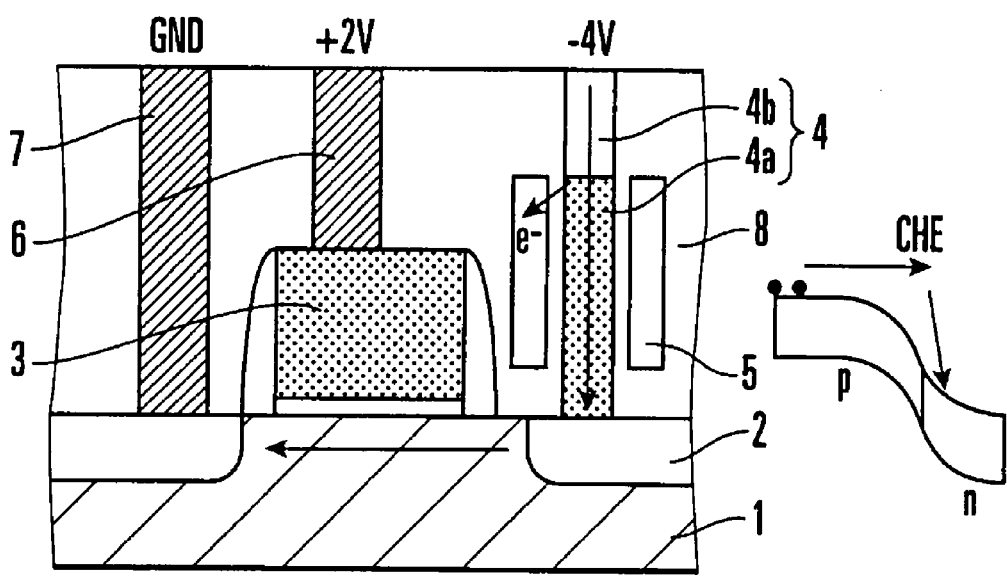
Figure 8C:
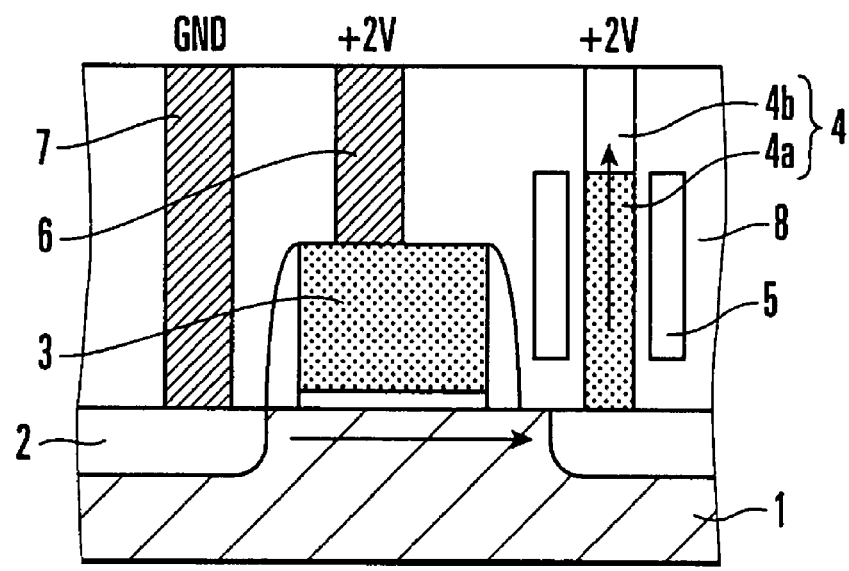
Figure 8D:
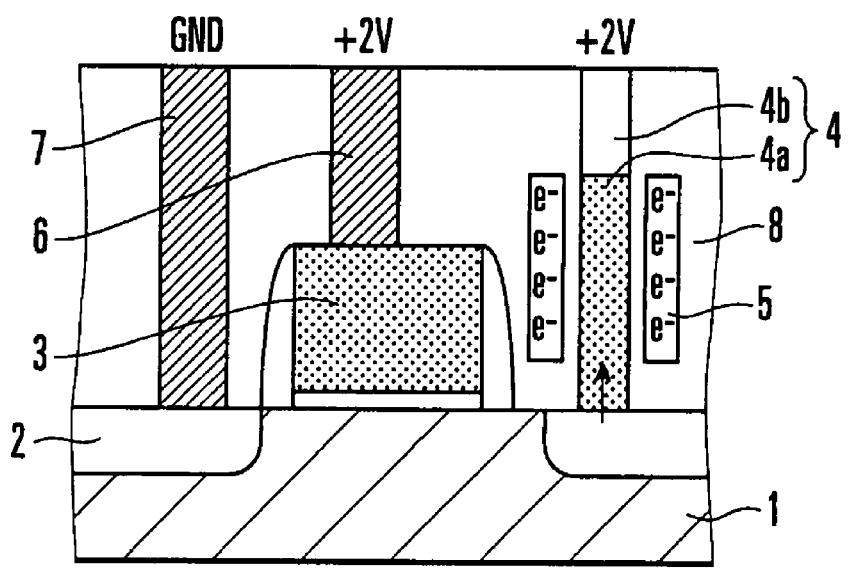

FIGS. 8A to 8D are sectional views showing the main part of Example 7 of the present invention. FIG. 8A shows a state in the erase, FIG. 8B shows a state in the write, and FIGS. 8C and 8D show states in the read. Example 7 is different from Example 1 shown in FIGS. 2A to 2D in that a drain leader line 4 made of polysilicon includes an n-type polysilicon film 4a at and under part facing a floating gate 5 and a p-type polysilicon film 4b above that part. Note that the position of the p-n junction of the drain leader line 4 need not strictly match the top of the floating gate 5.

In the erase, as shown in FIG. 8A, the source is opened, a voltage of +6 V is applied to one of a control gate electrode 3 and the drain leader line 4, and the other is grounded to apply a high electric field to the gate insulating film between the floating gate and the drain leader line or between the floating gate and the control gate electrode, thereby removing electrons in the floating gate to the drain leader line 4 or control gate electrode 3. In the write, as shown in FIG. 8B, a voltage of +2 V is applied to the control gate electrode, the source is grounded, and a voltage of −4 V is applied to the drain leader line to generate CHE in the junction of the drain leader line 4, thereby injecting hot electrons into the floating gate (see the band diagram on the right).

The read is done by applying a voltage of +2 V to the control gate electrode, grounding the source, and applying a voltage of, e.g., +2 V to the drain leader line (reverse read). When the cell is in the erase state, and a voltage of +1.1 V or more is applied to the drain, the conduction band height of p-type polysilicon is equal to or less than that of the n-type polysilicon film 4a. Hence, in the reverse read direction, no electron barrier is formed in the p-n junction. No electron barrier is formed in n-type Si near the floating gate end portion, either. For these reasons, the switching element formed in the drain leader line is in the ON state [FIG. 8C]. When the cell is write-accessed, the band of the n-type polysilicon film 4a rises to form an electron barrier in the drain leader line near the substrate-side end portion of the floating gate. Hence, the switching element formed in the drain leader line is turned off [FIG. 8D].

To do forward read from the cell, a voltage of +2 V is applied to the control gate electrode, a voltage of 1 V is applied to the source, and the drain leader line is grounded to flow a current from the source to drain. At this time, a metal layer which has a small work function and supplies electrons to p-type Si is preferably formed at the upper portion of the drain contact.

EXAMPLE 8

Figure 9A:
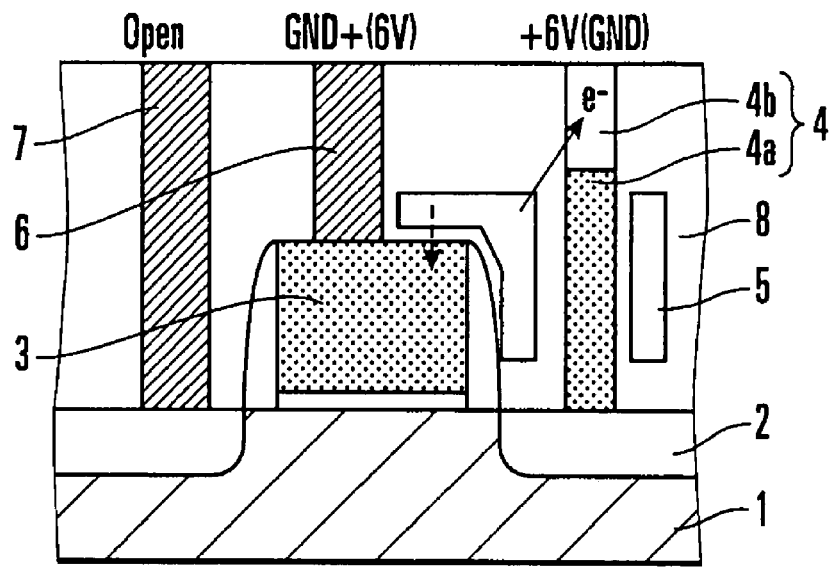
FIGS. 9A to 9D are sectional views showing the main part of Example 8 of the present invention.
Figure 9B:
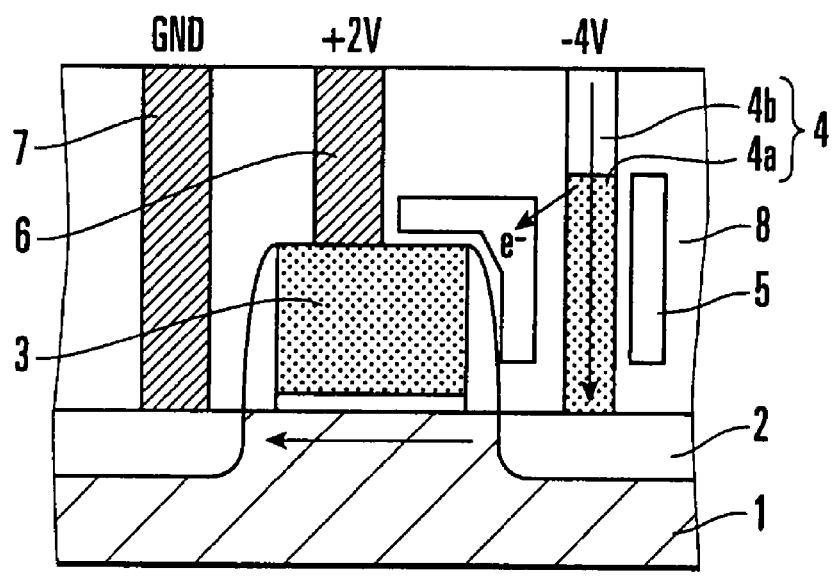
Figure 9C:
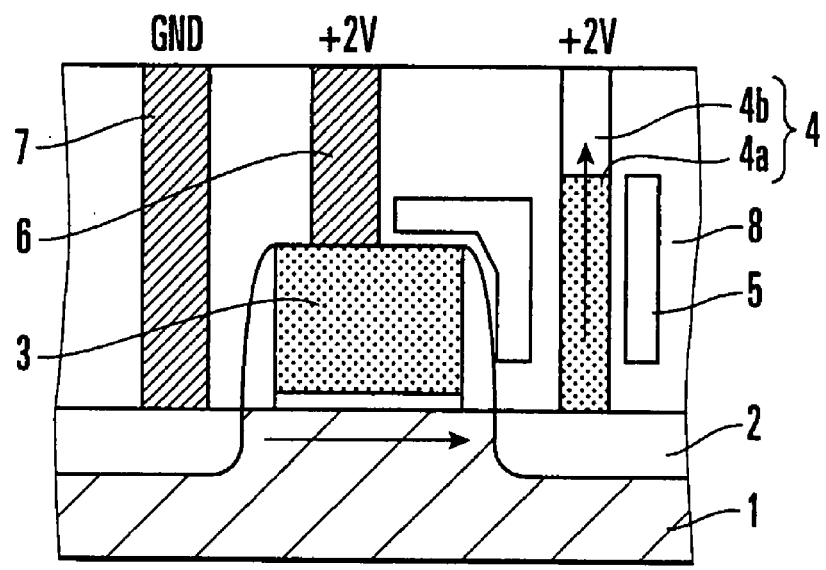
Figure 9D:
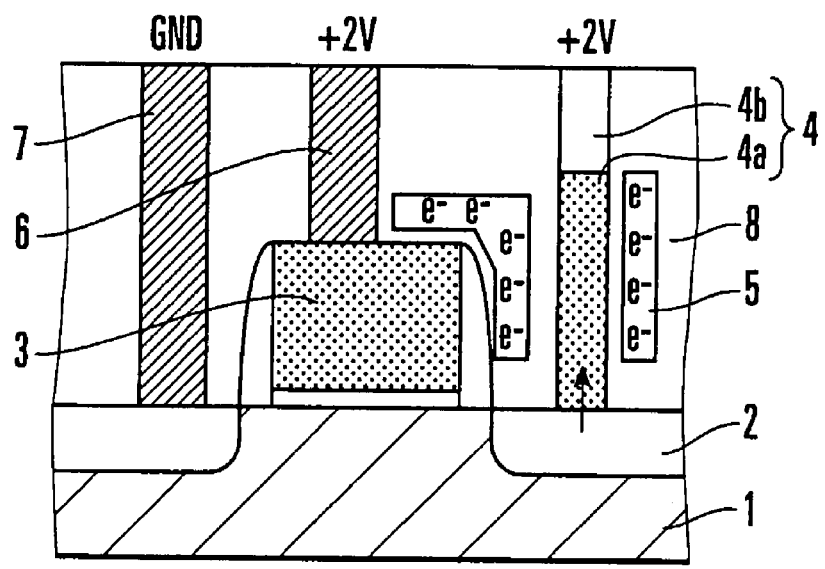

FIGS. 9A to 9D are sectional views showing the main part of Example 8 of the present invention. FIG. 9A shows a state in the erase, FIG. 9B shows a state in the write, and FIGS. 9C and 9D show states in the read. Example 8 is different from Example 7 shown in FIGS. 8A to 8D in that a floating gate 5 has an inverted L-shaped section so as to partially overlap a control gate electrode 3. This example has the advantages of Example 4 (FIGS. 5A to 5D) and Example 7 (FIGS. 8A to 8D).

The erase, write, and read are done in the same way as in Example 7.

EXAMPLE 9

Figure 10A:
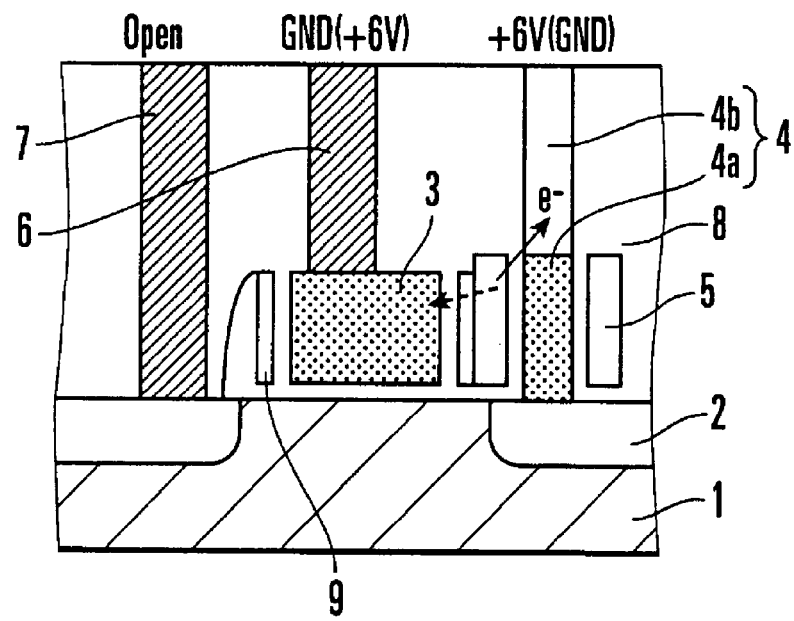
FIGS. 10A to 10D are sectional views showing the main part of Example 9 of the present invention.
Figure 10B:
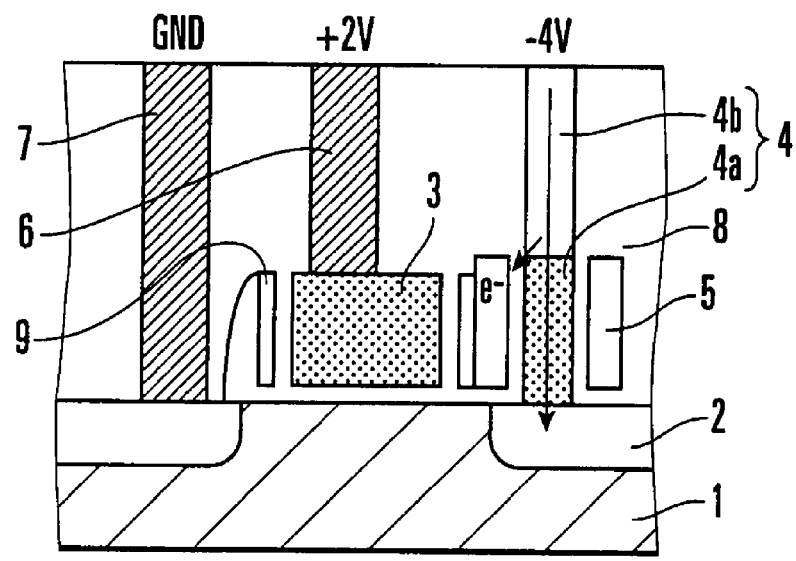
Figure 10C:
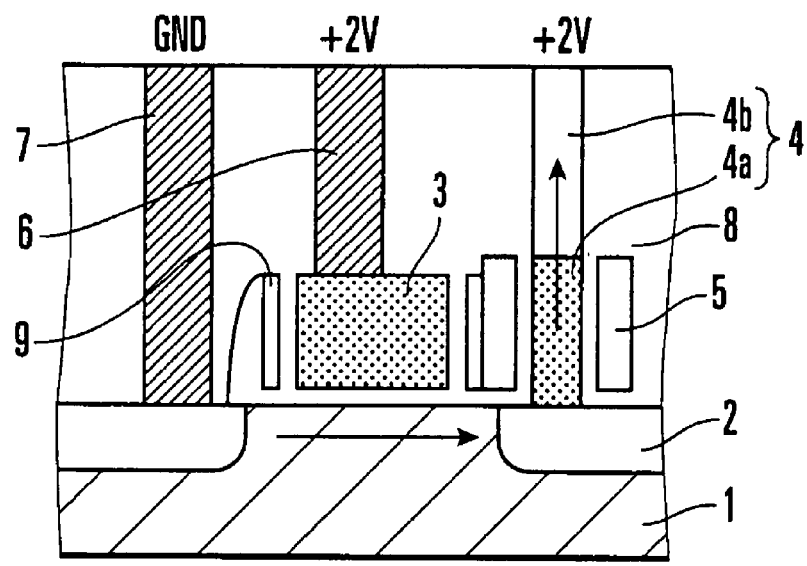
Figure 10D:
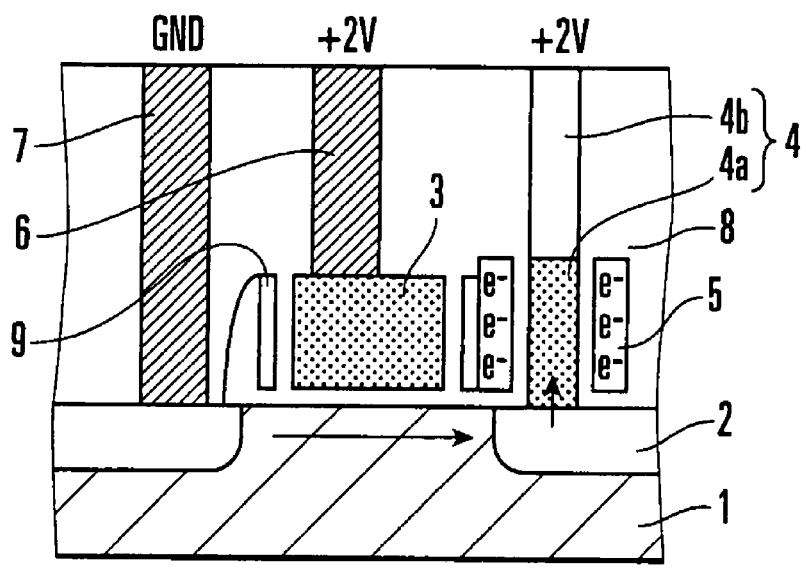

FIGS. 10A to 10D are sectional views showing the main part of Example 9 of the present invention. FIG. 10A shows a state in the erase, FIG. 10B shows a state in the write, and FIGS. 10C and 10D show states in the read. Example 9 is different from Example 7 shown in FIGS. 8A to 8D in that a silicon film is formed on a sidewall formed on the side surface of a control gate electrode 3, and a sidewall silicon film 9 combines with a floating gate and forms part of it. This example has the advantages of Example 3 (FIGS. 4A to 4D) and Example 7 (FIGS. 8A to 8D).

The erase, write, and read are done in the same way as in Example 7.

EXAMPLE 10

Figure 11A:
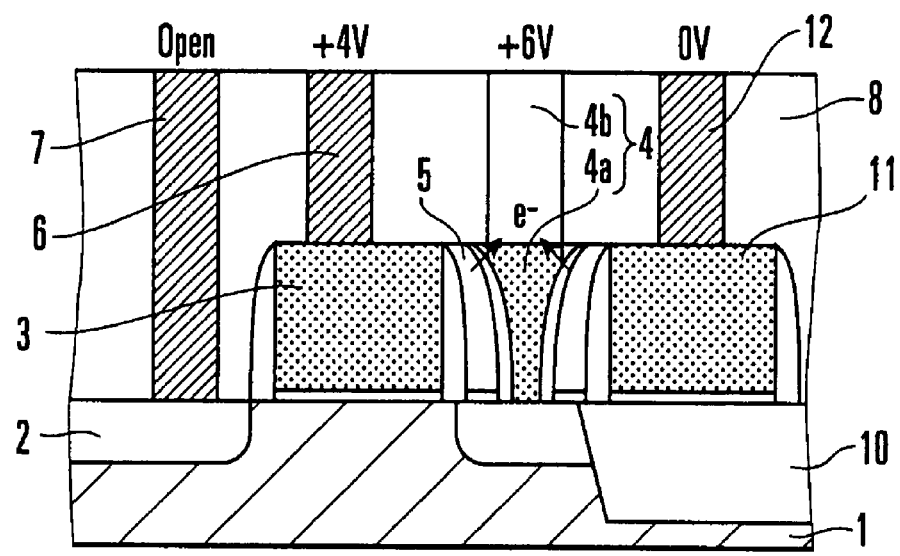
FIGS. 11A to 11D are sectional views showing the main part of Example 10 of the present invention.
Figure 11B:
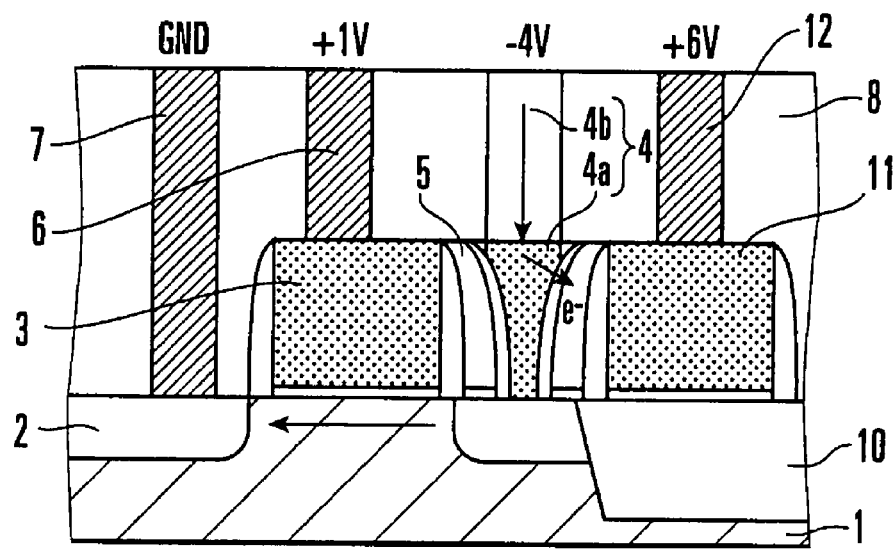
Figure 11C:
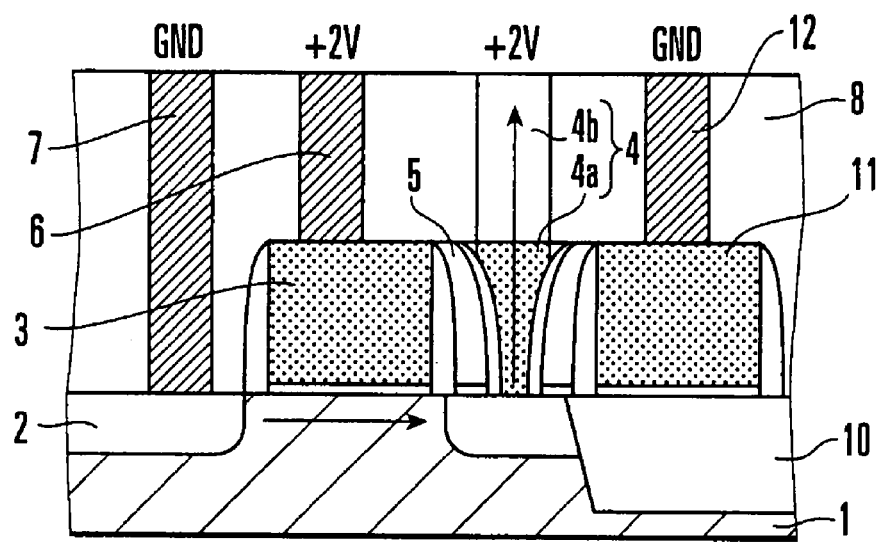
Figure 11D:
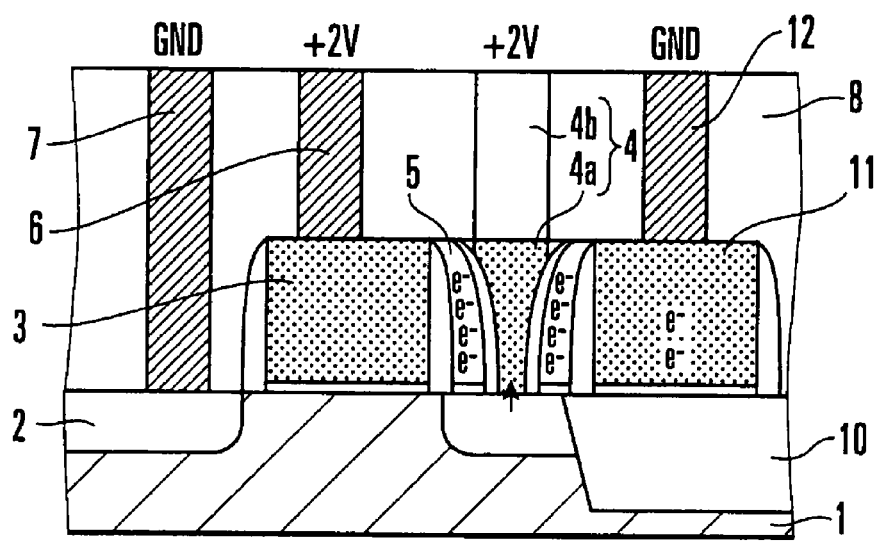

FIGS. 11A to 11D are sectional views showing the main part of Example 10 of the present invention. FIG. 11A shows a state in the erase, FIG. 11B shows a state in the write, and FIGS. 11C and 11D show states in the read. Example 10 is different from Example 7 shown in FIGS. 8A to 8D in that a write/erase control interconnection is provided adjacent to a control gate electrode, and a drain leader line is formed between the control gate electrode and the write/erase control interconnection. More specifically, as shown in FIGS. 11A to 11D, a write/erase control interconnection 11 having the same shape as a control gate electrode 3 is provided on an element isolation region 10. A write/erase control interconnection leader line 12 is led from the write/erase control interconnection 11. A floating gate 5 and a drain leader line 4 are formed between the control gate electrode 3 and the write/erase control interconnection 11. This example has the advantages of Example 6 (FIGS. 7A to 7E) and Example 7 (FIGS. 8A to 8D).

In the erase, as shown in FIG. 11A, the source is opened, and voltages of +4 V, +6 V, and 0 V are applied to the control gate electrode 3, drain leader line 4, and write/erase control interconnection leader line 12, respectively, to apply a high electric field to the gate insulating film between the floating gate and the drain leader line on the side of the write/erase control interconnection, thereby removing electrons in the floating gate to the drain leader line 4. For example, by setting these voltages in all cells, data in all cells can be erased at once. In the write, as shown in FIG. 11B, the source is grounded. A voltage of +1 V is applied to the control gate electrode 3 to turn on the transistor. Voltages of −4 V and +6 V are applied to the drain leader line 4 and write/erase control interconnection leader line 12, respectively, to inject hot electrons generated in the drain leader line 4 into the floating gate near the write/erase control interconnection. Data in individual transistors can selectively be erased by changing, of the device application voltages in the write, only the voltage of the write/erase control interconnection. More specifically, hot holes generated in the drain leader line 4 can be injected into the floating gate near the write/erase control interconnection by applying a negative voltage of, e.g., −6 V to the write/erase control interconnection.

As an advantage of this structure, since the write/erase control interconnection is arranged on the element isolation region, a high voltage can be applied to the write/erase control interconnection without considering degradation of the gate insulating film of the control transistor. Hence, electrons can efficiently be injected in, e.g., the write.

The read is done by applying a voltage of, e.g., +2 V to the drain leader line, grounding the write/erase control interconnection, applying a voltage of +2 V to the control gate electrode, and grounding the source (reverse read).

EXAMPLE 11

Figure 12A:
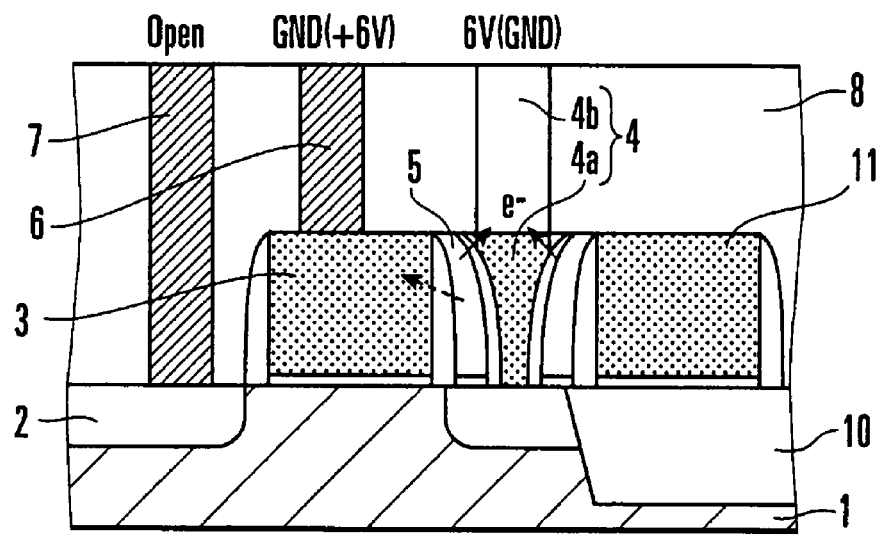
FIGS. 12A to 12D are sectional views showing the main part of Example 11 of the present invention.
Figure 12B:
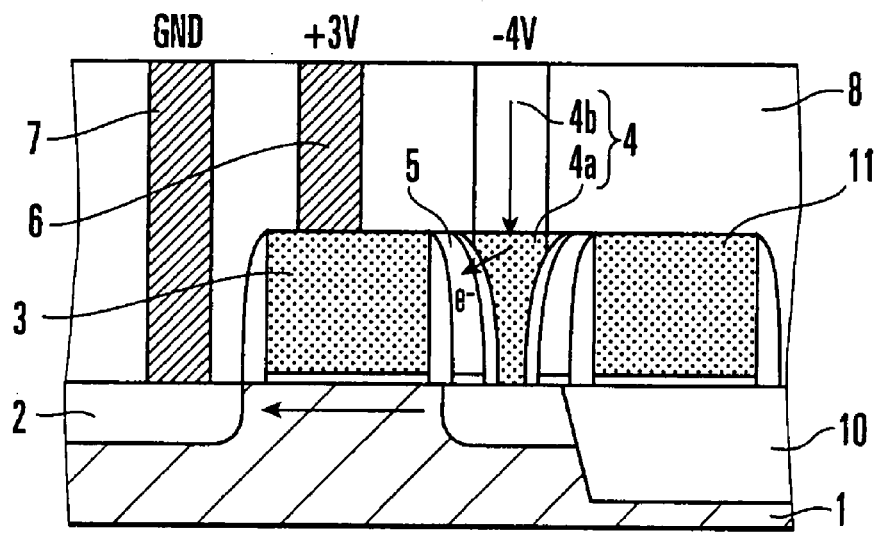
Figure 12C:
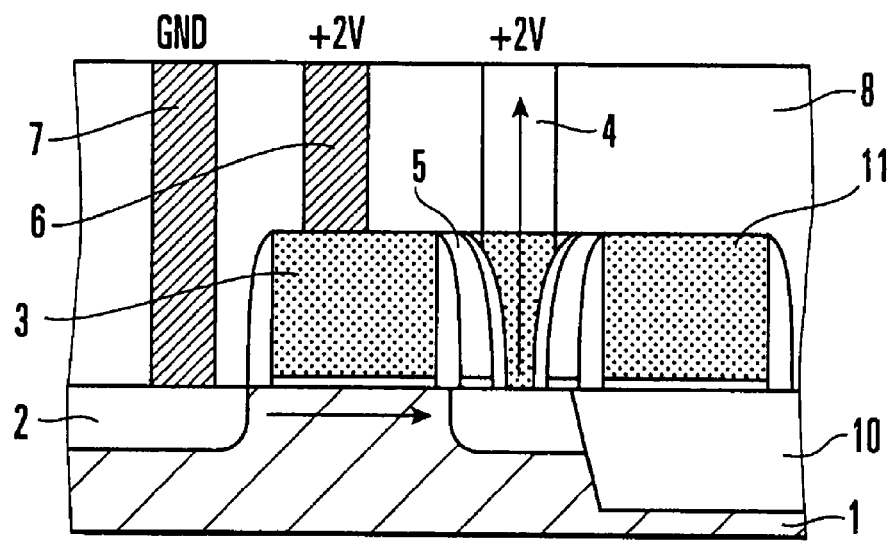
Figure 12D:
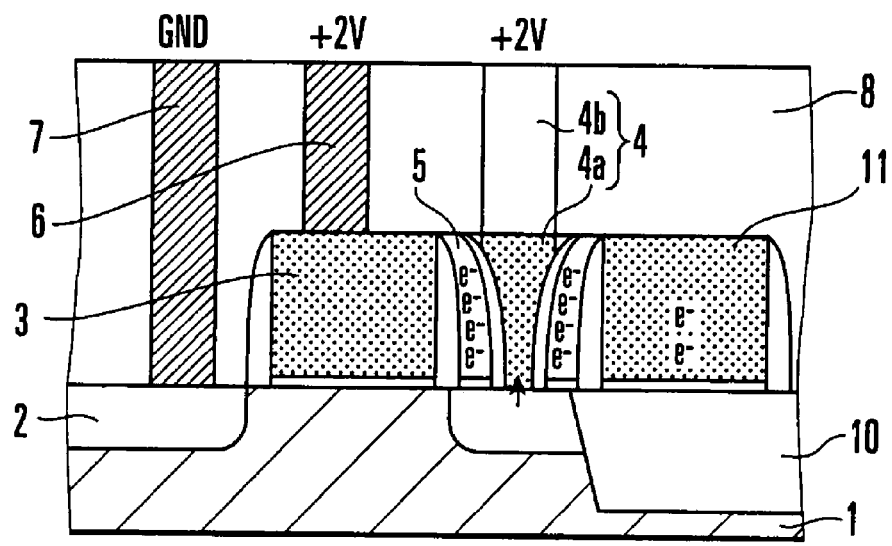

FIGS. 12A to 12D are sectional views showing the main part of Example 11 of the present invention. FIG. 12A shows a state in the erase, FIG. 12B shows a state in the write, and FIGS. 12C and 12D show states in the read. Example 11 is different from Example 10 shown in FIGS. 11A to 11D in that no line is led from a write/erase control interconnection so that the write/erase control interconnection is in a floating state.

In the erase, as shown in FIG. 12A, the source is opened, a voltage of +6 V is applied to one of a control gate electrode 3 and a drain leader line 4, and the other is grounded to remove electrons in the floating gate to the control gate electrode 3 or drain leader line 4. In the write, as shown in FIG. 12B, the source is grounded, and voltages of +3 V and −4 V are applied to the control gate electrode 3 and drain leader line 4, respectively, to inject hot electrons generated in the drain leader line 4 into the floating gate near the control gate electrode.

The read is done by applying a voltage of, e.g., +2 V to the drain leader line, applying a voltage of +2 V to the control gate electrode, and grounding the source (reverse read).

Figure 13A:
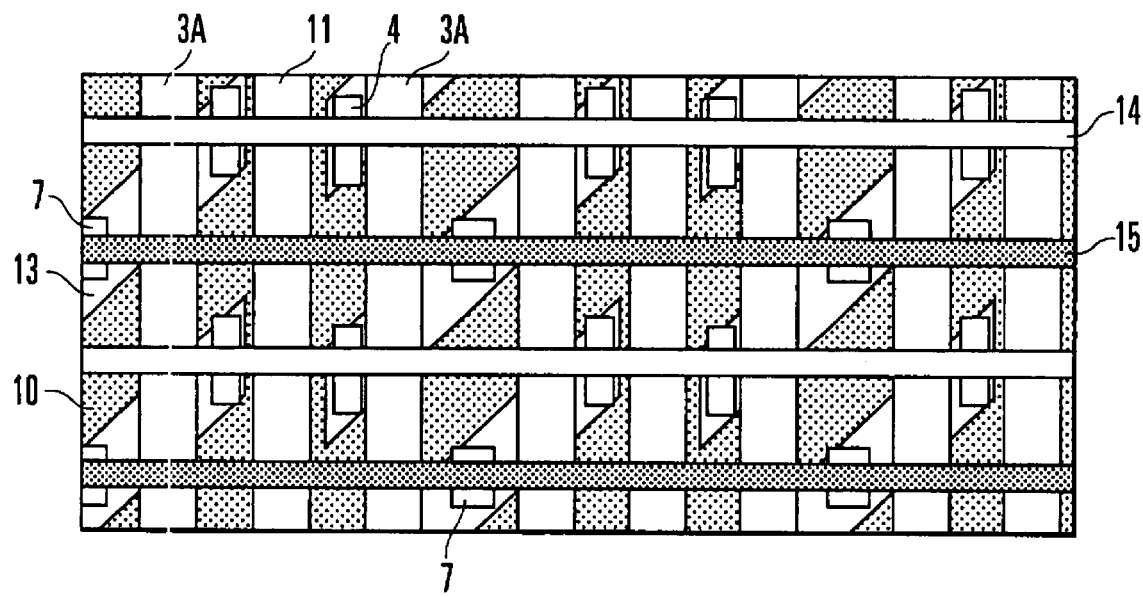
FIG. 13A is a plan view of Example 11 of the present invention.
Figure 13B:
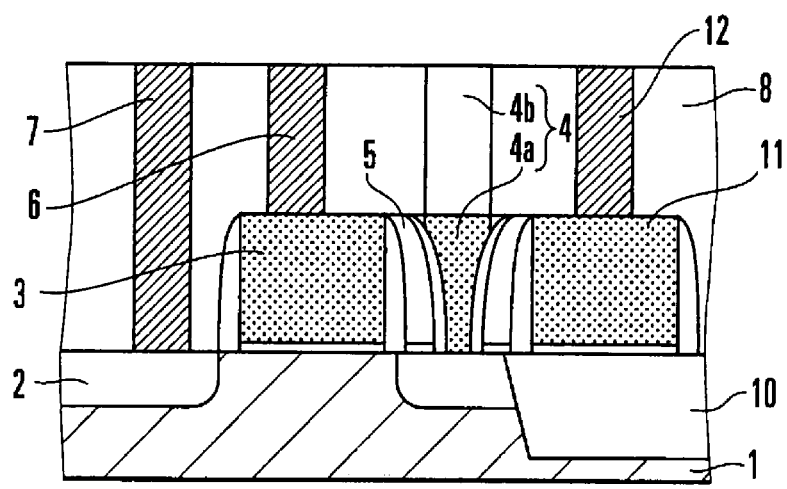
FIG. 13B is a sectional view showing the main part of Example 11 of the present invention.

FIG. 13A is a plan view showing the layout of a cell array of Example 11 of the present invention. FIG. 13B is a sectional view of a cell. As shown in FIG. 13A, active regions 13 defined by element isolation regions 10 tilt with respect to the interconnection layout direction. Write/erase control interconnections 11 vertically run on the substrate. Word lines 3A serving as control gate electrodes are provided on both sides of each write/erase control interconnection 11. Bit lines 14 and source interconnections 15 horizontally running are alternately provided above the write/erase control interconnections 11 and word lines 3A. The bit lines 14 and source interconnections 15 connect to diffusion layers formed in the active regions 13 via the drain leader lines 4 and source leader lines 7, respectively.

EXAMPLE 12

Figure 14A:
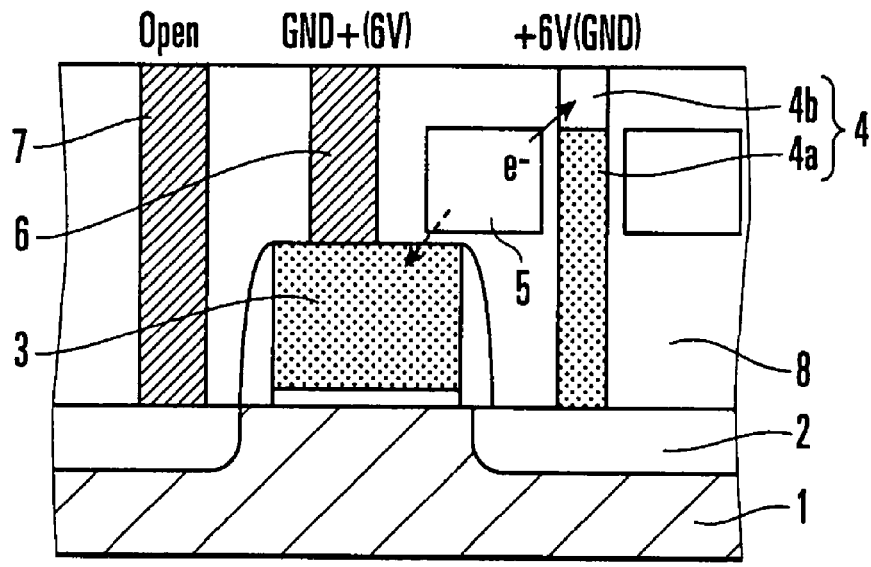
FIGS. 14A to 14D are sectional views showing the main part of Example 12 of the present invention.
Figure 14B:
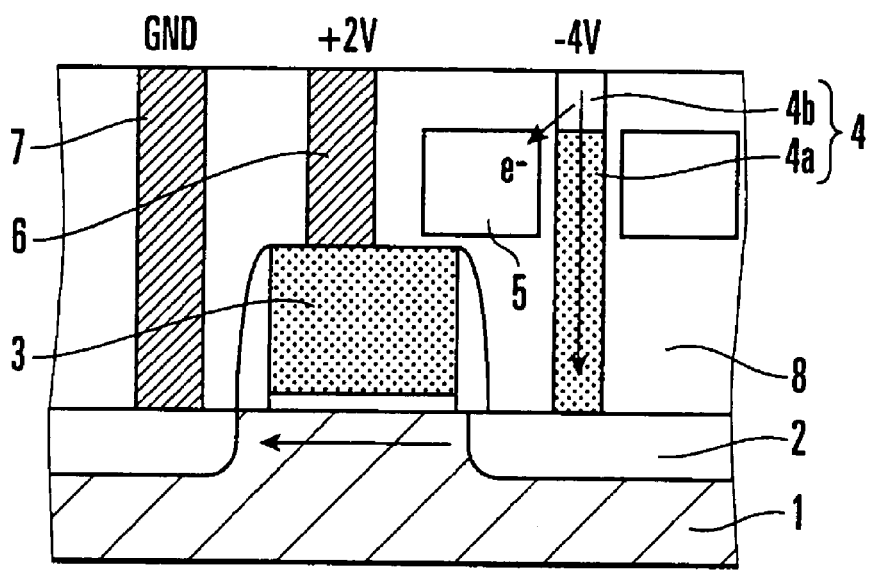
Figure 14C:
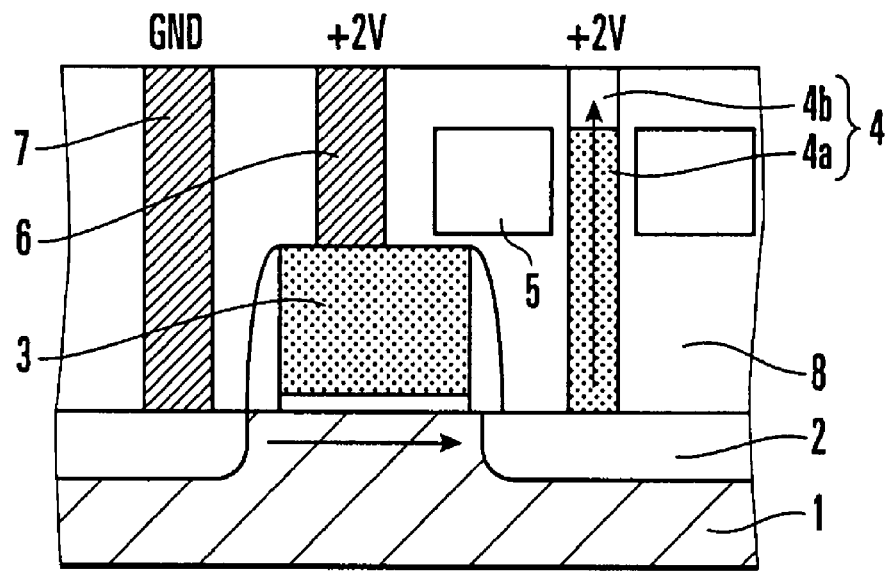
Figure 14D:
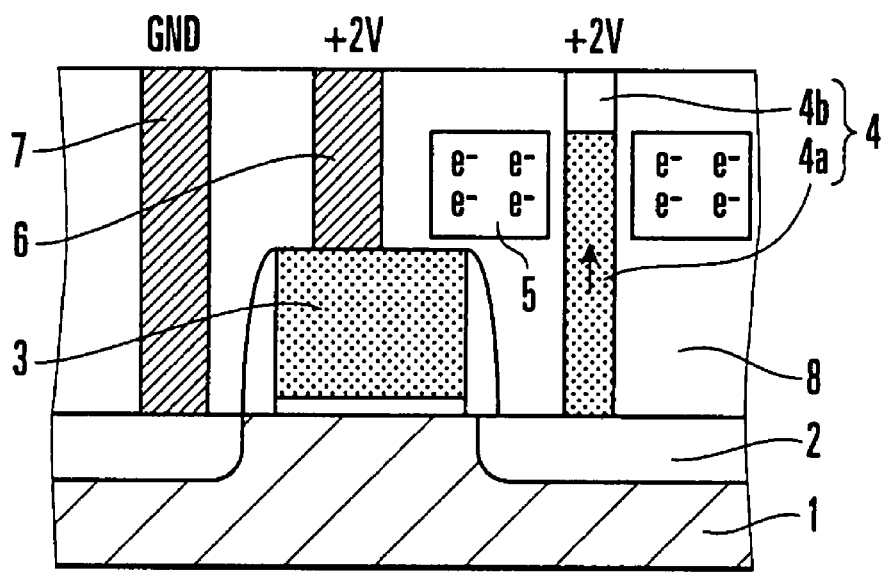

FIGS. 14A to 14D are sectional views showing the main part of Example 12 of the present invention. FIG. 14A shows a state in the erase, FIG. 14B shows a state in the write, and FIGS. 14C and 14D show states in the read. Example 12 is different from Example 7 shown in FIGS. 8A to 8D in that an entire floating gate 5 is formed at a higher level than a control gate electrode 3.

The erase, write, and read are done in the same way as in Example 7.

EXAMPLE 13

Figure 15A:
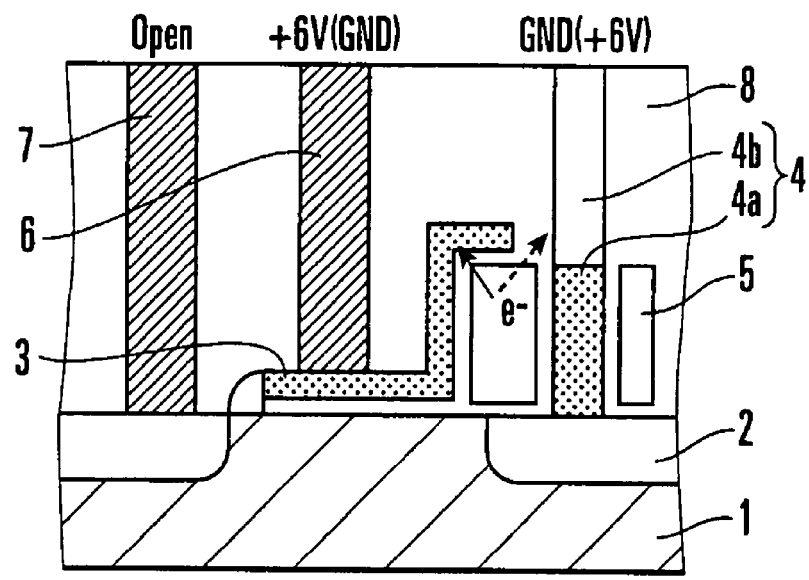
FIGS. 15A to 15D are sectional views showing the main part of Example 13 of the present invention.
Figure 15B:
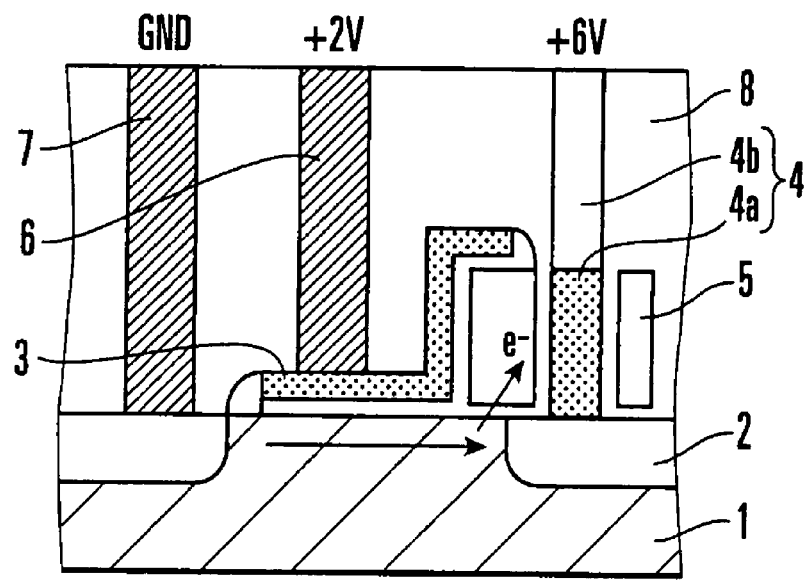
Figure 15C:
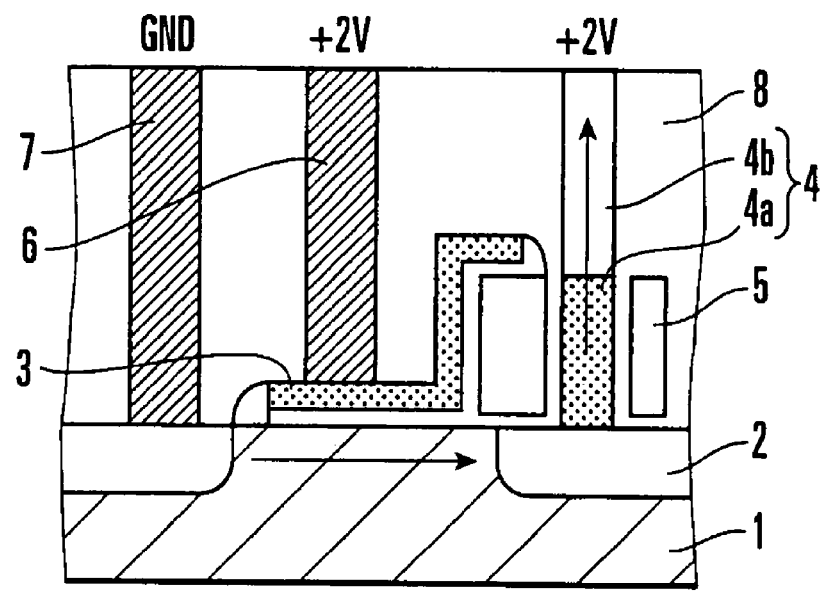
Figure 15D:
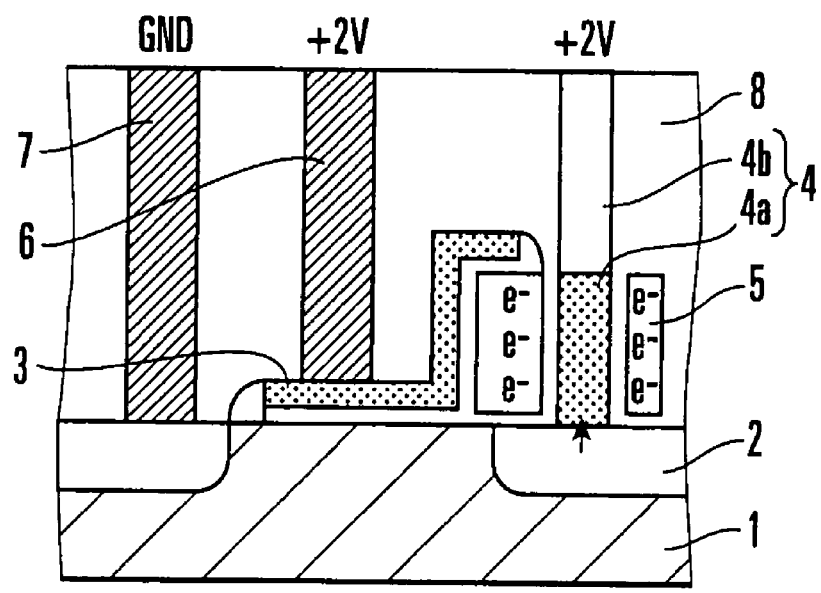

FIGS. 15A to 15D are sectional views showing the main part of Example 13 of the present invention. FIG. 15A shows a state in the erase, FIG. 15B shows a state in the write, and FIGS. 15C and 15D show states in the read. Example 13 is different from Example 7 shown in FIGS. 8A to 8D in that a control gate electrode 3 has a crank-shaped section so as to partially overlap a floating gate 5. Another different point is that the floating gate 5 covers part of the channel region of the transistor controlled by the control gate electrode 3.

In the erase, as shown in FIG. 15A, a voltage of +6 V is applied to one of the control gate electrode 3 and a drain leader line 4, and the other is grounded to apply a high electric field to the insulating film between the floating gate and the drain leader line or between the floating gate and the control gate electrode, thereby removing electrons in the floating gate to the drain leader line 4 or control gate electrode 3. In the write, as shown in FIG. 15B, a voltage of +2 V is applied to the control gate electrode, the source is grounded, and a voltage of +6 V is applied to the drain leader line to generate CHE in the transistor with the control gate electrode, thereby injecting hot electrons into the floating gate. Instead of this method, CHE may be generated in the drain leader line to execute the write. More specifically, the source is grounded, and voltages of +3 V and −3 V are applied to the control gate electrode and drain leader line 4, respectively, to generate CHE in the drain leader line and inject hot electrons into the floating gate.

The read is done in the same way as in Example 7 (FIGS. 8A to 8D). When the cell is write-accessed, the current flowing through the drain leader line is suppressed. Simultaneously, the floating gate 5 also suppresses the current flowing through the channel of the transistor controlled by the control gate electrode 3.

EXAMPLE 14

Figure 16A:
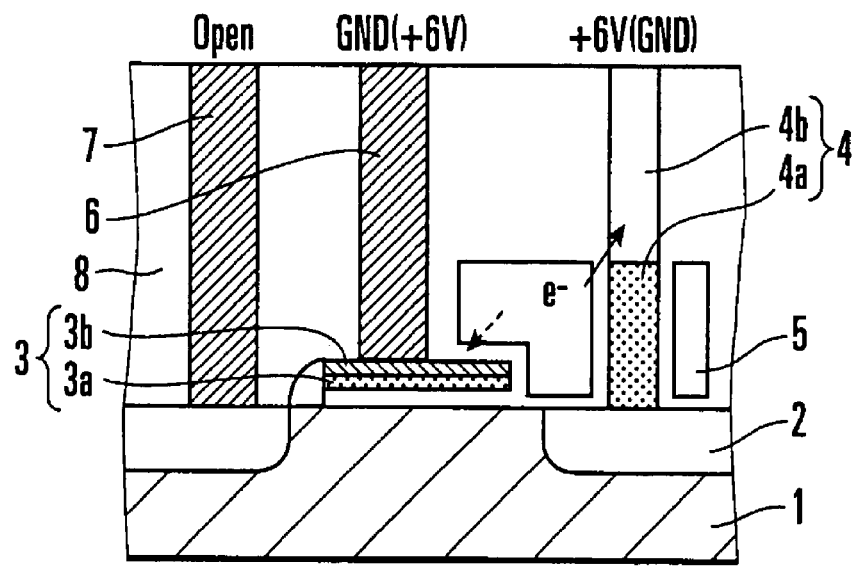
FIGS. 16A to 16D are sectional views showing the main part of Example 14 of the present invention.
Figure 16B:
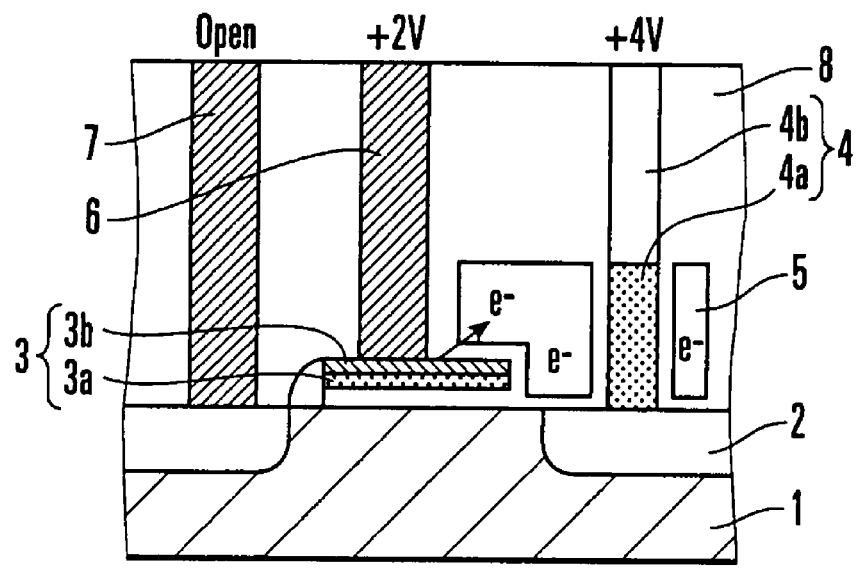
Figure 16C:
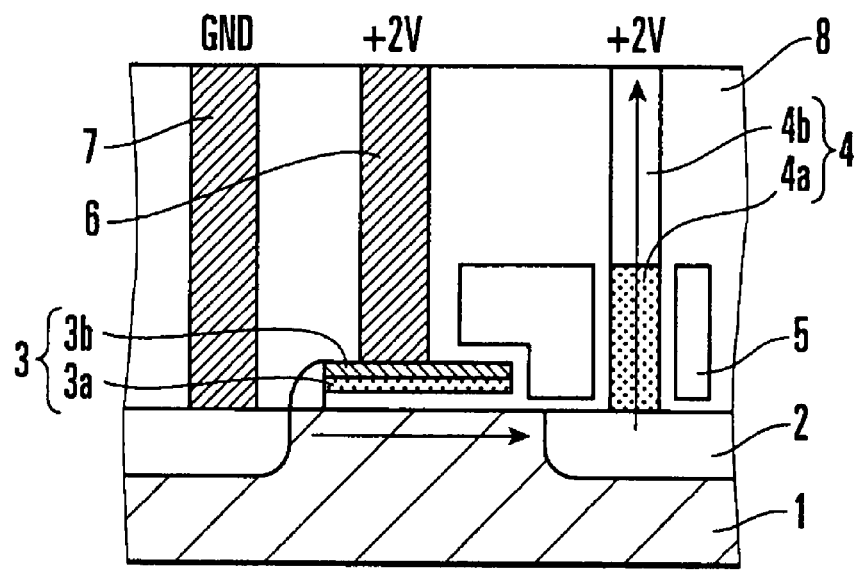
Figure 16D:
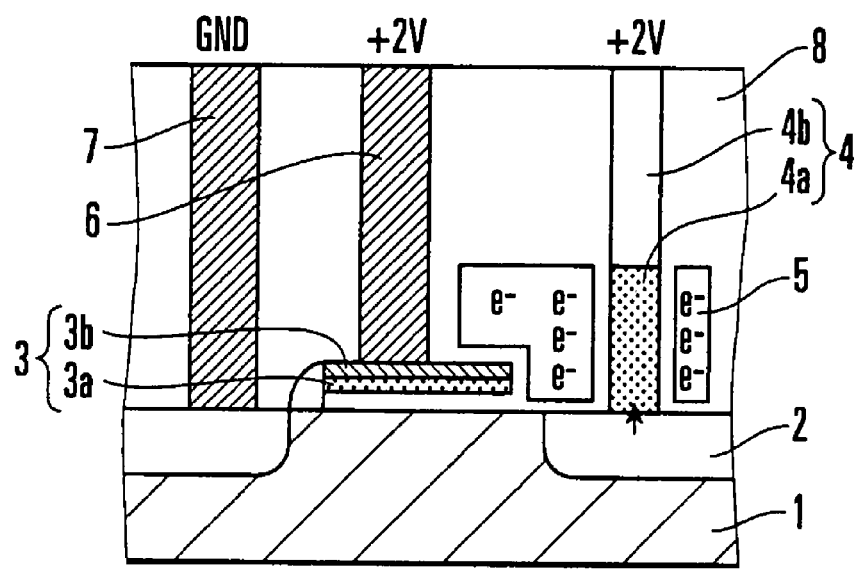

FIGS. 16A to 16D are sectional views showing the main part of Example 14 of the present invention. FIG. 16A shows a state in the erase, FIG. 16B shows a state in the write, and FIGS. 16C and 16D show states in the read. Example 14 is different from Example 8 shown in FIGS. 9A to 9D in that the lower portion of a control gate electrode 3 is made of a polysilicon film 3a, and the upper portion, i.e., the portion facing a floating gate 5 is made of a metal film 3b. The metal film 3b is made of a metal with a small work function. Formation of the metal film allows to decrease the voltage in the write. However, the operation itself can be implemented by applying a high voltage without forming a metal film.

This example has the advantages of Example 5 (FIGS. 6A to 6D) and Example 7 (FIGS. 8A to 8D). The erase method, write method, and read method can be the same as in Example 5. In the write, hot electrons may be generated in the control transistor and injected into the floating gate. This is also the same as in Example 5. In the write, hot electrons may be generated in the p-n junction of the drain leader line and injected into the floating gate. In any structure having a drain leader line with a p-n junction, the erase may be done by generating hot hole in the p-n junction and injecting them into the floating gate, as a matter of course. The read may be forward read.

EXAMPLE 15

Figure 17A:
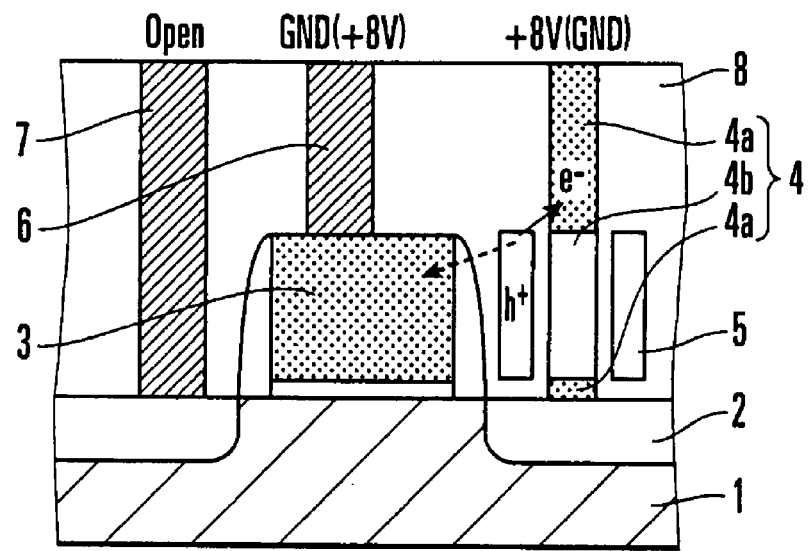
FIGS. 17A to 17D are sectional views showing the main part of Example 15 of the present invention.
Figure 17B:
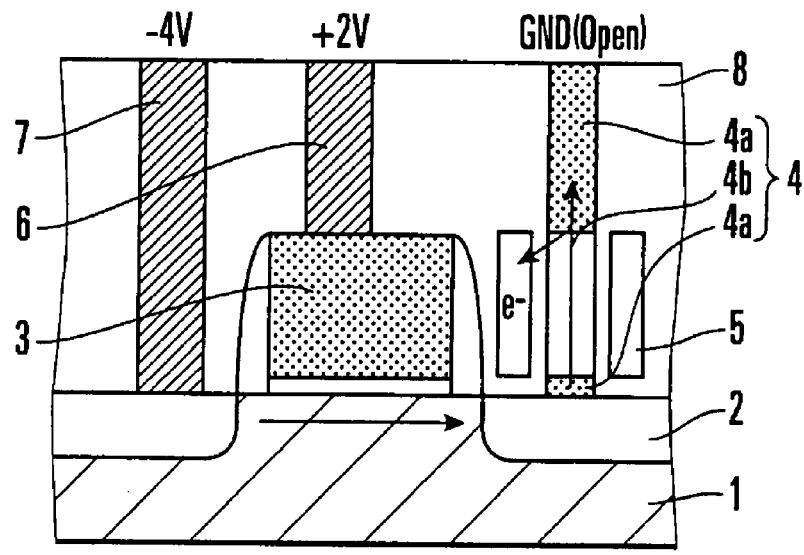
Figure 17C:
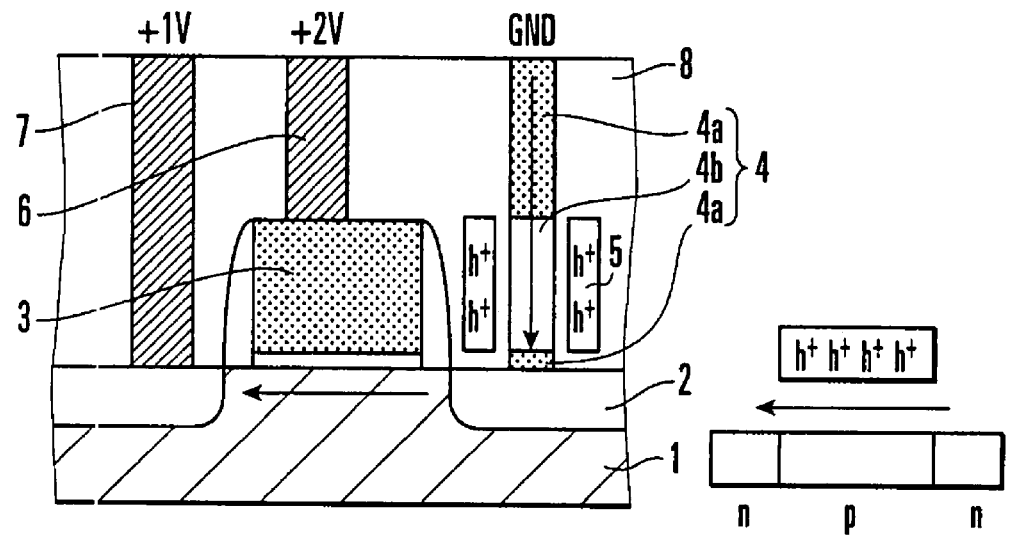
Figure 17D:
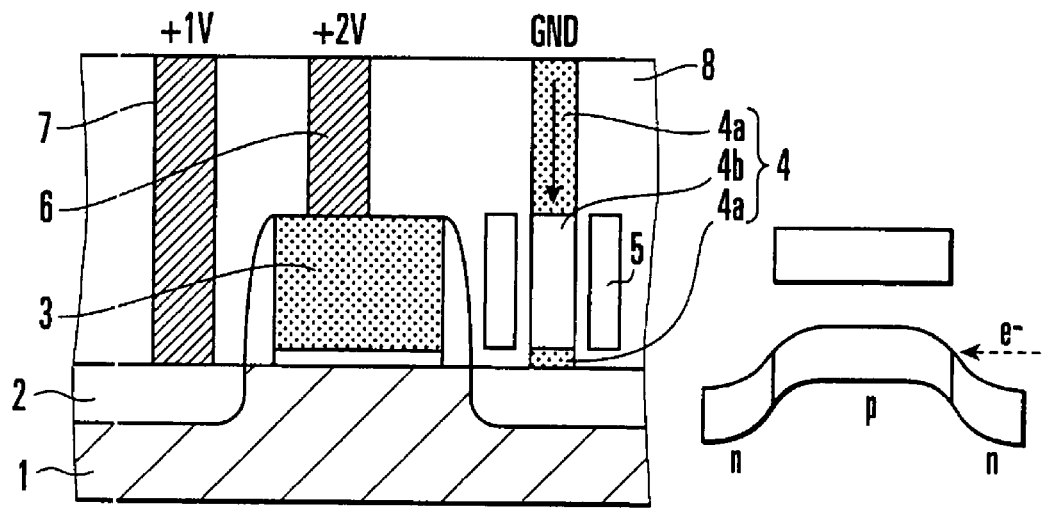

FIGS. 17A to 17D are sectional views showing the main part of Example 15 of the present invention. FIG. 17A shows a state in the erase, FIG. 17B shows a state in the write, and FIGS. 17C and 17D show states in the read. Example 15 is different from Example 1 shown in FIGS. 2A to 2D in that a drain leader line 4 includes a p-type polysilicon film 4b in a region surrounded by a floating gate 5 and an n-type polysilicon film 4a in the remaining region.

In this example, the erase is done by creating an over-erase state. More specifically, in the erase, as shown in FIG. 17A, the source is opened (or grounded), a voltage of +8 V is applied to one of a control gate electrode 3 and the drain leader line 4, and the other is grounded to apply a high electric field to the insulating film between the floating gate and the drain leader line or between the floating gate and the control gate electrode, thereby removing electrons in the floating gate to the drain leader line 4 or control gate electrode 3 and accumulating holes in the floating gate. In this example, to easily create the over-erase state, the floating gate is made of n-type polysilicon. In the write, as shown in FIG. 17B, a voltage of +2 V is applied to the control gate electrode to turn on the transistor, the drain leader line is grounded, and a voltage of −4 V is applied to the source to generate CHE in the drain leader line 4, thereby injecting hot electrons into the floating gate. When the holes accumulated in the floating gate disappear, the current flowing to the transistor also disappears, and the write is completed. The write may be done by opening the drain leader line. Alternatively, the write may be done by inverting the voltages to be applied to the source leader line and drain leader line. After the erase is executed by grounding the source and applying voltages of +2 V and +8 V to the gate and drain, respectively, the erase operation may be stopped by detecting a current that flows upon completion of the erase.

The read is done by applying a voltage of +2 V to the control gate electrode and a voltage of +1 V to the source and grounding the drain leader line. When the cell is in the erase state, holes are accumulated in the floating gate. For this reason, the band of the p-type polysilicon film 4b of the drain leader line 4 surrounded by the floating gate drops. Since no electron barrier is formed in the drain leader line, the switching element formed in it is turned on [FIG. 17C]. When the cell is write-accessed, no charges are accumulated in the floating gate. An electron barrier is formed in the drain leader line by the p-type polysilicon film 4b to suppress the current flowing through the drain leader line [FIG. 17D]. The band states of the drain leader line in the ON and OFF states are illustrated on the right side of FIGS. 17C and 17D.

EXAMPLE 16

Figure 18A:
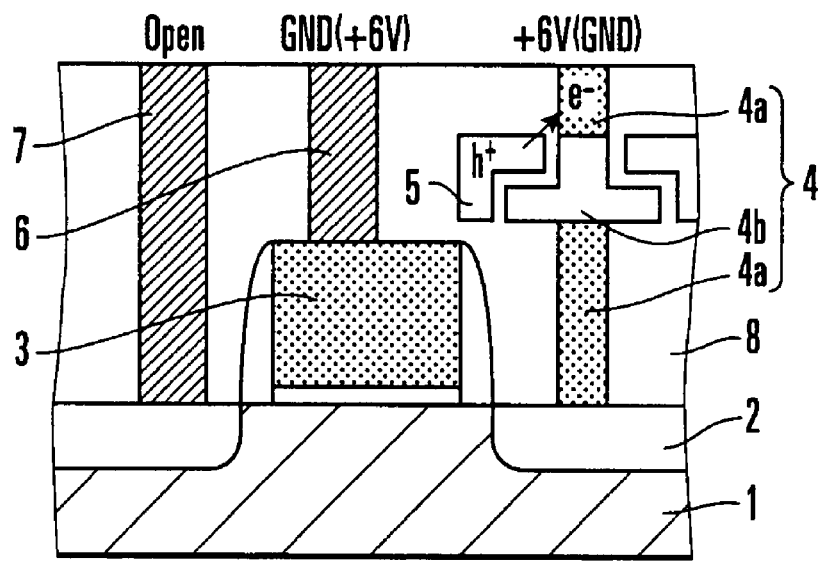
FIGS. 18A to 18D are sectional views showing the main part of Example 16 of the present invention.
Figure 18B:
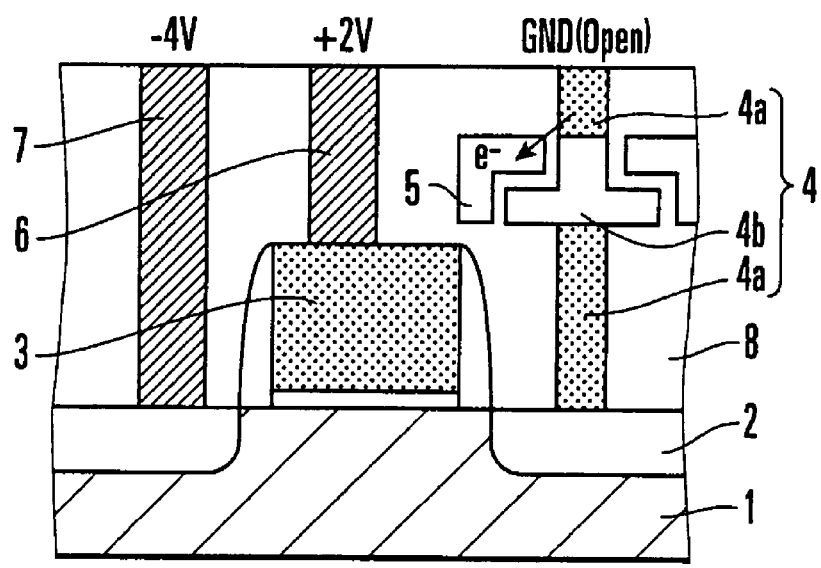
Figure 18C:
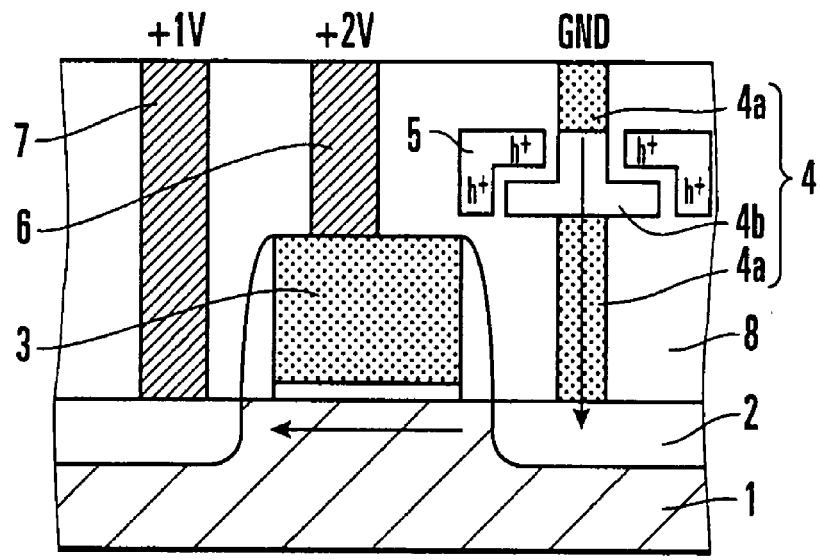
Figure 18D:
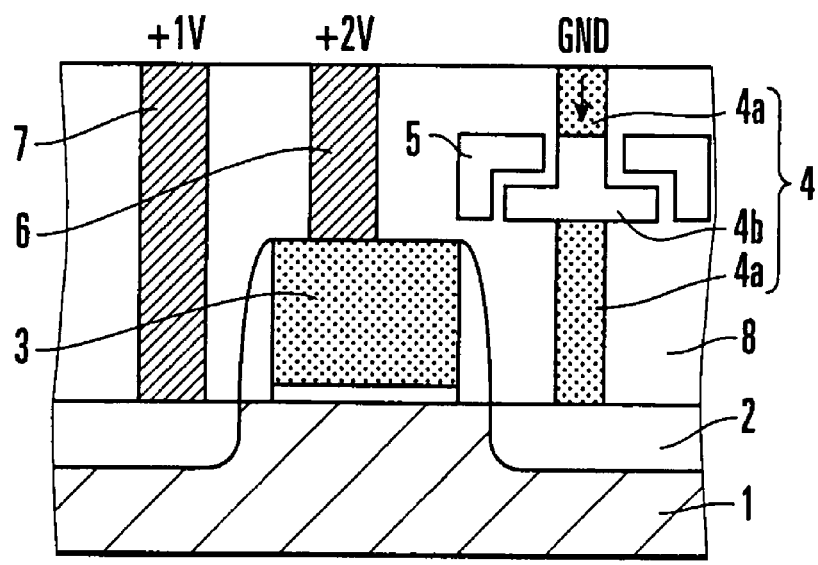

FIGS. 18A to 18D are sectional views showing the main part of Example 16 of the present invention. FIG. 18A shows a state in the erase, FIG. 18B shows a state in the write, and FIGS. 18C and 18D show states in the read. Example 16 is different from Example 15 shown in FIGS. 17A to 17D in that a floating gate 5 and a p-type polysilicon film 4b of a drain leader line are formed above a control gate electrode 3. Another different point is that the p-type polysilicon film 4b has an inverted T-shaped section, and accordingly, the floating gate has an inverted L-shaped section.

In the erase, as shown in FIG. 18A, the source is opened (or grounded), the control gate electrode 3 is grounded, and a voltage of +8 V is applied to a drain leader line 4 to apply a high electric field to the insulating film between the floating gate and the drain leader line, thereby removing electrons in the floating gate to the drain leader line 4 and accumulating holes in the floating gate. The write method and read method of this example are the same as in Example 15 (FIGS. 17A to 17D).

EXAMPLE 17

Figure 19A:
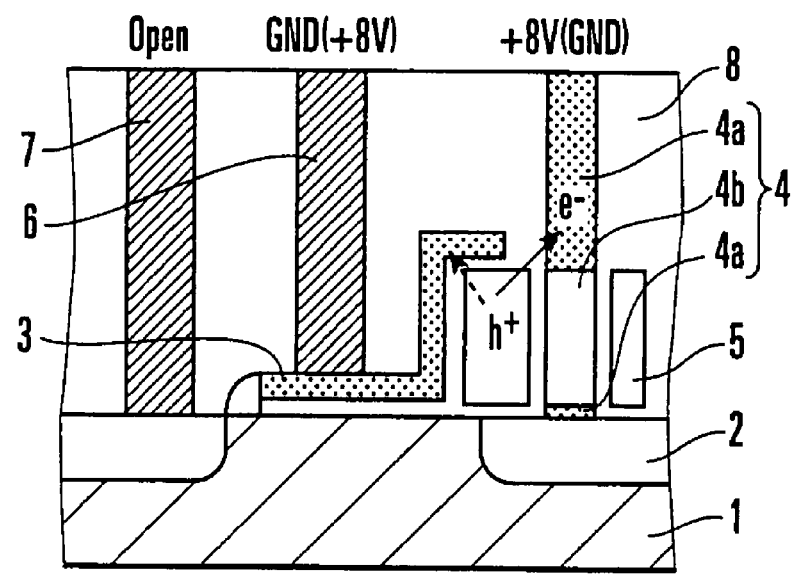
FIGS. 19A to 19D are sectional views showing the main part of Example 17 of the present invention.
Figure 19B:
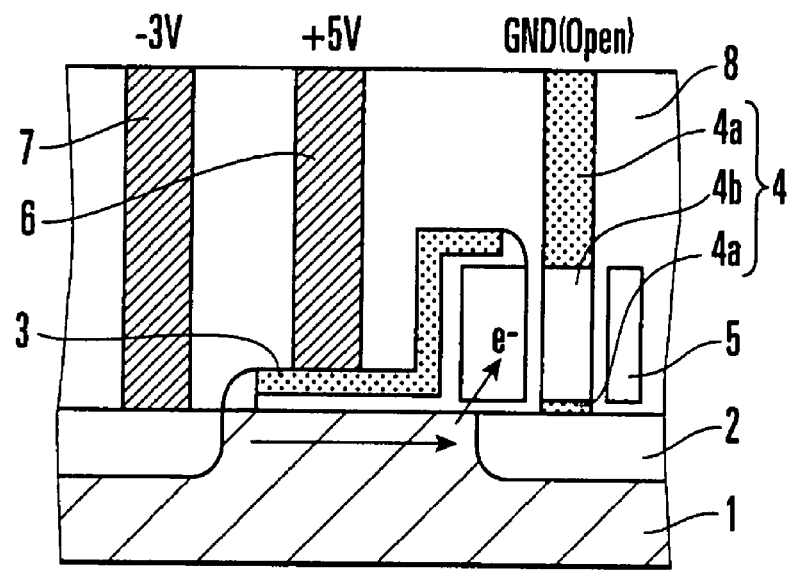
Figure 19C:
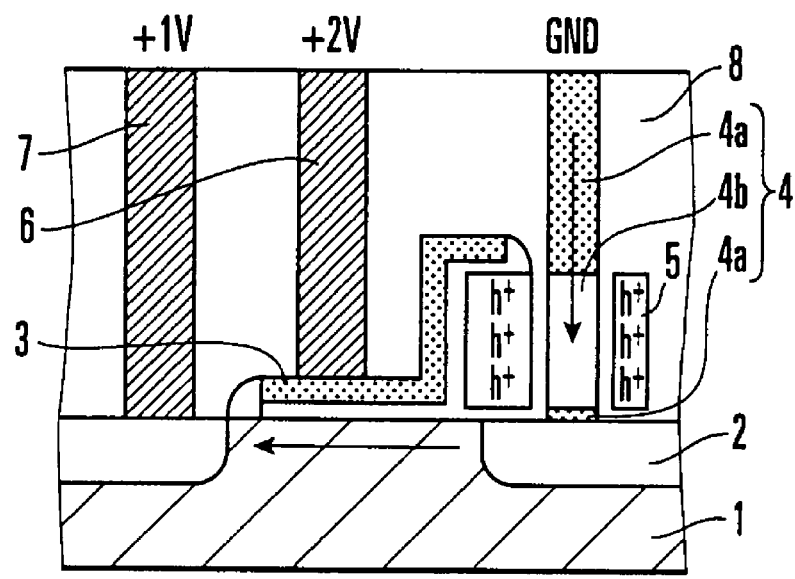
Figure 19D:
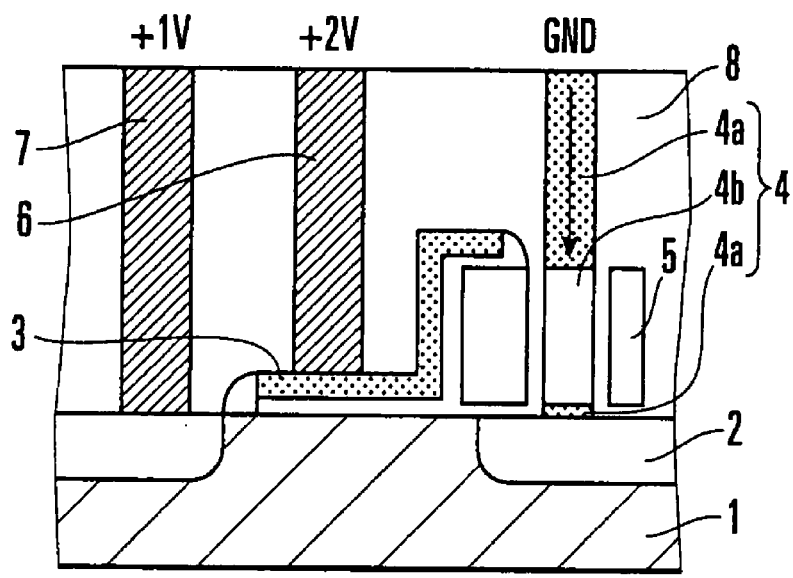

FIGS. 19A to 19D are sectional views showing the main part of Example 17 of the present invention. FIG. 19A shows a state in the erase, FIG. 19B shows a state in the write, and FIGS. 19C and 19D show states in the read. Example 17 is different from Example 15 shown in FIGS. 17A to 17D in that a control gate electrode 3 has a crank-shaped section so as to partially overlap a floating gate 5. Another different point is that the floating gate 5 covers part of the channel region of the transistor controlled by the control gate electrode 3.

The erase method and read method of this example are the same as in Example 15 (FIGS. 17A to 17D). In this example, the write is done by injecting hot electrons. More specifically, as shown in FIG. 19B, a voltage of −4 V is applied to the source, a voltage of +5 V is applied to the control gate electrode, and the drain leader line is grounded (or opened) to generate CHE in the channel, thereby executing the write. As the programming progresses, the current decreases. When the current flow stops, the write is completed.

EXAMPLE 18

Figure 20A:
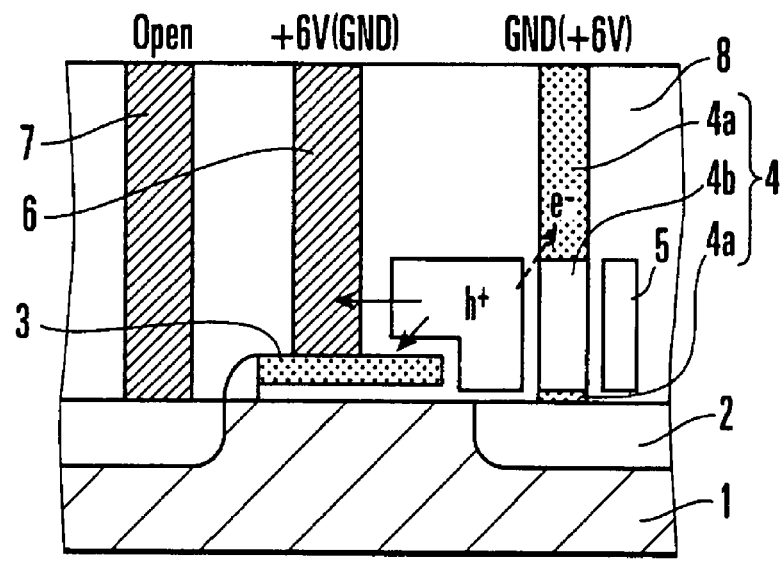
FIGS. 20A to 20D are sectional views showing the main part of Example 18 of the present invention.
Figure 20B:
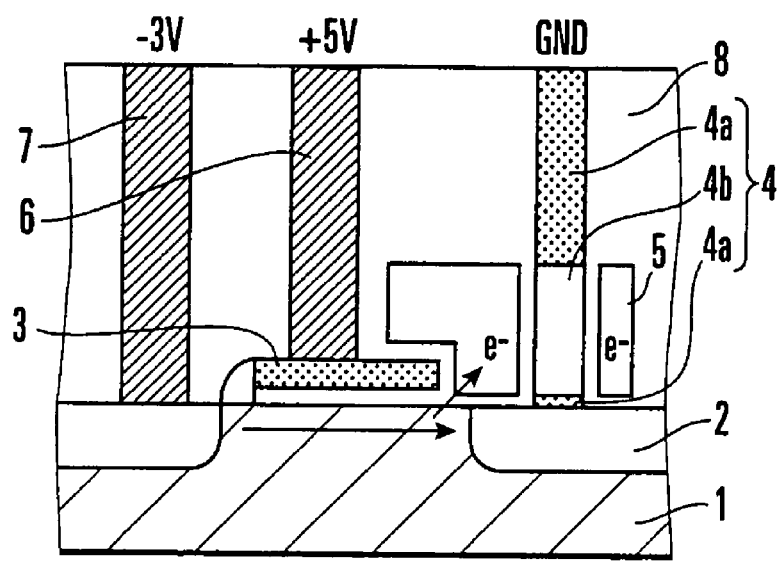
Figure 20C:
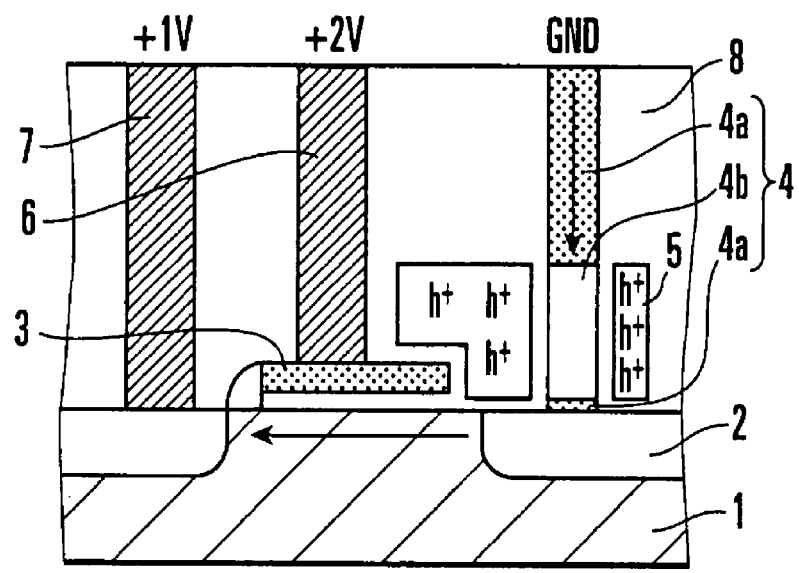
Figure 20D:
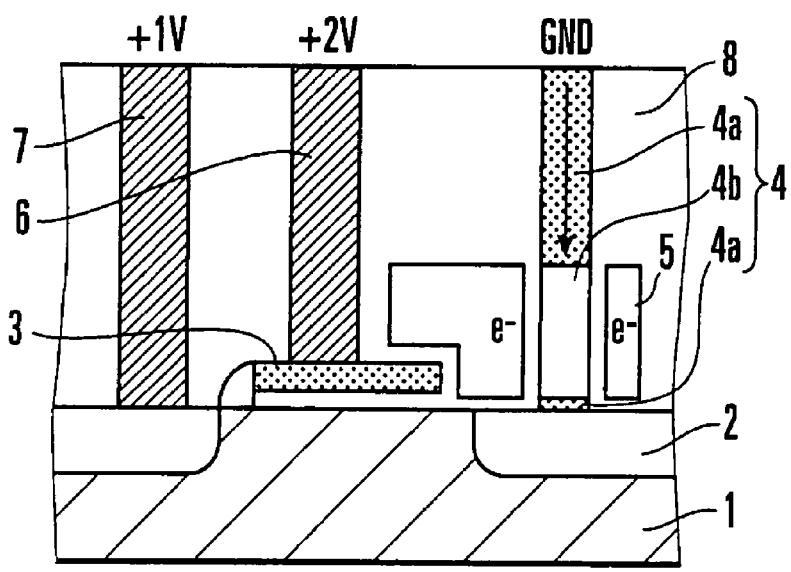

FIGS. 20A to 20D are sectional views showing the main part of Example 18 of the present invention. FIG. 20A shows a state in the erase, FIG. 20B shows a state in the write, and FIGS. 20C and 20D show states in the read. Example 18 is different from Example 15 shown in FIGS. 17A to 17D in that a floating gate 5 partially overlaps a control gate electrode 3 and has an inverted L-shaped section at that portion.

The erase method, write method, and read method of this example are the same as in Example 17.

EXAMPLE 19

Figure 21A:
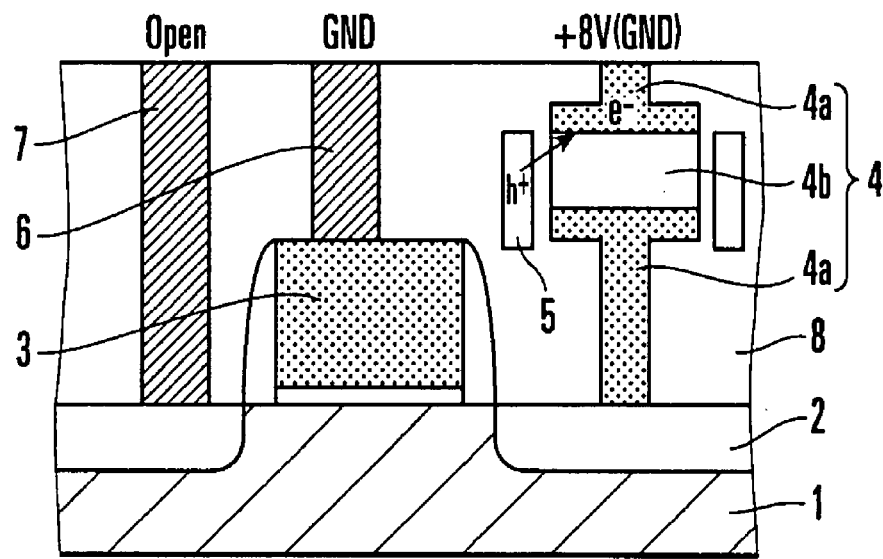
FIGS. 21A to 21D are sectional views showing the main part of Example 19 of the present invention.
Figure 21B:
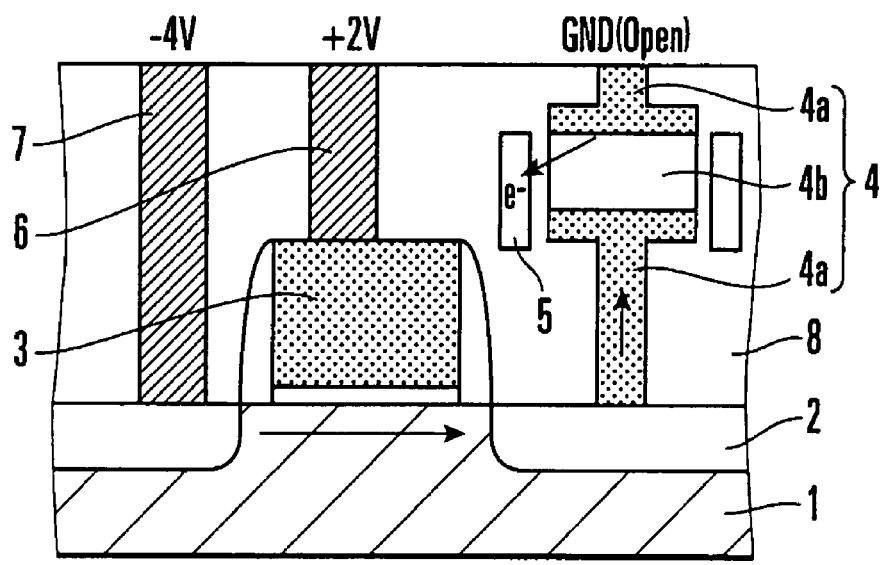
Figure 21C:
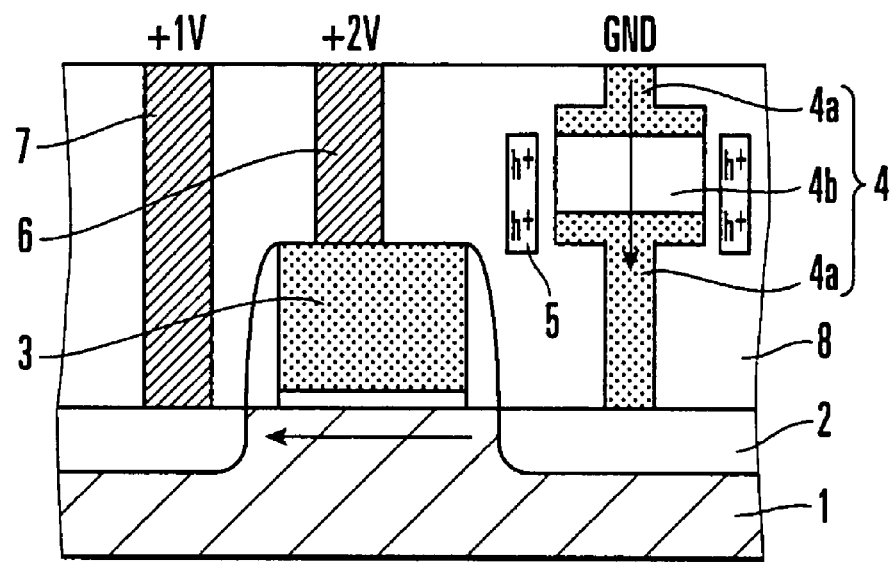
Figure 21D:
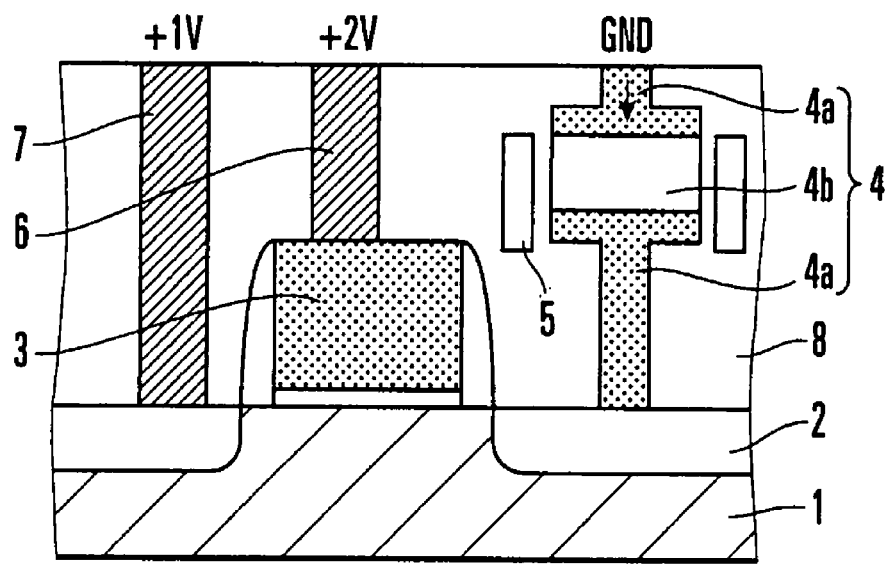

FIGS. 21A to 21D are sectional views showing the main part of Example 19 of the present invention. FIG. 21A shows a state in the erase, FIG. 21B shows a state in the write, and FIGS. 21C and 21D show states in the read. Example 19 is different from Example 15 shown in FIGS. 17A to 17D in that a p-type polysilicon film 4b of a drain leader line is formed at a higher level than a control gate electrode 3 and has a larger sectional area than that of an n-type polysilicon film 4a except the connection portion between the n-type polysilicon film 4a and the p-type polysilicon film 4b.

The erase method, write method, and read method of this example are the same as in Example 16 (FIGS. 18A to 18D).

EXAMPLE 20

Figure 22A:
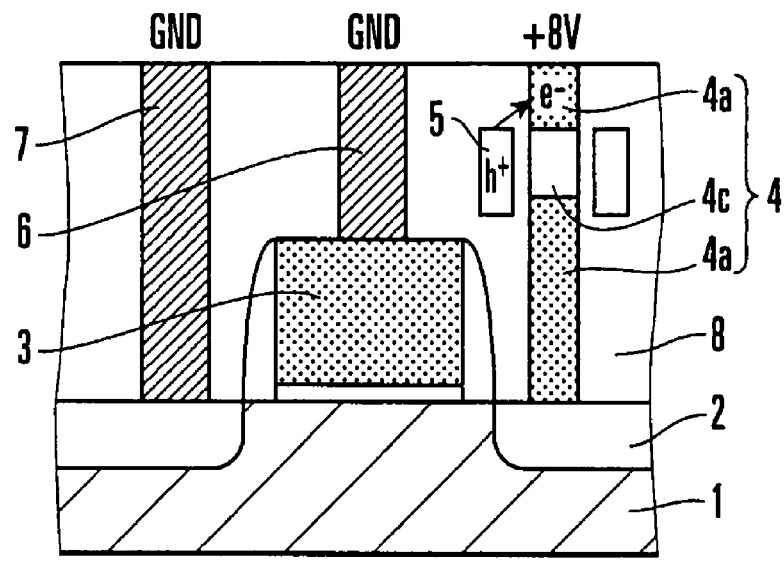
FIGS. 22A to 22D are sectional views showing the main part of Example 20 of the present invention.
Figure 22B:
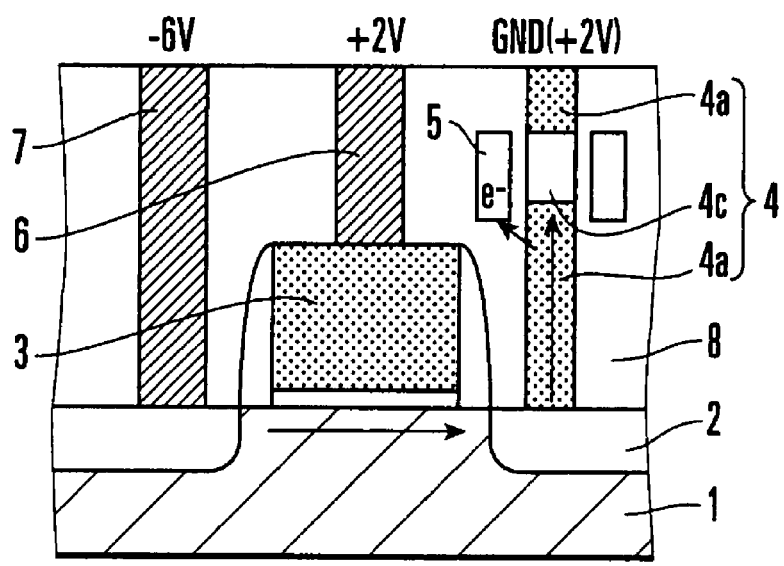
Figure 22C:
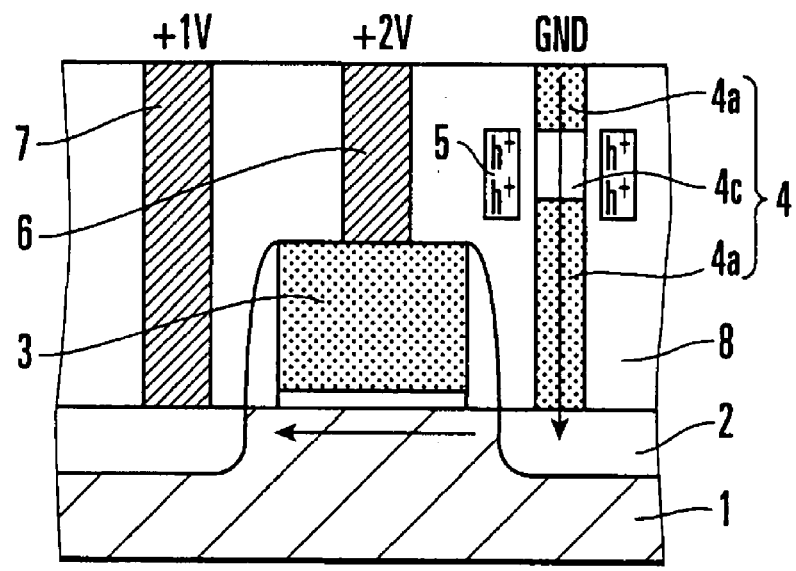
Figure 22D:
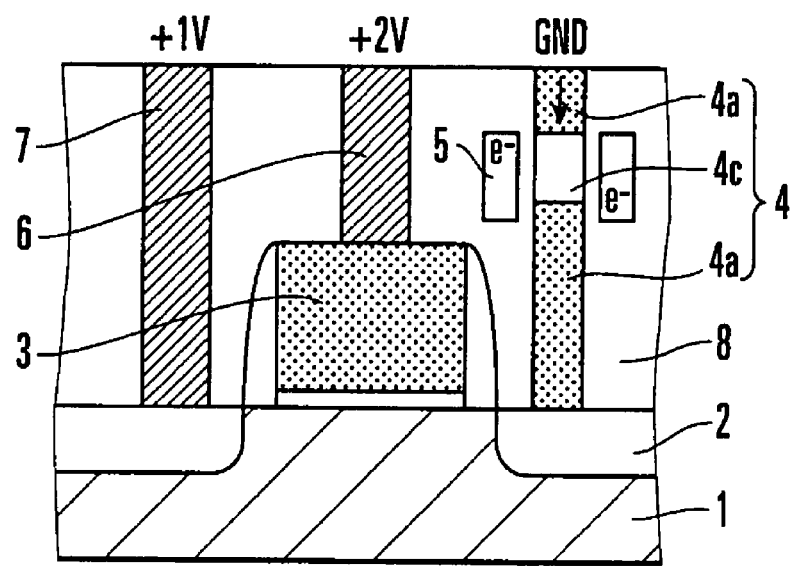

FIGS. 22A to 22D are sectional views showing the main part of Example 20 of the present invention. FIG. 22A shows a state in the erase, FIG. 22B shows a state in the write, and FIGS. 22C and 22D show states in the read. Example 20 is different from Example 15 shown in FIGS. 17A to 17D in that the p-type polysilicon film of a drain leader line is replaced with an insulating film 4c that is thinner than the p-type polysilicon film and is located at a higher level than a control gate electrode 3.

In this example as well, the erase is done by creating an over-erase state. More specifically, in the erase, as shown in FIG. 22A, the source and control gate electrode 3 are grounded, and a voltage of +8 V is applied to a drain leader line 4 to apply a high electric field to the insulating film between the floating gate and the drain leader line, thereby removing electrons in the floating gate to the drain leader line 4 and accumulating holes in the floating gate. In the write, as shown in FIG. 22B, a voltage of +2 V is applied to the control gate electrode to turn on the transistor, the drain leader line is grounded, and a voltage of −6 V is applied to the source to inject electrons into the floating gate. When the holes accumulated in the floating gate disappear, the current flowing to the transistor also disappears, and the write is completed. After the erase is executed by grounding the source and applying voltages of +2 V and +8 V to the gate and drain, respectively, the erase operation may be stopped by detecting a current that flows upon completion of the erase.

The read is done by applying a voltage of +2 V to the control gate electrode and a voltage of +1 V to the source and grounding the drain leader line (forward read). When the cell is in the erase state, holes are accumulated in the floating gate.

For this reason, the band of the insulating film 4c of the drain leader line 4 surrounded by the floating gate drops. Since the electron barrier formed in the drain leader line disappears or lowers, the switching element formed in it is turned on [FIG. 22C]. When the cell is write-accessed, no charges are accumulated in the floating gate. An electron barrier is formed in the drain leader line by the insulating film 4c to suppress the current flowing through the drain leader line [FIG. 22D]. Even in this structure, the reverse read is possible.

EXAMPLE 21

Figure 23A:
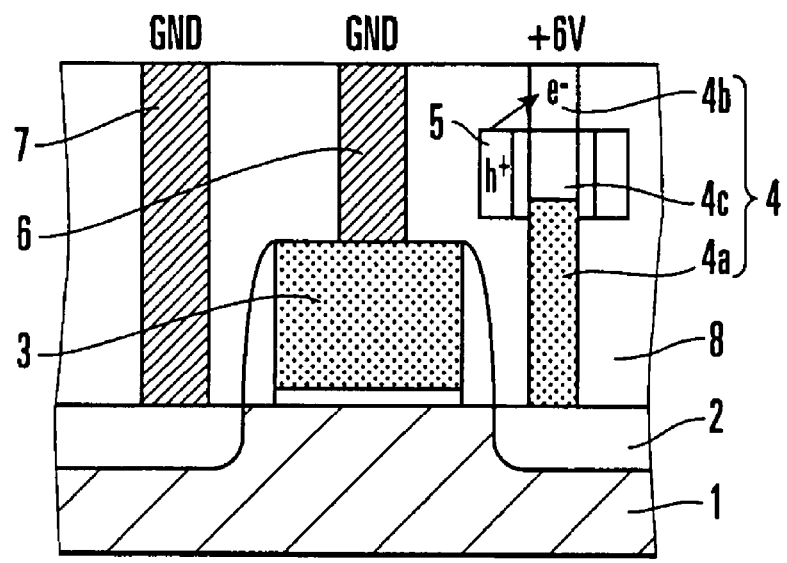
FIGS. 23A to 23D are sectional views showing the main part of Example 21 of the present invention.
Figure 23B:
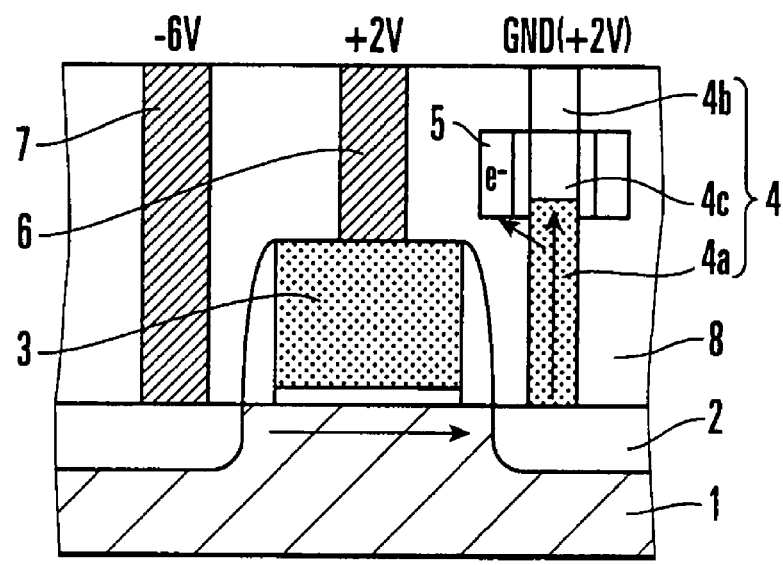
Figure 23C:
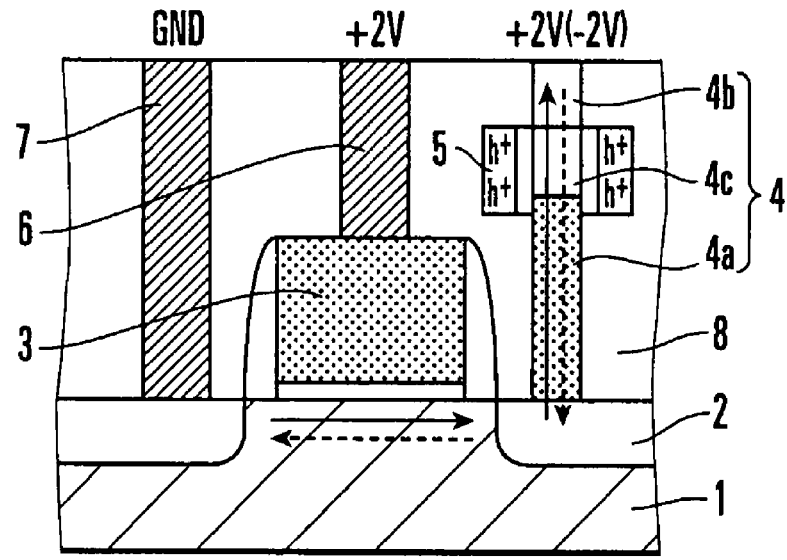
Figure 23D:
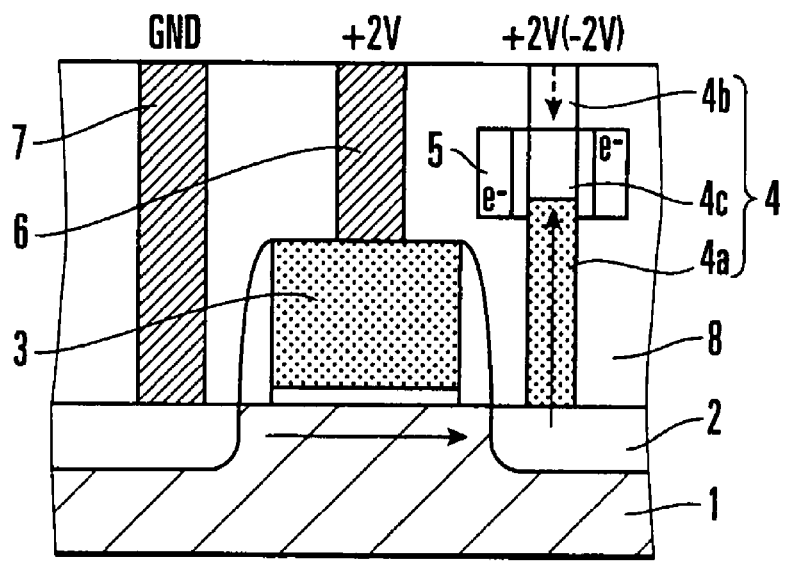

FIGS. 23A to 23D are sectional views showing the main part of Example 21 of the present invention. FIG. 23A shows a state in the erase, FIG. 23B shows a state in the write, and FIGS. 23C and 23D show states in the read. Example 21 is different from Example 7 shown in FIGS. 8A to 8D in that an insulating film 4c is inserted between an n-type polysilicon film 4a and a p-type polysilicon film 4b of a drain leader line, and a floating gate 5 surrounds the insulating film 4c.

In this example as well, the erase is done by creating an over-erase state. More specifically, in the erase, as shown in FIG. 23A, the source and a control gate electrode 3 are grounded, and a voltage of +6 V is applied to a drain leader line 4 to apply a high electric field to the insulating film between the floating gate and the drain leader line, thereby removing electrons in the floating gate to the drain leader line 4 and accumulating holes in the floating gate. In the write, as shown in FIG. 23B, a voltage of +2 V is applied to the control gate electrode to turn on the transistor, the drain leader line is grounded, and a voltage of −6 V is applied to the source to inject electrons into the floating gate. When the holes accumulated in the floating gate disappear, the current flowing to the transistor also disappears, and the write is completed. The write may be done not by grounding the drain leader line but by applying a voltage of about +2 V to the drain leader line. The write may be done by exchanging the application voltage to the drain leader line and that to the source leader line. The read is done by applying a voltage of +2 V to the control gate electrode, grounding the source, and applying a voltage of +2 V to the drain leader line. When the cell is in the erase state, holes are accumulated in the floating gate. For this reason, the band of the insulating film 4c of the drain leader line 4 surrounded by the floating gate drops. Since the electron barrier formed in the drain leader line disappears or lowers, the electrons move, as indicated by the solid arrows. If the read is done by applying a voltage of −2 V to the drain leader line, the electrons move, as indicated by the dotted arrows [FIG. 23C]. When the cell is write-accessed, no charges are accumulated in the floating gate. An electron barrier is formed in the drain leader line by the insulating film 4c to suppress the current flowing through the drain leader line [FIG. 23D].

Only two examples, Examples 20 and 21 have been described as examples that insert an insulating film to the drain leader line. However, in all examples (FIGS. 8A to 16D) in which the drain leader line has a p-n junction, an insulating film can be inserted to the junction. Additionally, in all examples (FIGS. 17A to 21D) with an n-p-n structure, the p-type polysilicon film can be replaced with an insulating film (the thickness is changed as needed). The driving method is the same as in the examples with a p-n junction or the examples with an n-p-n structure.

Examples that form the drain leader line by using a semiconductor material have been described above. Instead, a contact portion except an insulating film may be made of a metal or metal silicide. The above-described device operation is possible even when the drain leader line has an n-p-n structure or a metal or metal silicide structure without p-type Si. A structure with p-type Si sandwiched by metal or metal silicide layers is more preferable. Intrinsic Si is also usable. The operation can also be implemented by using n-type Si and a metal having a large work function.

Figure 24:
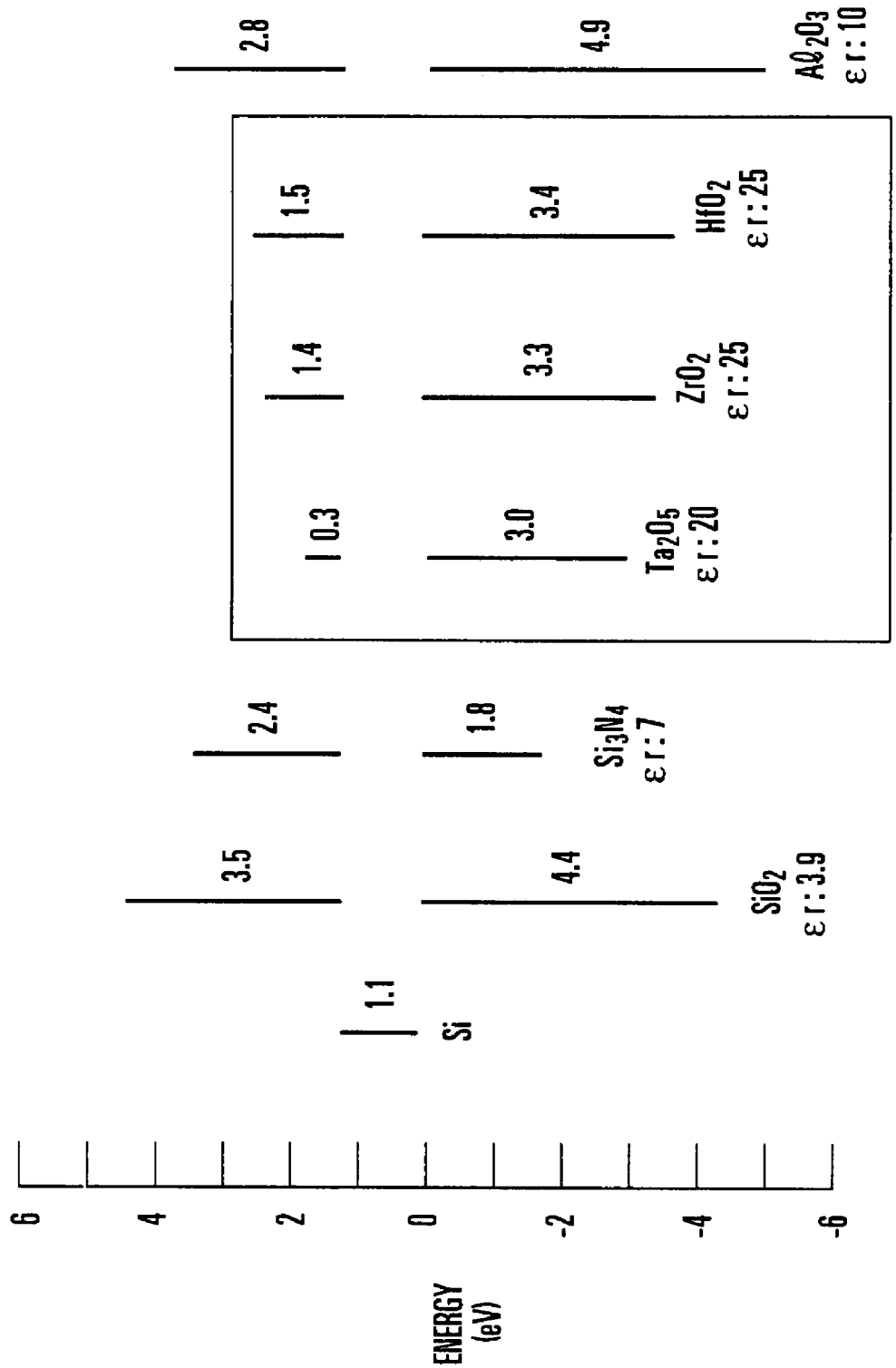
FIG. 24 is a view showing the electron barriers and hole barriers of various insulating materials.

To increase the electric conductivity of the drain leader line, a material with a low electron barrier can advantageously be used for the insulating film inserted to the drain leader line. FIG. 24 is a view showing the heights of barriers of various insulating materials. The numbers indicate the heights of electron barriers and hole barriers with respect to silicon. As the insulating material used in the drain leader line of the present invention, $Ta_2O_5$, $ZrO_2$, and $HfO_2$ surrounded by the line are preferable. BST is also known as a material with a low electron barrier height beyond $Ta_2O_5$, although not shown. Hence, the most preferable insulating materials are BST and $Ta_2O_5$. If the conductivity type of the semiconductor reverses, $Si_3N_4$ with a low hole barrier can advantageously be used.

EXAMPLE 22

Figure 25A:
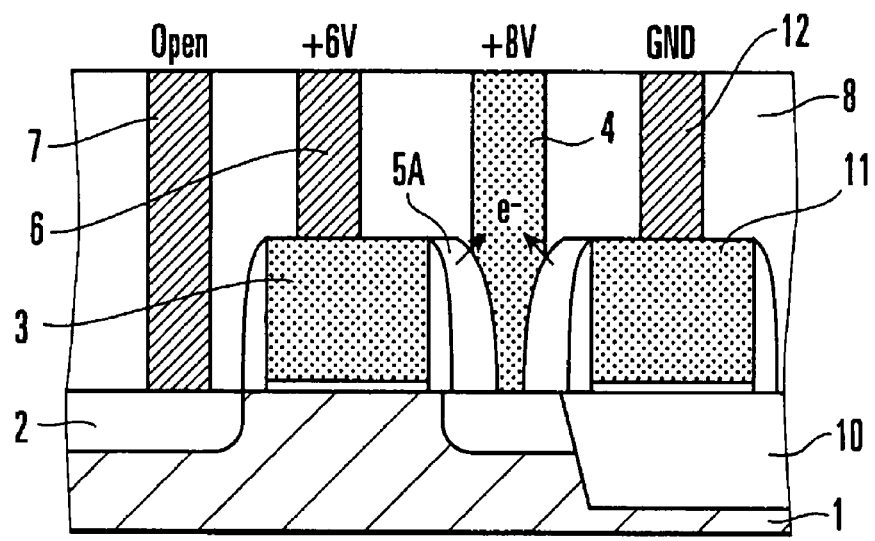
FIGS. 25A to 25D are sectional views showing the main part of Example 22 of the present invention.
Figure 25B:
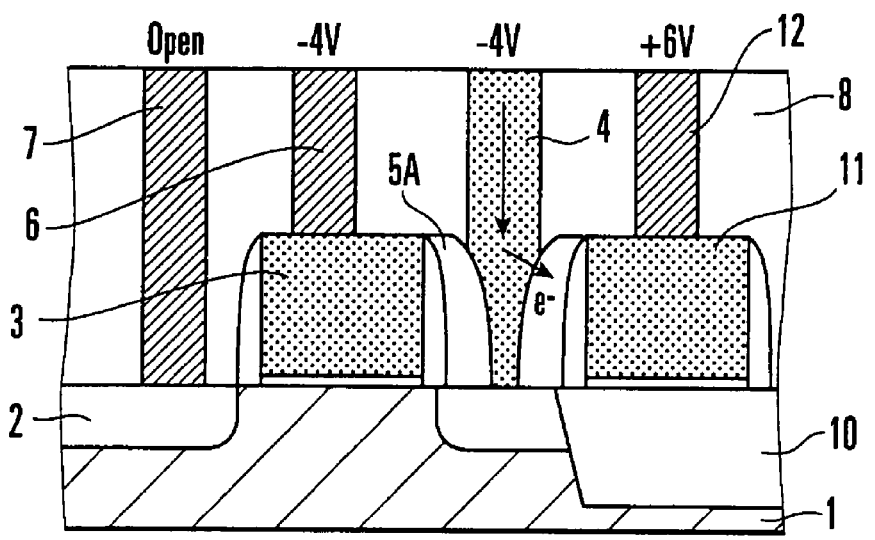
Figure 25C:
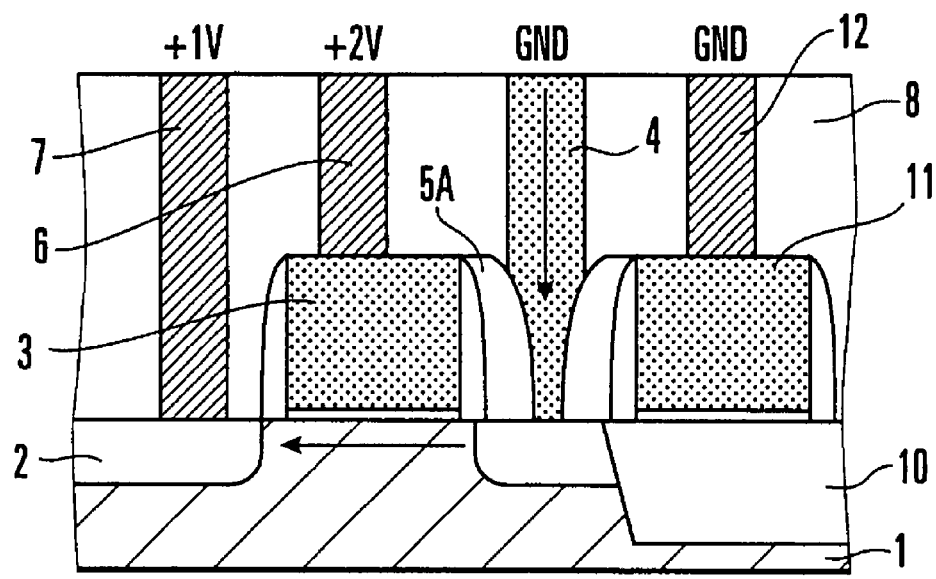
Figure 25D:
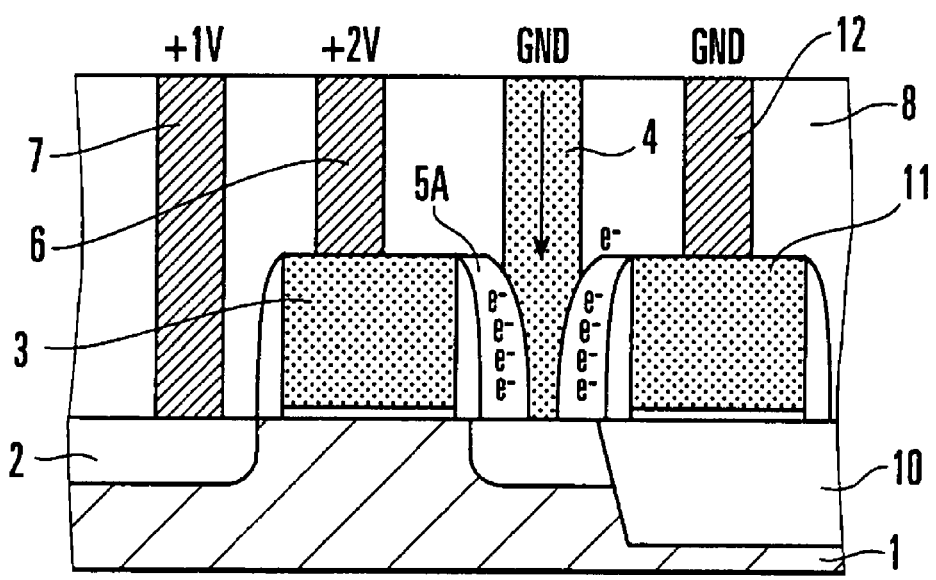

FIGS. 25A to 25D are sectional views showing the main part of Example 22 of the present invention. FIG. 25A shows a state in the erase, FIG. 25B shows a state in the write, and FIGS. 25C and 25D show states in the read. Example 22 is different from Example 6 shown in FIGS. 7A to 7E in that an insulating floating gate 5A having $Al_2O_3$ serving as an electron trap film is used in place of a floating gate using polysilicon.

In the erase, as shown in FIG. 25A, the source is opened, a voltage of 0 V is applied to a control gate electrode and a write/erase control interconnection, and a voltage of +8 V is applied to a drain leader line to apply a high electric field to the gate insulating film between the insulating floating gate and the drain leader line, thereby removing electrons in the insulating floating gate to the drain leader line. In the write, as shown in FIG. 25B, the source is opened, a voltage of +6 V is applied to the control gate electrode and write/erase control interconnection, and a voltage of −4 V is applied to the drain leader line, thereby injecting electrons into the insulating floating gate 5A by an EN current. As the insulating floating gate, alumina sandwiched by silicon oxide films, a silicon nitride: film, hafnium-based oxide film, oxynitride film, or zirconium-based oxide film is suitably used.

In this example, electron trap to the insulating film has been described. However, a ferroelectric material may be used in place of the insulating floating gate material. In this case, lead zirconate titanate (PZT) or bismuth strontium tantalate (SBT) is preferably used.

The read is the same as in Example 6.

EXAMPLE 23

Example 1 of Production Method

A production method of the nonvolatile semiconductor storage unit according to the present invention will be described next in detail with reference to the accompanying drawings.

Figure 26A:
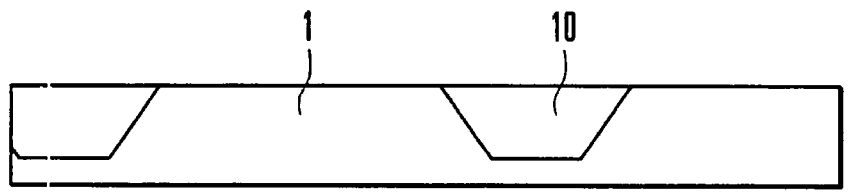
FIGS. 26A to 26M are sectional views showing steps in Example 1 of the production method of the present invention.
Figure 26B:
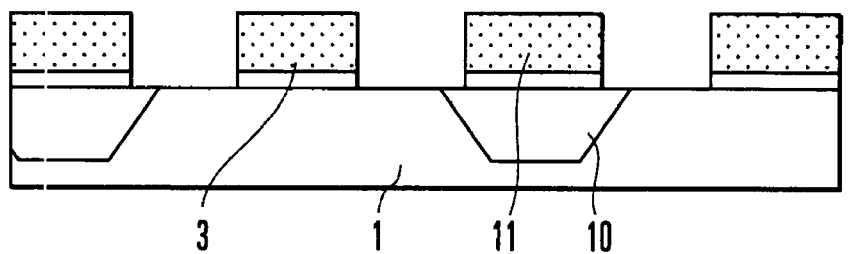
Figure 26C:
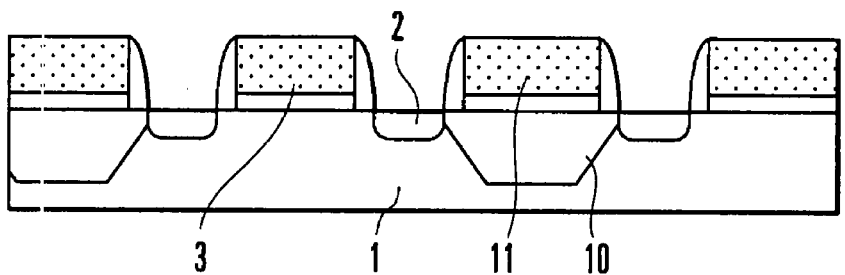
Figure 26D:
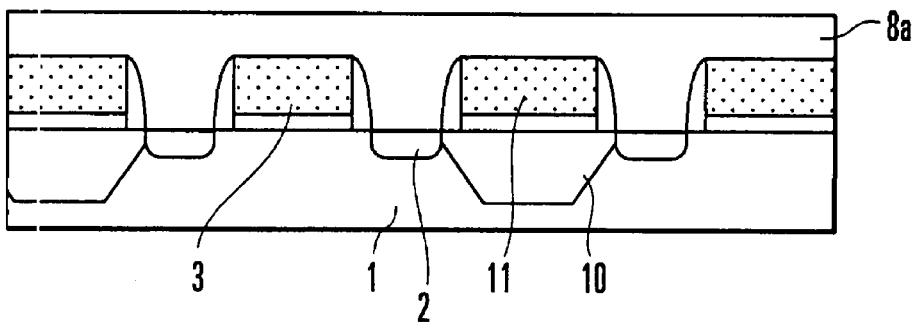

FIGS. 26A to 26M are sectional views showing steps in Example 1 of the production method. First, an element isolation region 10 to define active regions is formed in the surface region of a p-type silicon substrate 1 by, e.g., shallow trench isolation (STI) [FIG. 26A]. A gate insulating film is formed by thermal oxidation. Polysilicon is deposited. Phosphorus is ion-implanted to lower the resistance. Patterning is executed by photolithography to form a control gate electrode 3 on the active region and a write/erase control interconnection 11 on the element isolation region 10 by [FIG. 26B]. Silicon oxide is deposited and etched by anisotropic etching to form a sidewall on the side surface of each of the control gate electrode 3 and write/erase control interconnection 11. Ion implantation is executed by using the control gate electrode and sidewall as a mask to form n-type diffusion layers 2 serving as source and drain regions [FIG. 26C]. Silicon oxide is deposited to form a first interlayer dielectric film 8a [FIG. 26D].

Figure 26E:
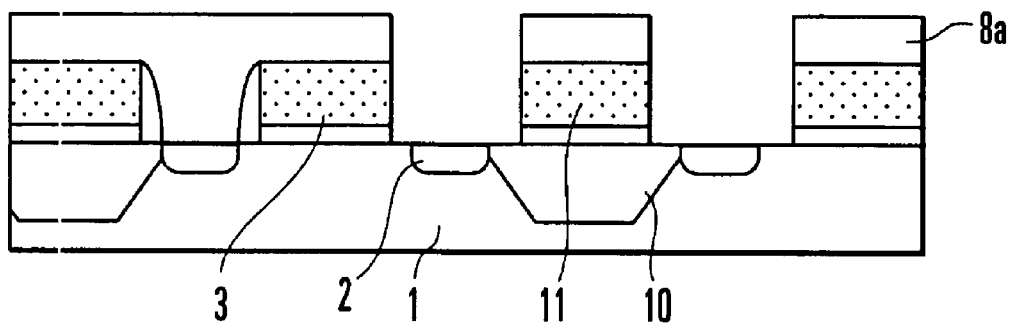
Figure 26F:
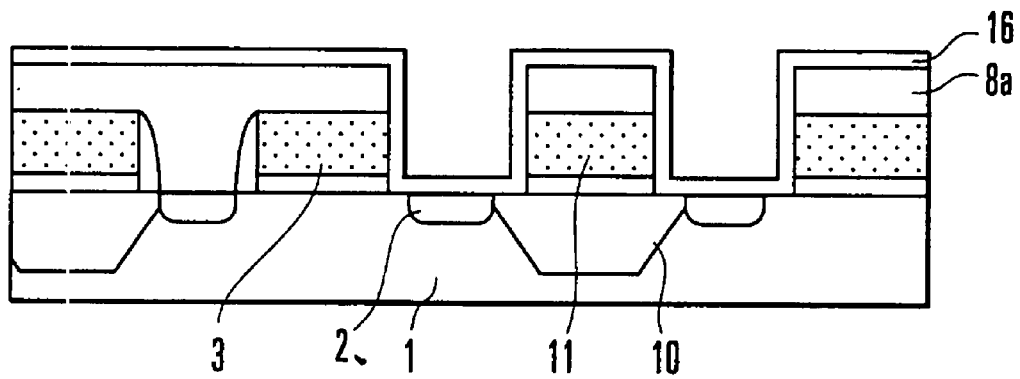
Figure 26G:
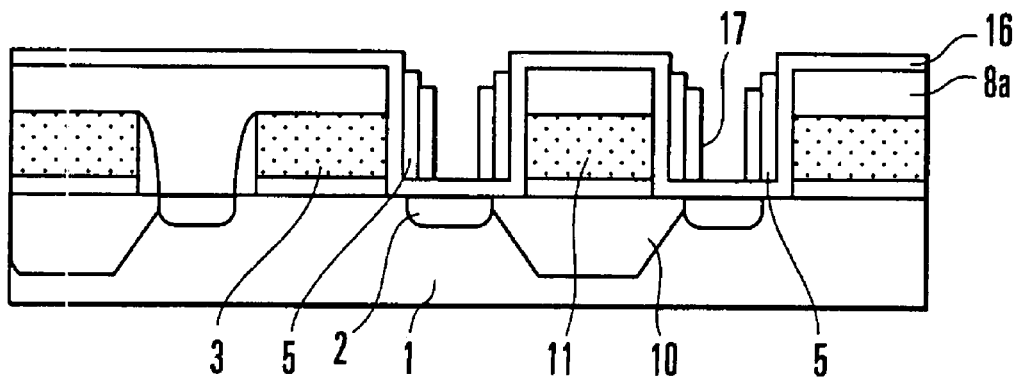
Figure 26H:
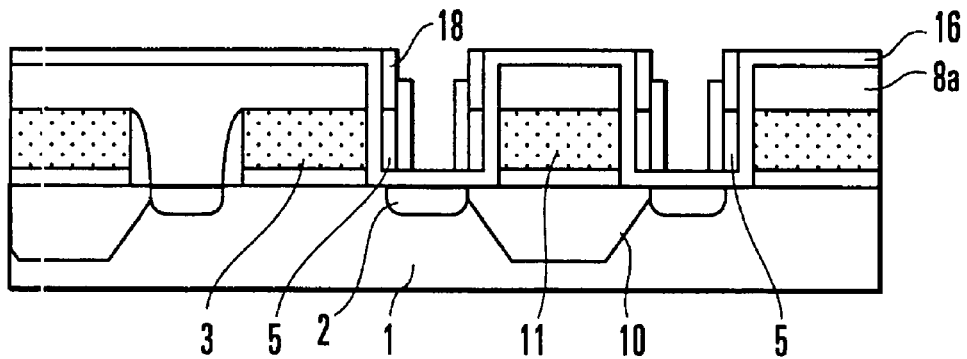
Figure 26I:
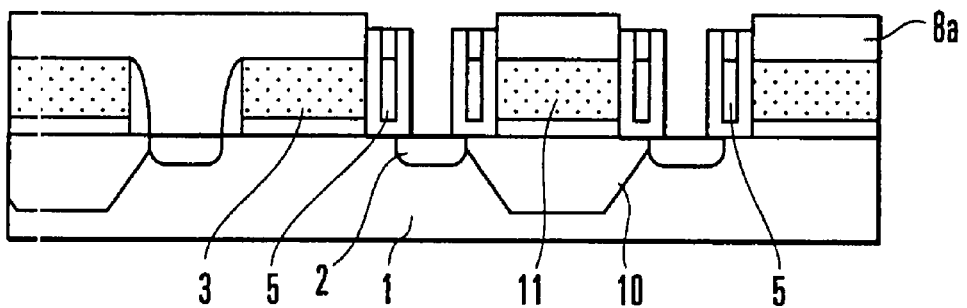
Figure 26J:
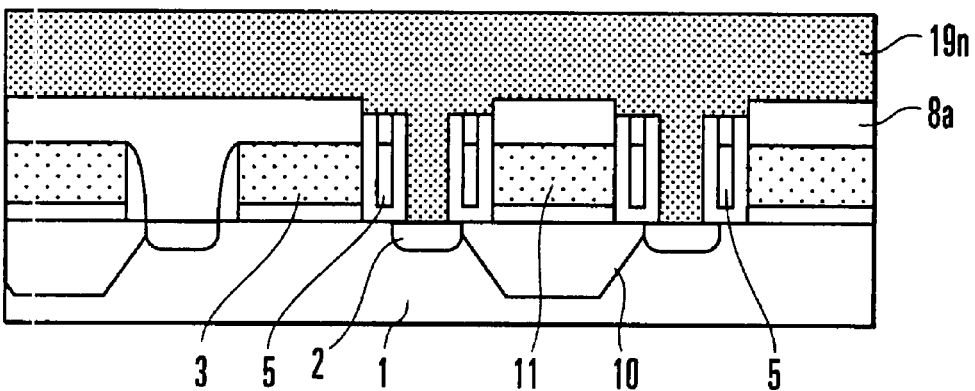

The first interlayer dielectric film 8a and sidewall are selectively etched by photolithography to form a contact hole on each drain region [FIG. 26E]. After surface treatments such as cleaning and diluted hydrofluoric acid treatment are executed, a protective insulating film 16 including three layers of silicon oxide, silicon nitride, and silicon oxide is formed [FIG. 26F]. Polysilicon is deposited and etched by anisotropic etching to form a floating gate 5. Thermal oxidation is performed. A silicon nitride film is deposited and etched by anisotropic etching to form a second gate insulating film 17 [FIG. 26G]. The upper portion of the floating gate is converted into a silicon oxide film 18 by thermal oxidation [FIG. 26H]. The protective insulating film 16 is etched back to expose the substrate surface [FIG. 26I]. After surface treatments such as cleaning and diluted hydrofluoric acid treatment are executed, an n-type polysilicon film 19n is deposited [FIG. 26J].

Figure 26K:
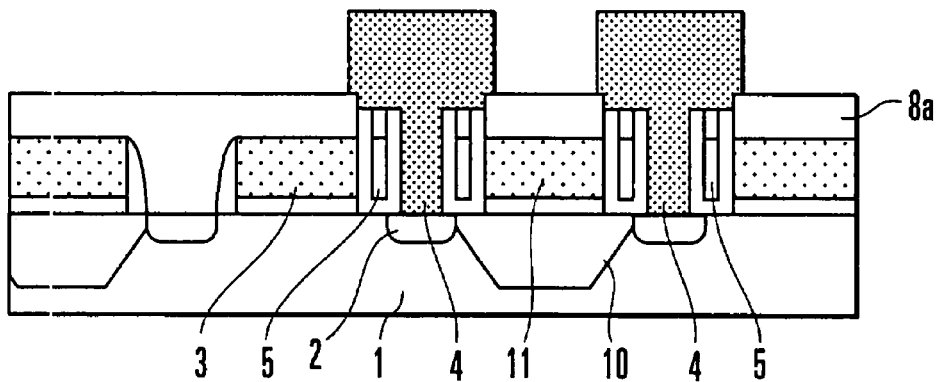
Figure 26L:
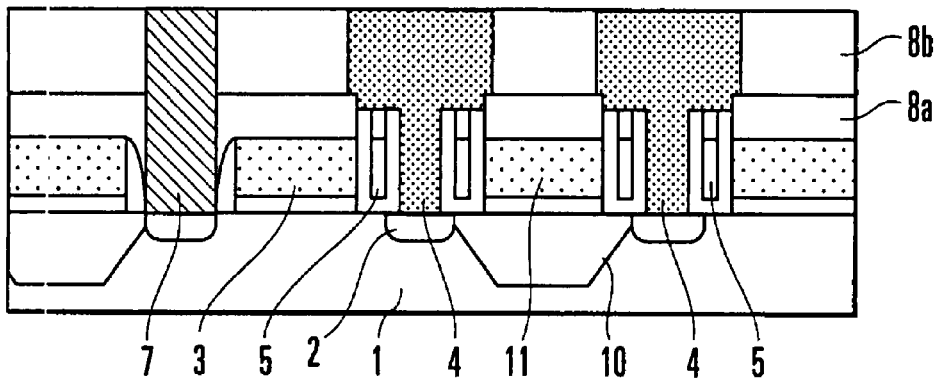
Figure 26M:
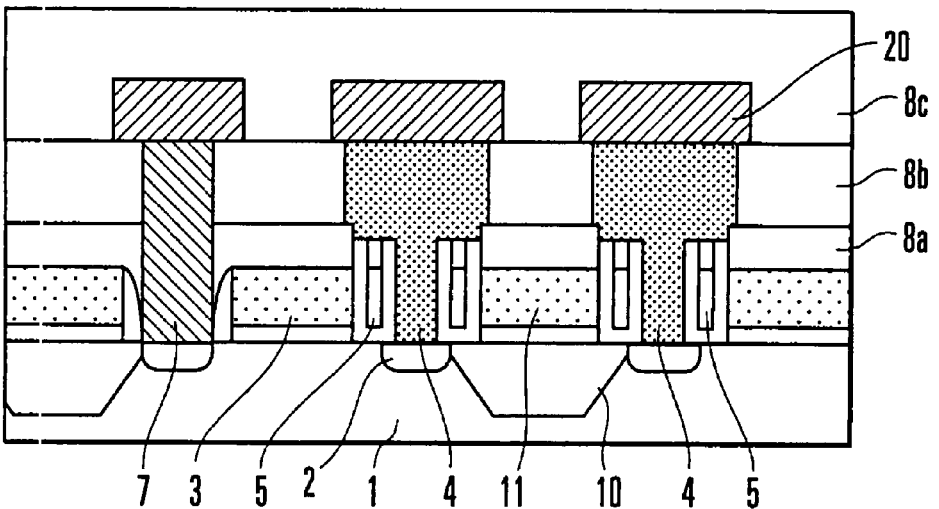

The n-type polysilicon film 19n is patterned by photolithography to form a drain leader line 4 [FIG. 26K]. An insulating film such as a silicon oxide film is deposited to form a second interlayer dielectric film 3b. The surface of the drain leader line is exposed by etch-back or CMP (Chemical Mechanical Polishing). The second interlayer dielectric film 8b is selectively etched to form a contact hole on the source region. TiN and Ti are deposited by sputtering. W is deposited to fill the contact hole. A source leader line 7 is formed by etch-back (or CMP) [FIG. 26L]. After that, a metal film of, e.g., µl is deposited by sputtering and patterned to form a metal interconnection 20. An insulating film is deposited on the entire surface to form a third interlayer dielectric film 8c [FIG. 26M].

In the above-described steps, the floating gate and second gate insulating film are formed by separate etching processes. However, they may be formed at once. More specifically, in the state shown in FIG. 26F, polysilicon deposition, thermal oxidation, and silicon nitride deposition are done. Then, the films are etched back at once to obtain the state shown in FIG. 26G. Alternatively, thermal oxidation of polysilicon may be omitted, or silicon oxide may be deposited.

EXAMPLE 24

Example 2 of Production Method

Figure 27A:
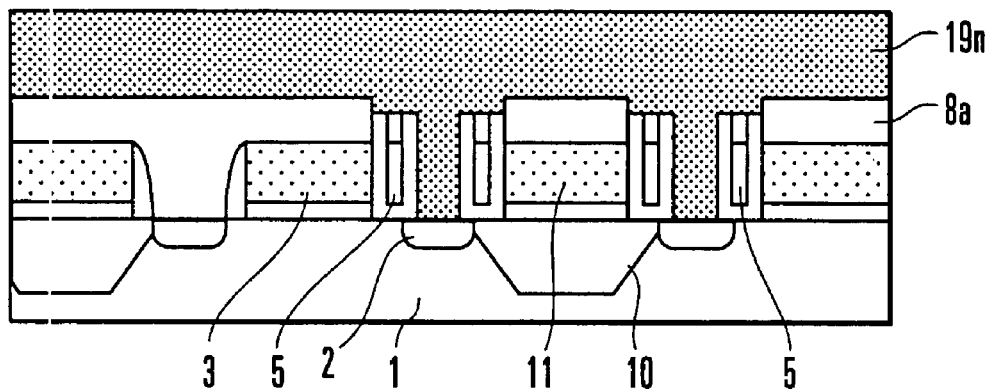
FIGS. 27A to 27F are sectional views showing steps in Example 2 of the production method of the present invention.

FIGS. 27A to 27F are sectional views for explaining steps in Example 2 of the production method. The steps of Example 2 are the same halfway as those shown in FIGS. 26A to 26J of Example 1, and an illustration and description thereof will be omitted. FIG. 27A shows the state in FIG. 26J.

Figure 27B:
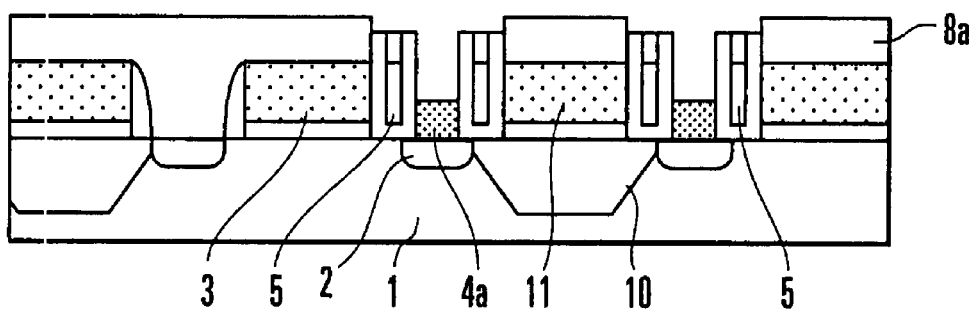
Figure 27C:
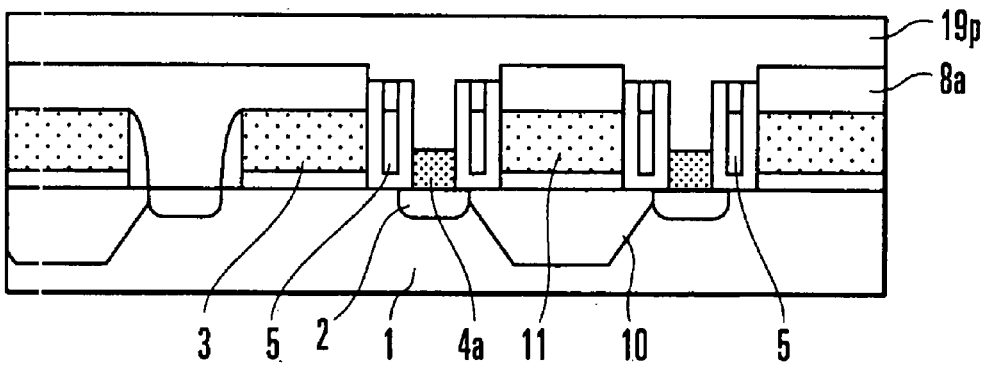
Figure 27D:
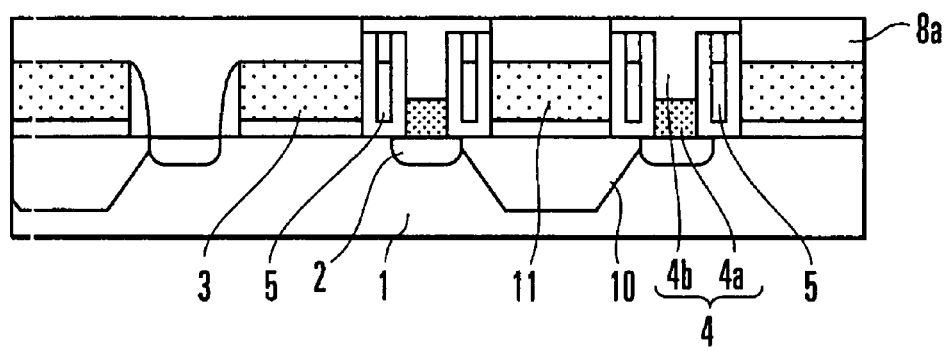
Figure 27E:
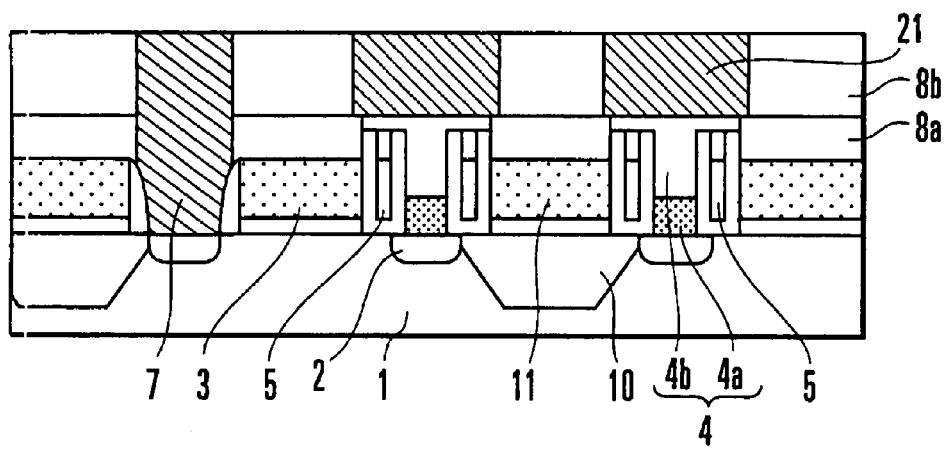
Figure 27F:
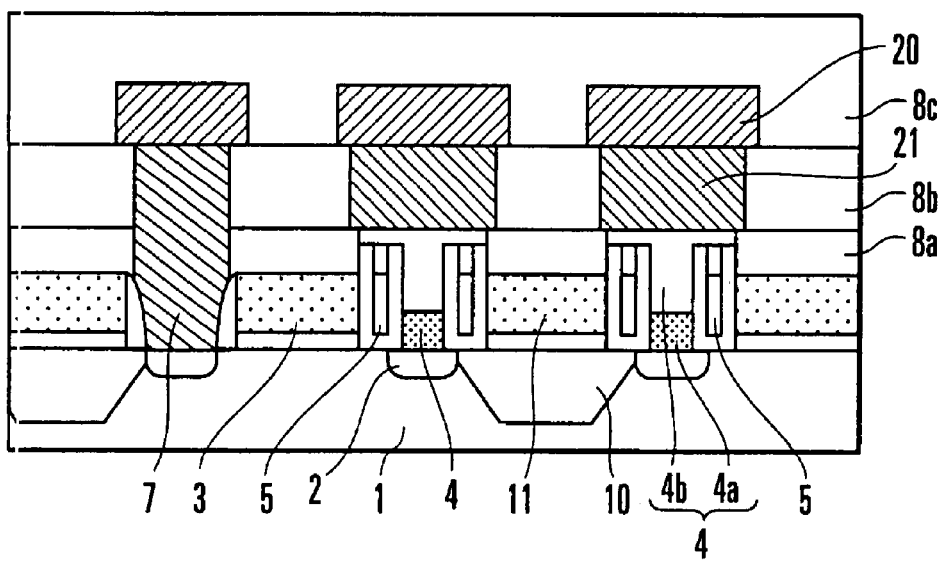

After the state shown in FIG. 27A is obtained, an n-type polysilicon film 19n is etched back halfway to form an n-type polysilicon film 4a of the drain leader line [FIG. 27B]. Next, a p-type polysilicon film 19p is deposited [FIG. 27C]. The p-type polysilicon film 19p is etched back to fill the contact holes and form a p-type polysilicon film 4b of the drain leader line [FIG. 27D]. An insulating film such as a silicon oxide film is deposited to form a second interlayer dielectric film 8b. The second interlayer dielectric film 8b is selectively etched back to form contact holes on the source region and each drain leader line 4. After TiN and Ti are deposited by sputtering, W is deposited to fill the contact holes. A source leader line 7 is formed on the source region, and a W plug 21 is formed on each drain leader line by etch-back (or CMP) [FIG. 27E]. After that, a metal film of, e.g., Al is deposited by sputtering and patterned to form a metal interconnection 20. An insulating film is deposited on the entire surface to form a third interlayer dielectric film 8c [FIG. 27F].

In this example, the p-n junction of the drain leader line is formed by depositing p-type polysilicon. Instead, the p-n junction may be formed by ion-implanting a p-type impurity in the state shown in FIG. 27A. The drain leader line may be made of single-crystal silicon. More specifically, in the state [state shown in FIG. 26I] before deposition of the n-type polysilicon film 19n, n-type single-crystal silicon is grown on the drain region by selective growth. The dopant is changed halfway to a p-type impurity, thereby forming a drain leader line made of a single-crystal silicon film with a p-n junction.

EXAMPLE 25

Example 3 of Production Method

Figure 28A:
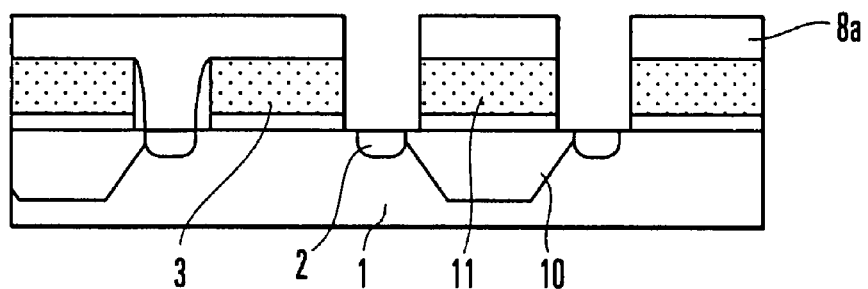
FIGS. 28A to 28G are sectional views showing steps in Example 3 of the production method of the present invention.
Figure 28B:
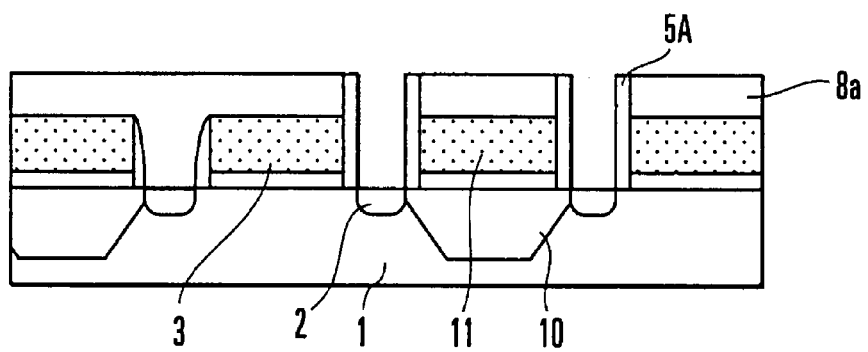
Figure 28C:
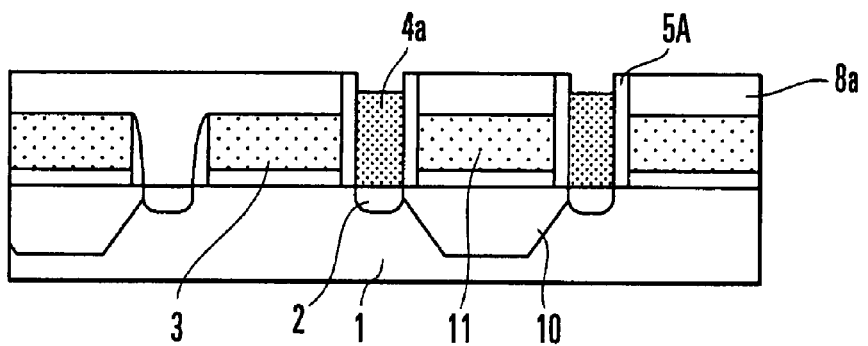
Figure 28D:
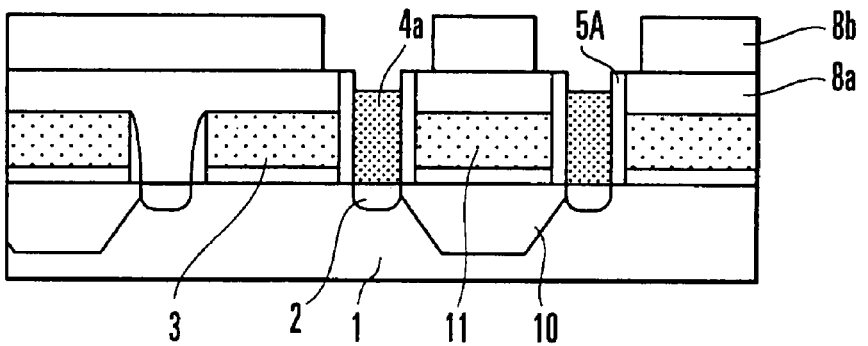
Figure 28E:
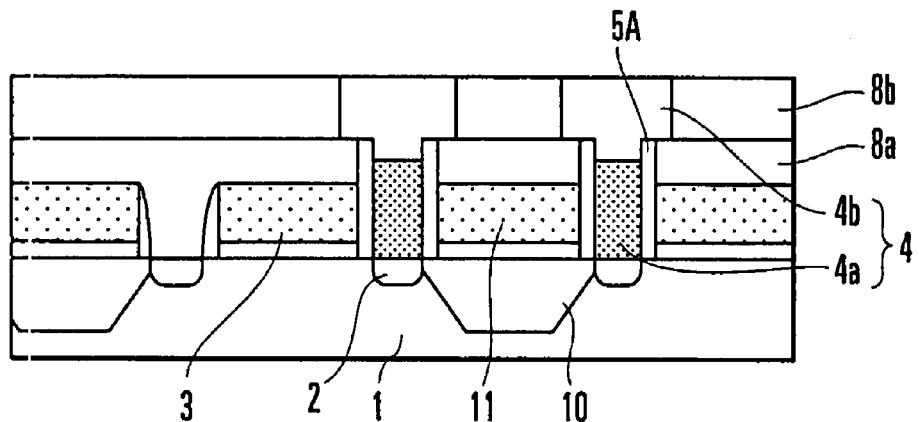
Figure 28F:
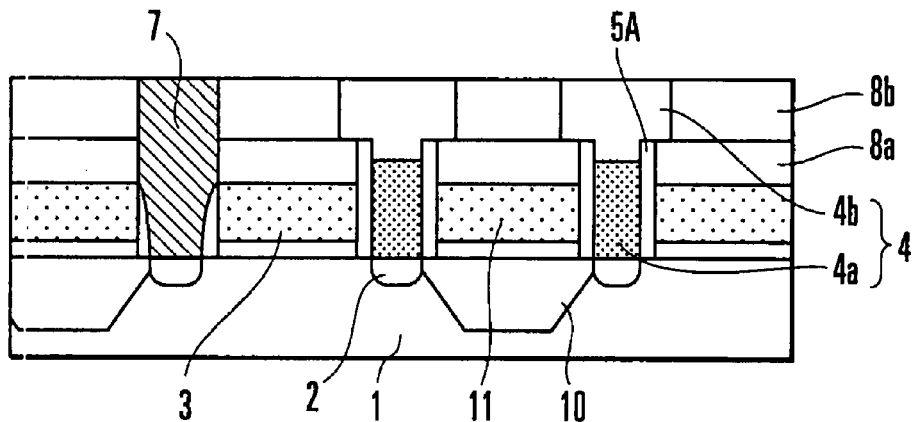
Figure 28G:
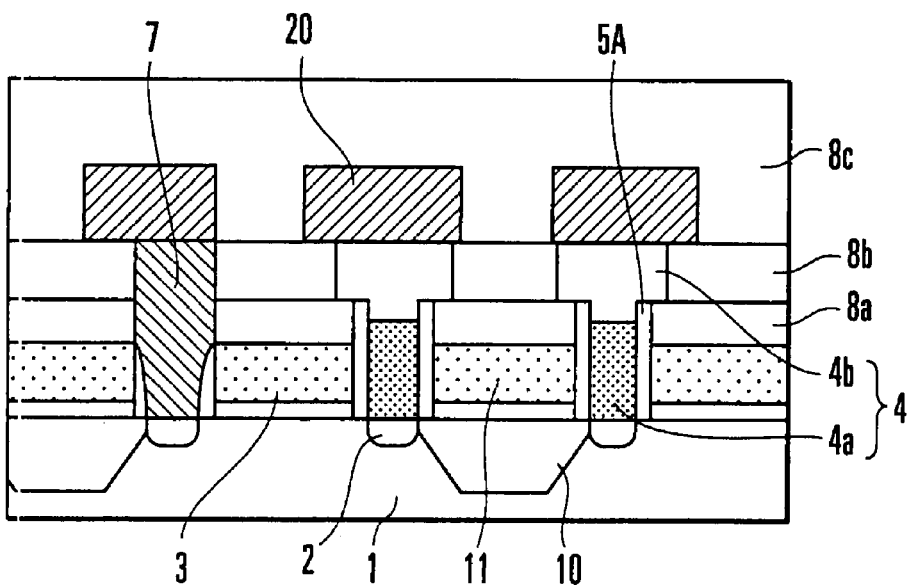
Figure 29A:
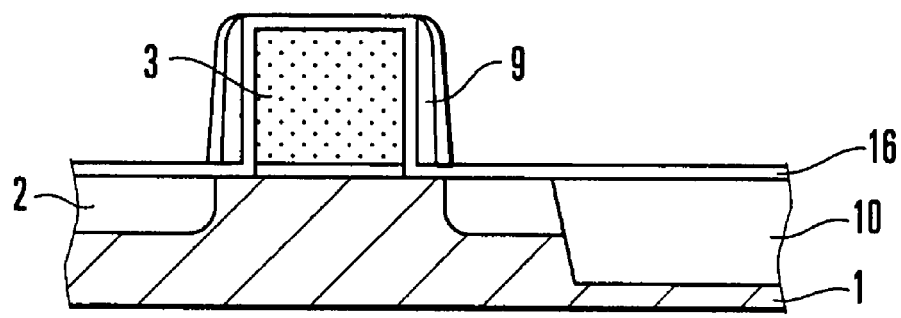
FIGS. 29A to 29F are sectional views showing steps in Example 4 of the production method of the present invention.
Figure 29B:
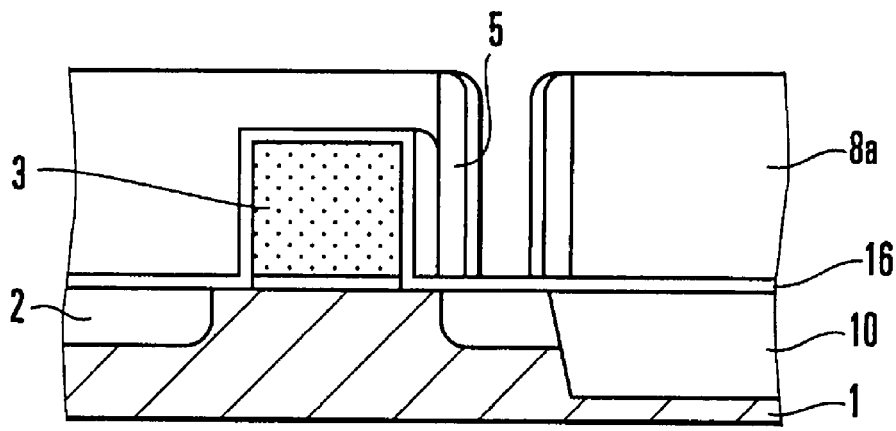
Figure 29C:
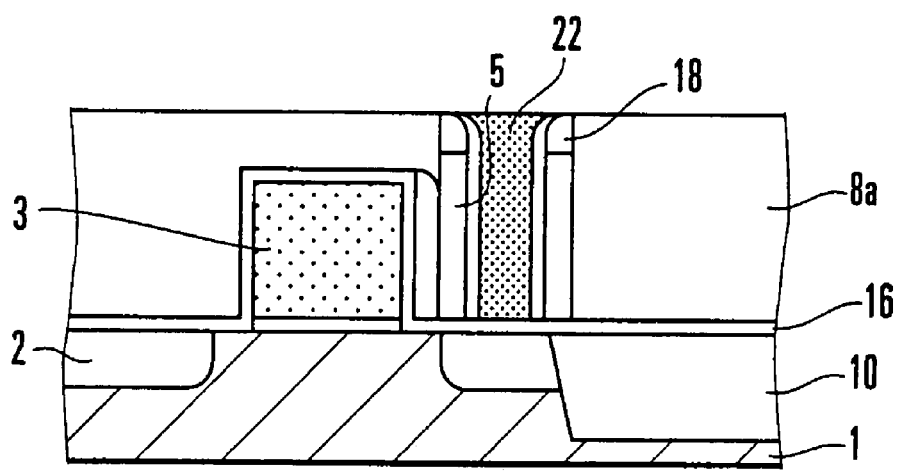
Figure 29D:
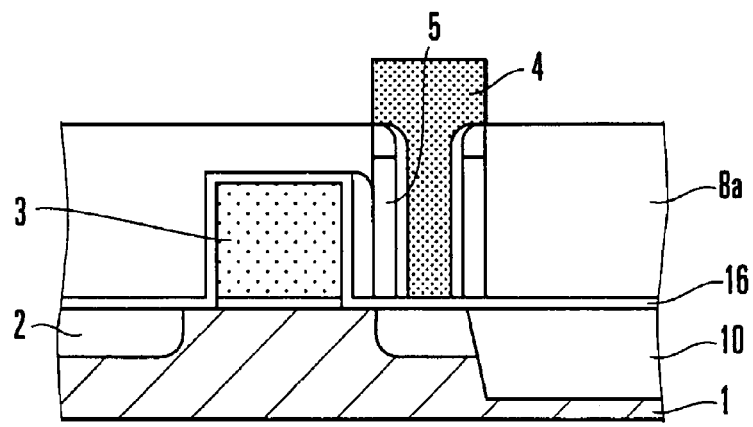
Figure 29E:
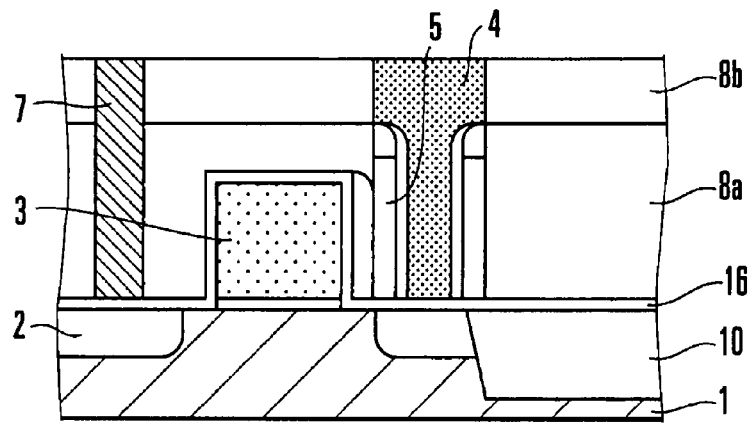
Figure 29F:
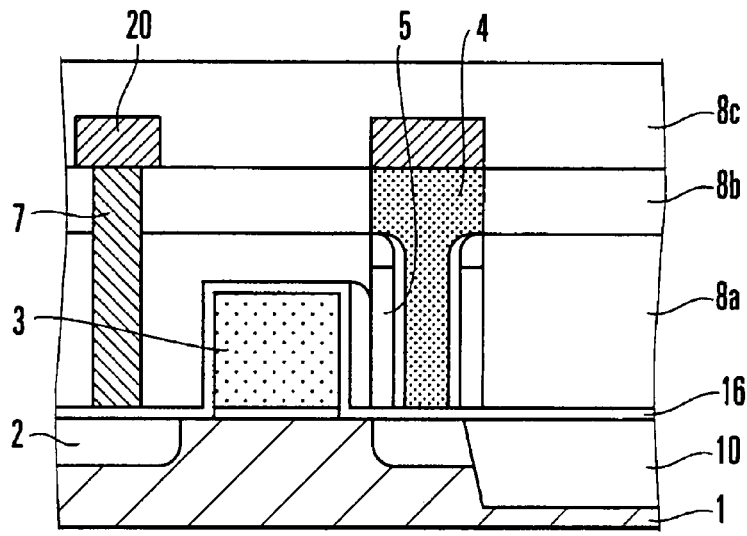
Figure 30A:
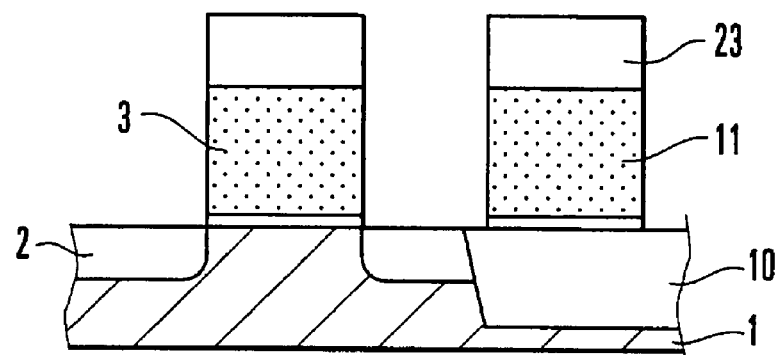
FIGS. 30A to 30F are sectional views showing steps in Example 5 of the production method of the present invention.
Figure 30B:
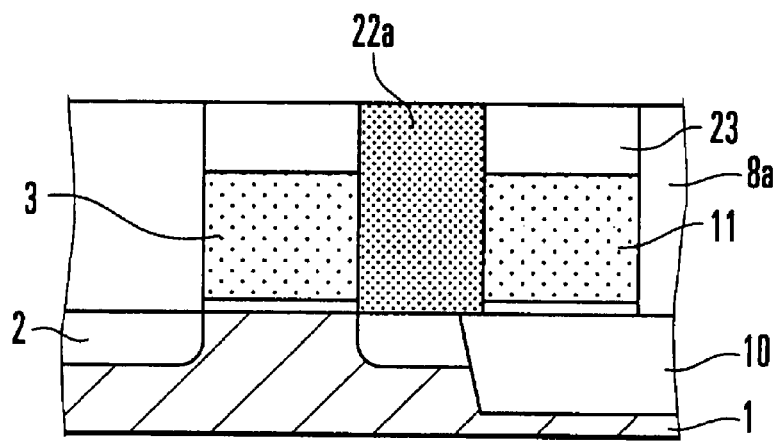
Figure 30C:
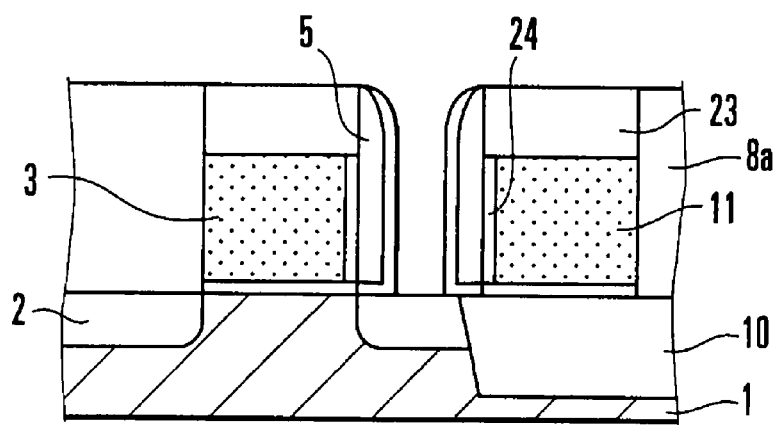
Figure 30D:
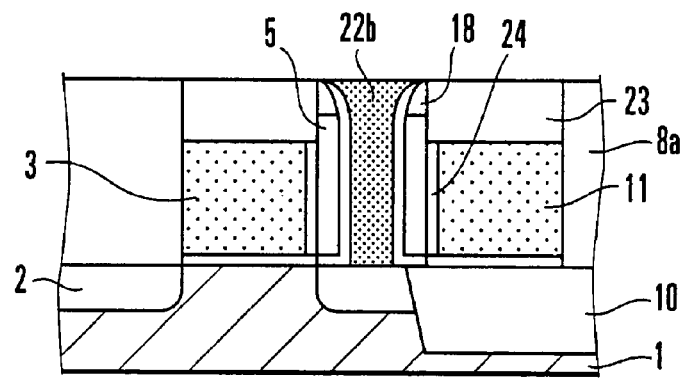
Figure 30E:
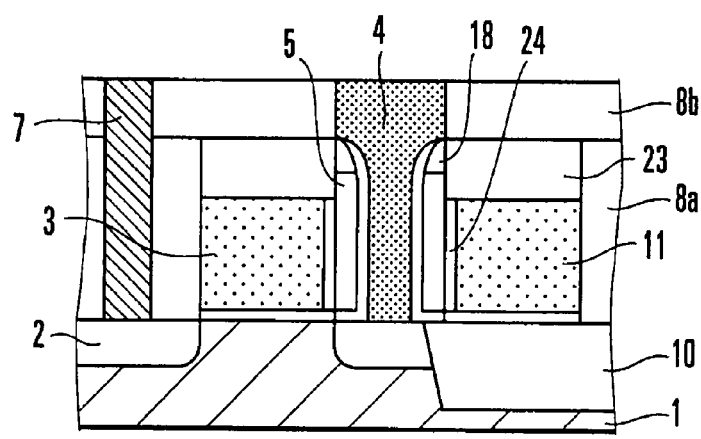
Figure 30F:
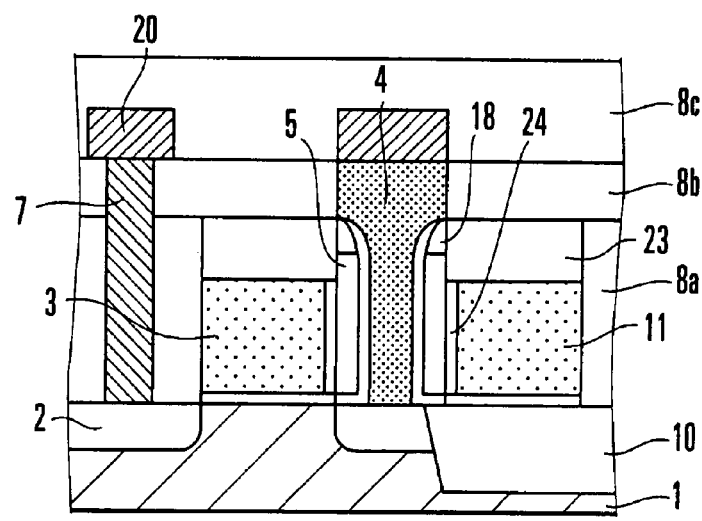

FIGS. 28A to 28G are sectional views for explaining steps in Example 3 of the production method. The steps of Example 3 are the same halfway as those shown in FIGS. 26A to 26E of Example 1, and an illustration and description thereof will be omitted. FIG. 28A shows the state in FIG. 26E.

After the state shown in FIG. 28A is obtained, surface treatments such as cleaning and diluted hydrofluoric acid treatment are executed. Then, a three-layered film of silicon oxide, silicon aluminum, and silicon oxide is formed and etched back to form an insulating floating gate 5A having an electron trap film [FIG. 28B]. N-type polysilicon is deposited and etched back to form an n-type polysilicon film 4a of the drain leader line in each contact hole [FIG. 28C]. Instead of using the method of forming the n-type polysilicon film 4a, an n-type single-crystal silicon film may be formed by selective growth. Then, a second interlayer dielectric film 8b is formed. The second interlayer dielectric film 8b on each drain region is selectively removed by photolithography [FIG. 28D]. Deposition and etch-back (or CMP) of p-type polysilicon are done to bury the polysilicon in the second interlayer dielectric film 8b, thereby forming a p-type polysilicon film 4b of the drain leader line [FIG. 28E]. A contact hole is formed on the source region. TiN, Ti, and W are sequentially deposited. A W plug serving as a source leader line 7 is formed by etch-back (or CMP) [FIG. 28F]. After that, a metal interconnection 20 and a third interlayer dielectric film are formed [FIG. 28G].

In this example, aluminum oxide is used as the electron trap film. Instead, silicon nitride may be used.

EXAMPLE 26

Example 4 of Production Method

FIGS. 29A to 29F are sectional views showing steps in Example 4 of the production method. First, an element isolation region 10 to define active regions is formed in the surface region of a p-type silicon substrate 1. A gate insulating film is formed by thermal oxidation. Polysilicon is deposited and patterned to form a control gate electrode 3 on the active region. Thermal oxidation is executed. Silicon nitride and silicon oxide are deposited to cover the entire surface with a protective insulating film 16. Polysilicon and silicon oxide are deposited and etched by anisotropic etching to form a sidewall including a sidewall silicon film 9 on the side surface of the control gate electrode 3. Ion implantation is executed by using the control gate electrode and sidewall as a mask to form n-type diffusion layers 2 serving as source and drain regions [FIG. 29A]. The sidewall silicon film exceptt a region where a drain contact hole is to be formed is removed by etching. Silicon oxide is deposited to form a first interlayer dielectric film 8a. The first interlayer dielectric film 8a and sidewall are selectively etched by photolithography to form a contact hole on the drain region and expose the side surface of the sidewall silicon film 9. Polysilicon and silicon oxide are deposited and etched by anisotropic etching to form a floating gate 5 partially including the sidewall silicon film 9 [FIG. 29B]. A polyimide film is formed by, e.g., spin coating. CMP is performed to form an organic filler 22 that fills the contact hole. Oxygen ions are implanted to convert the upper portion of the floating gate into a silicon oxide film 18 [FIG. 29C]. The organic filler 22 is removed by using a solvent. The protective insulating film 16 is partially removed by anisotropic etching to expose the drain region. After surface treatments such as cleaning and diluted hydrofluoric acid treatment are executed, an n-type polysilicon film is deposited and patterned by photolithography to form a drain leader line 4 [FIG. 29D]. An insulating film such as a silicon oxide film is deposited to form a second interlayer dielectric film 8b. The surface of the drain leader line is exposed by etch-back or CMP. The second interlayer dielectric film 8b is selectively etched to form a contact hole on the source region. TiN and Ti are deposited by sputtering. W is deposited to fill the contact hole. A source leader line 7 is formed by etch-back (or CMP) [FIG. 29E]. After that, a metal film of, e.g., Al is deposited by sputtering and patterned to form a metal interconnection 20. An insulating film is deposited on the entire surface to form a third interlayer dielectric film 8c [FIG. 29F].

In this example, the organic filler is formed by using polyimide. Instead, a resin material may be used as needed. The resin material is preferably a solvent-soluble material. In the step of forming the sidewall silicon film or floating gate by anisotropic etching of a polysilicon film and a silicon oxide film on it, the polysilicon film and silicon oxide film may be etched either together or separately.

EXAMPLE 27

Example 5 of Production Method

FIGS. 30A to 30F are sectional views for explaining steps in Example 5 of the production method. First, an element isolation region 10 to define active regions is formed in the surface region of a p-type silicon substrate 1. A gate insulating film is formed by thermal oxidation. Polysilicon and a silicon oxide film 23 are deposited and patterned by photolithography to form a control gate electrode 3 on the active region and a write/erase control interconnection 11 on the element isolation region 10. Ion implantation is executed by using the control gate electrode and silicon oxide film 23 as a mask to form n-type diffusion layers 2 serving as source and drain regions [FIG. 30A]. A polyimide film is formed by, e.g., spin coating, planarized by CMP, and patterned by photolithography so that the polyimide film remains on only the drain region to form a first organic filler 22a. Silicon oxide is deposited and planarized by CMP to form a first interlayer dielectric film 8a [FIG. 30B].

Next, the first organic filler 22a is removed. After surface treatments, thermal oxidation is executed to form a silicon oxide film 24 on the side surface of each of the control gate electrode and write/erase control interconnection. Polysilicon and silicon oxide are deposited and etched by anisotropic etching to form a floating gate 5 [FIG. 30C]. A polyimide film is formed by, e.g., spin coating. CMP is performed to form a second organic filler 22b that fills the contact hole. Oxygen ions are implanted to convert the upper portion of the floating gate into a silicon oxide film 18 [FIG. 30D]. The second organic filler 22b is removed by using a solvent. After surface treatments, an n-type polysilicon film is deposited and patterned by photolithography to form a drain leader line 4. An insulating film such as a silicon oxide film is deposited to form a second interlayer dielectric film 8b. The surface of the drain leader line is exposed by etch-back or CMP. The second interlayer dielectric film 8b is selectively etched to form a contact hole on the source region. TiN and Ti are deposited by sputtering. W is deposited to fill the contact hole. A source leader line 7 is formed by etch-back (or CMP) [FIG. 30E]. After that, a metal film of, e.g., Al is deposited by sputtering and patterned to form a metal interconnection 20. An insulating film is deposited on the entire surface to form a third interlayer dielectric film 8c [FIG. 30F].

In this example, the first organic filler is formed by using polyimide. However, the first organic filler itself may be made of a photosensitive resin. In this case, the filler can directly be formed by developing the photosensitive resin. In the above-described examples including this example, the floating gate is partially oxidized by ion implantation. If the filler used at that time is made of a material such as an inorganic material with a high thermal resistance, thermal oxidation may be used. In forming the floating gate and the silicon oxide film (second gate insulating film) on it, the two deposited films may be either subjected to anisotropic etching together or etched separately. Instead of depositing a silicon oxide film, an oxide film may be formed on the surface of the floating gate by thermal oxidation.

EXAMPLE 28

Example 6 of Production Method

Figure 31A:
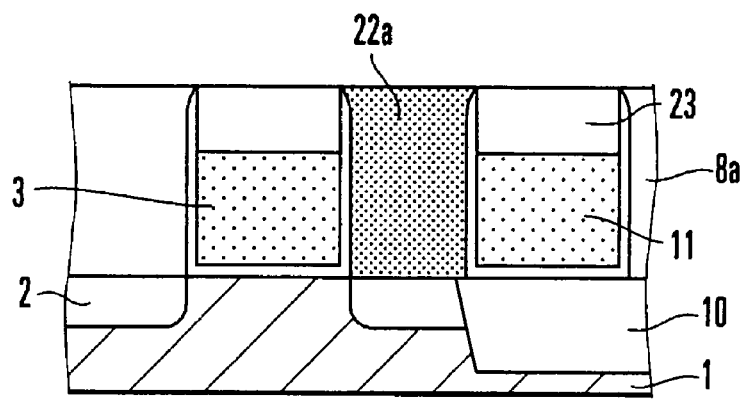
FIGS. 31A to 31C are sectional views showing steps in Example 6 of the production method of the present invention.
Figure 31B:
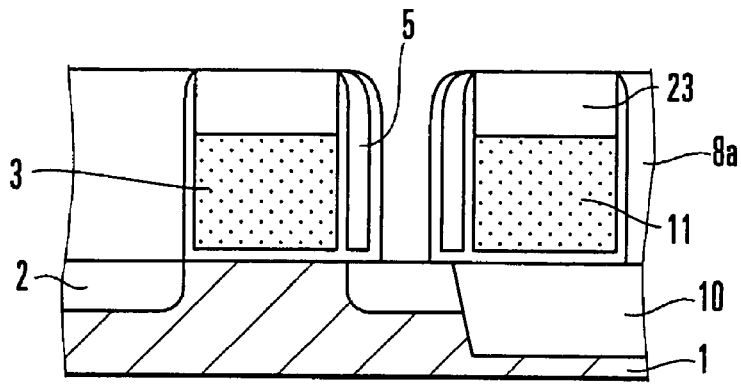
Figure 31C:
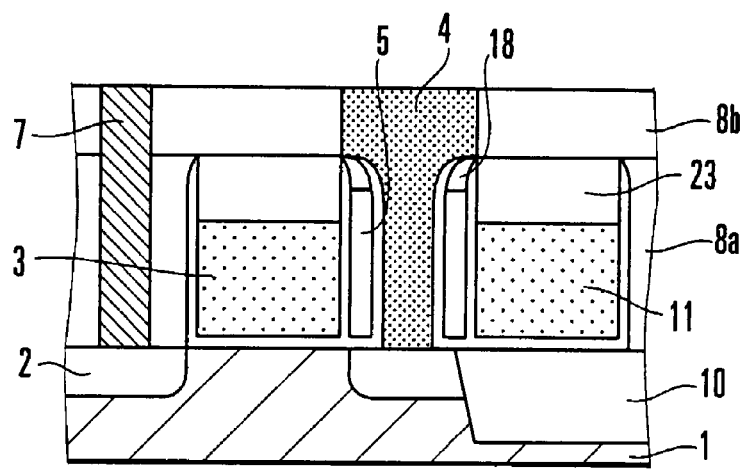

FIGS. 31A to 31C are sectional views for explaining steps in Example 6 of the production method. In this example, the steps of Example 5 of the production method are modified so that source and drain regions are formed after a sidewall is formed on the side surface of the gate. A control gate electrode 3 and a write/erase control interconnection 11 are formed in accordance with the same procedures as in the above-described example. Silicon oxide is deposited and etched by anisotropic etching to form a sidewall on the side surface of each of the control gate electrode 3 and write/erase control interconnection 11. Ion implantation is executed to form n-type diffusion layers 2 serving as source and drain regions. Then, a first organic filler 22a and a first interlayer dielectric film 13a are formed in accordance with the same procedures as in the above-described example [FIG. 31A]. After removal of the first organic filler 22a, polysilicon and silicon oxide are deposited and etched by anisotropic etching to form a floating gate 5 [FIG. 31B]. Then, the process is performed to obtain the structure shown in FIG. 31C in accordance with the same procedures as in the above-described example.

EXAMPLE 29

Example 7 of Production Method

Figure 32:
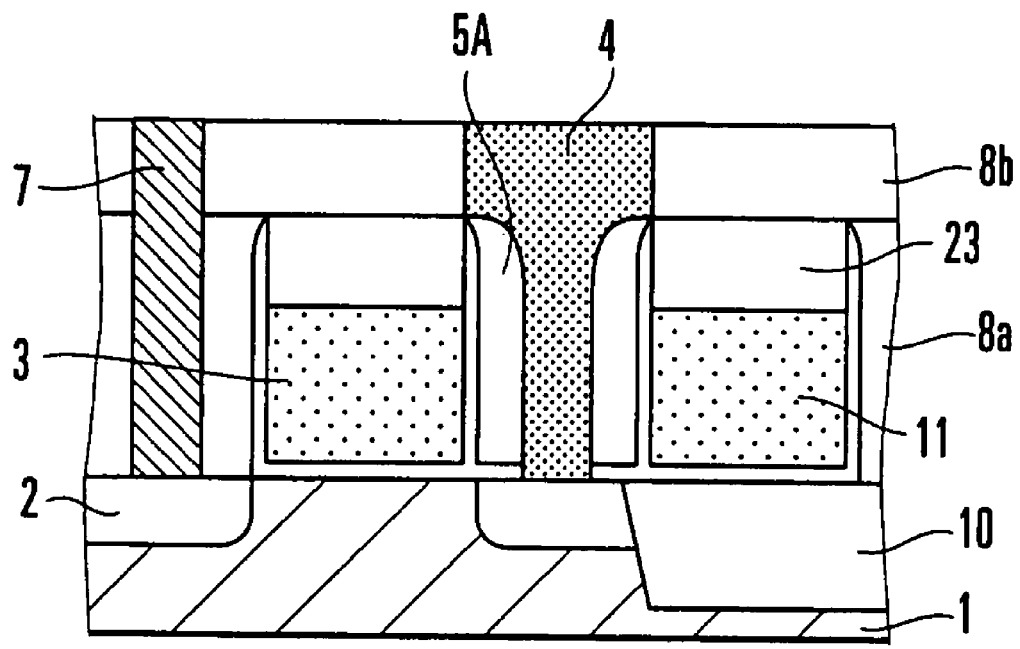
FIG. 32 is a sectional view for explaining Example 7 of the production method of the present invention.

FIG. 32 is a sectional view for explaining Example 7 of the production method. In this example, the floating gate of polysilicon formed in Example 6 of the production method is changed to a floating gate including an electron trap film. More specifically, after the state shown in FIG. 31A is obtained, a first organic filler 22a is removed. Aluminum oxide and silicon oxide are deposited and etched by anisotropic etching to form an insulating floating gate 5A. Then, subsequent steps including the step of forming a drain leader line 4 are executed to form the structure shown in FIG. 32.

In this example, the second organic filler formation step and floating gate oxidation step can be omitted so that the process is simplified. An organic filler is used in Examples 26 to 29 (Examples 4 to 7 of the production method). However, a material such as silicon nitride capable of high selective etching with respect to silicon oxide or Si may be used as an inorganic filler. The inorganic filler is not limited to silicon nitride. It can also be formed by using, e.g., a phosphor-containing oxide film and removed by, e.g., high selective vapor phase HF etching.

EXAMPLE 30

Example 8 of Production Method

FIGS. 33A to 33D are sectional views for explaining steps in Example 8 of the production method. First, an element isolation region 10 to define active regions is formed in the surface region of a p-type silicon substrate 1. A gate insulating film is formed by thermal oxidation. Polysilicon is deposited and patterned to form a control gate electrode 3. A sidewall is formed on its side surface. Ion implantation is executed to form n-type diffusion layers 2 serving as source and drain regions. Silicon oxide is deposited to form a first interlayer dielectric film 8a. After surface planarization by, e.g., CMP, polysilicon is deposited and patterned to form a floating gate 5. A silicon oxide film is further deposited to form a second interlayer dielectric film 8b [FIG. 33A].

Figure 33A:
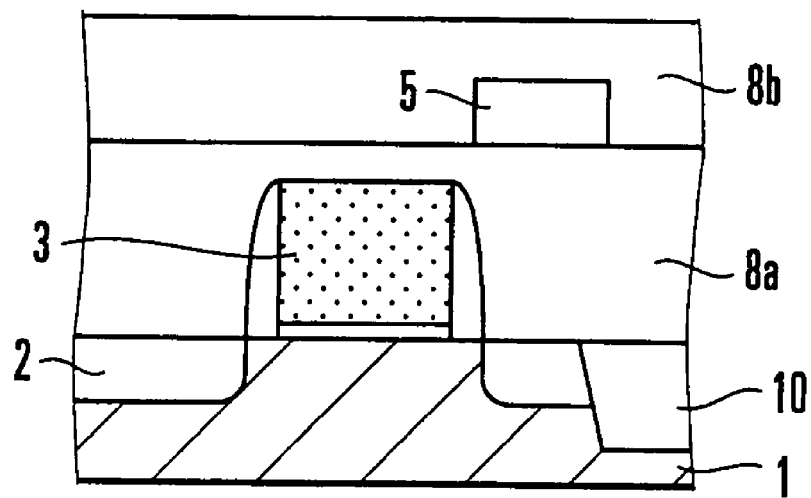
FIGS. 33A to 33D are sectional views showing steps in Example 8 of the production method of the present invention.
Figure 33B:
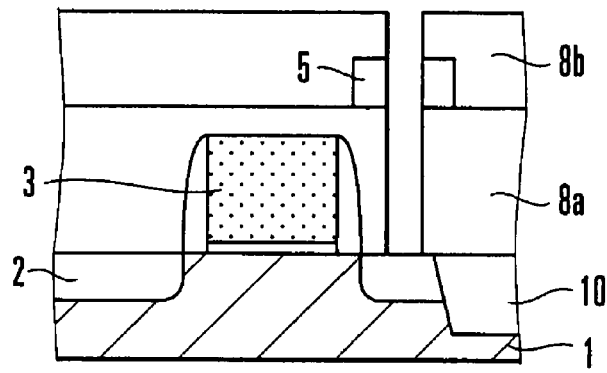
Figure 33C:
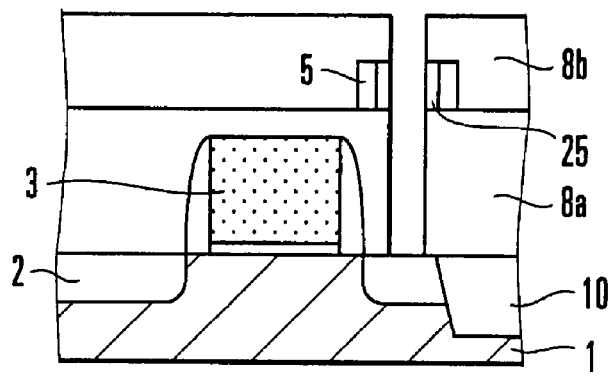
Figure 33D:
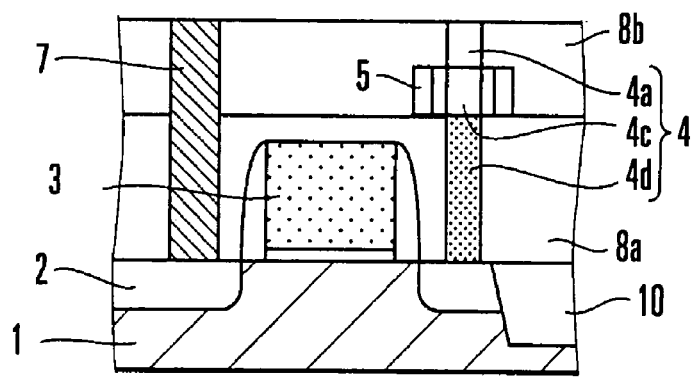
Figure 34A:
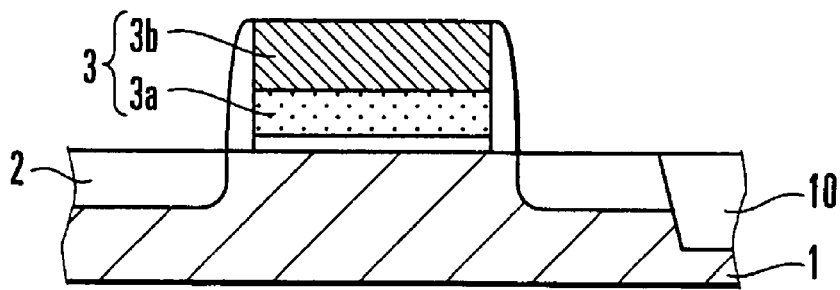
FIGS. 34A to 34F are sectional views showing steps in Example 9 of the production method of the present invention.
Figure 34B:
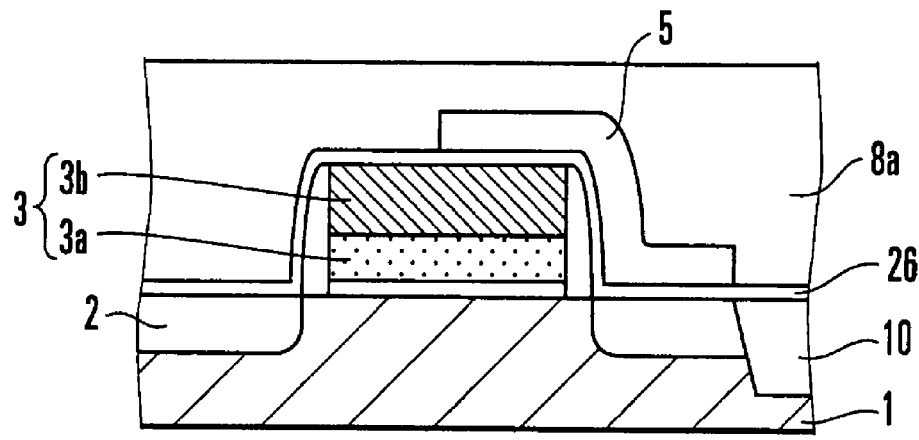
Figure 34C:
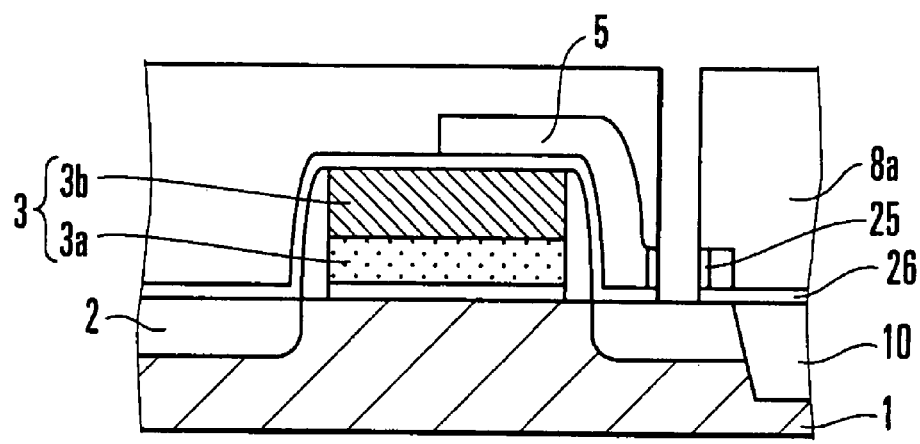
Figure 34D:
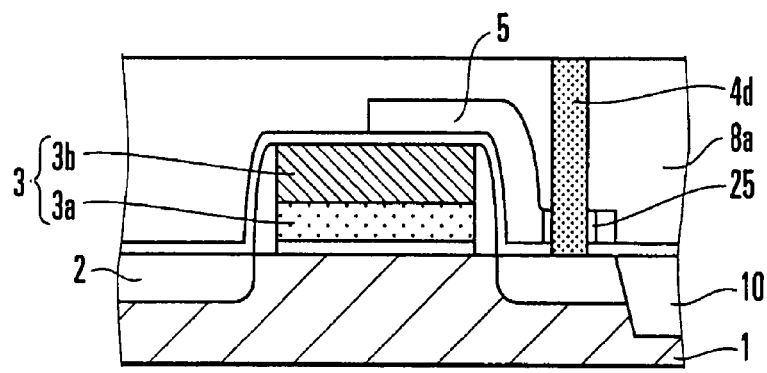
Figure 34E:
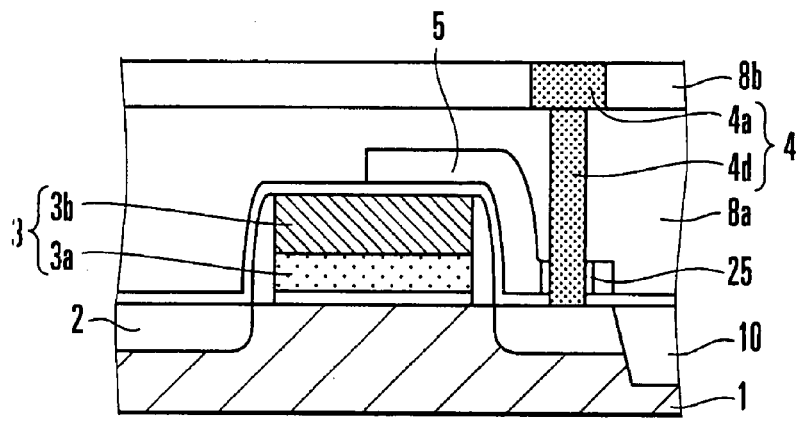
Figure 34F:
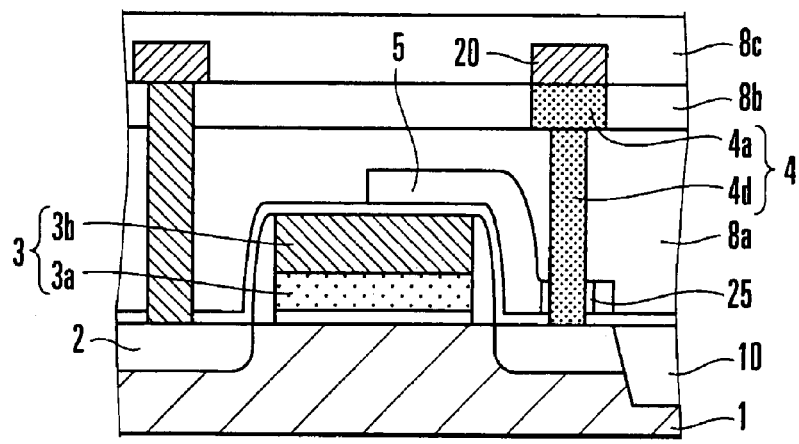
Figure 35A:
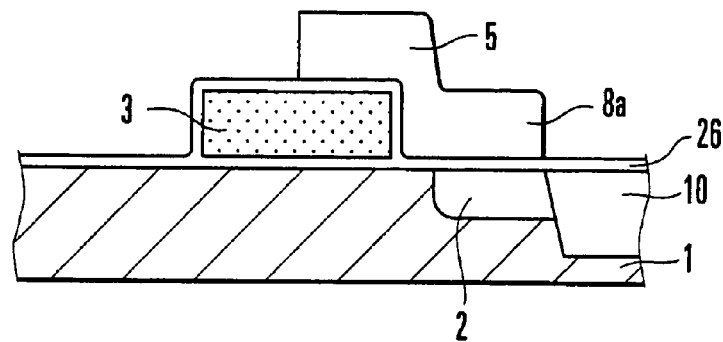
FIGS. 35A to 35D are sectional views showing steps in Example 10 of the production method of the present invention.
Figure 35B:
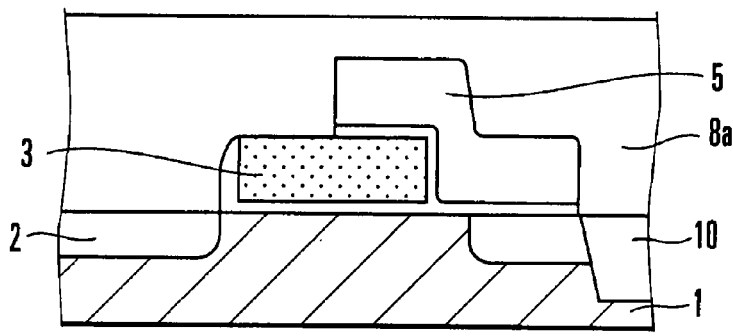
Figure 35C:
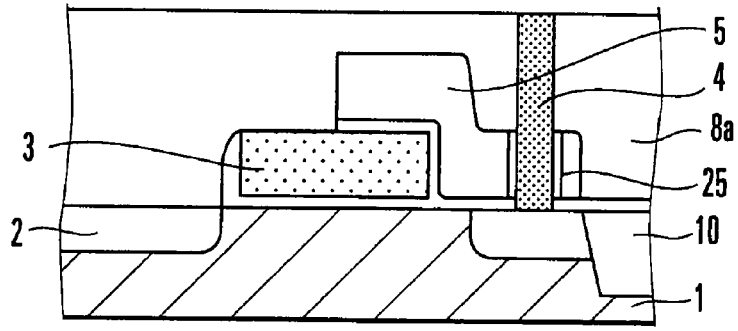
Figure 35D:
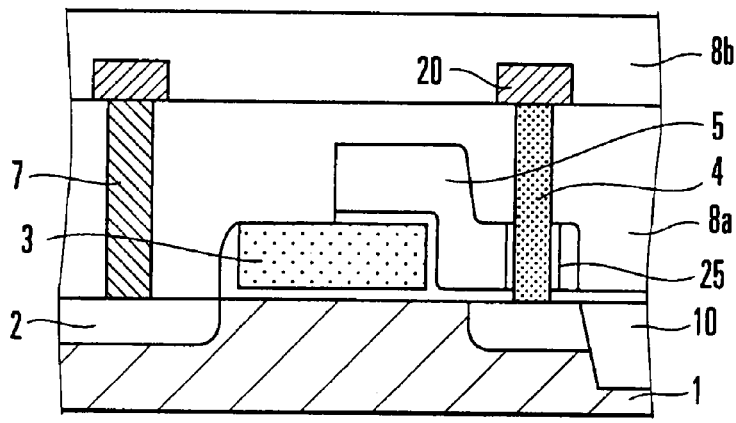
Figure 36A:
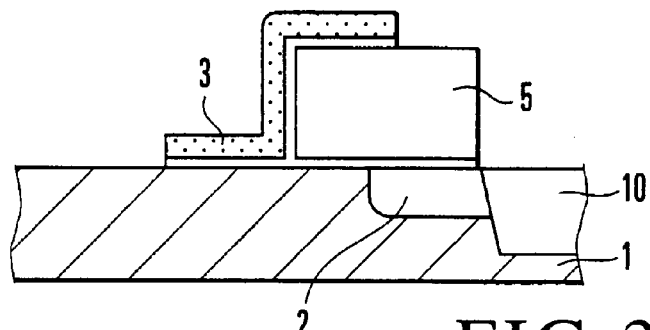
FIGS. 36A to 36D are sectional views showing steps in Example 11 of the production method of the present invention.
Figure 36B:
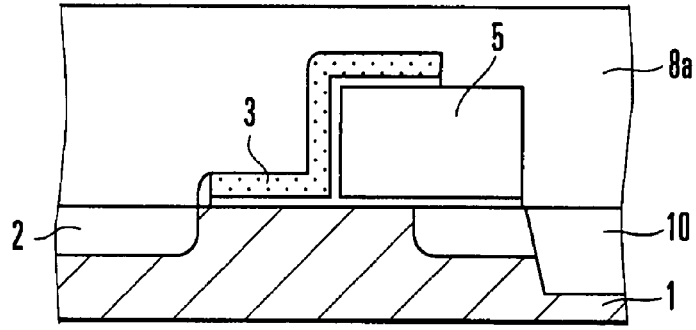
Figure 36C:
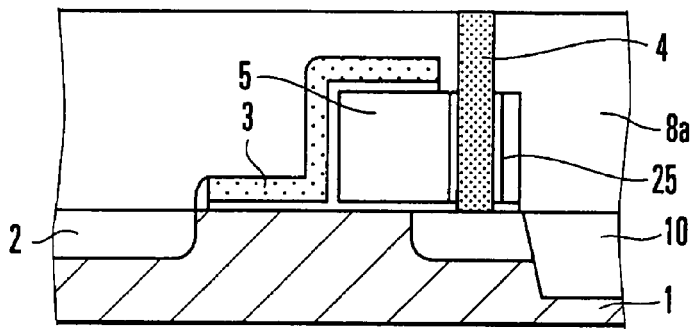
Figure 36D:
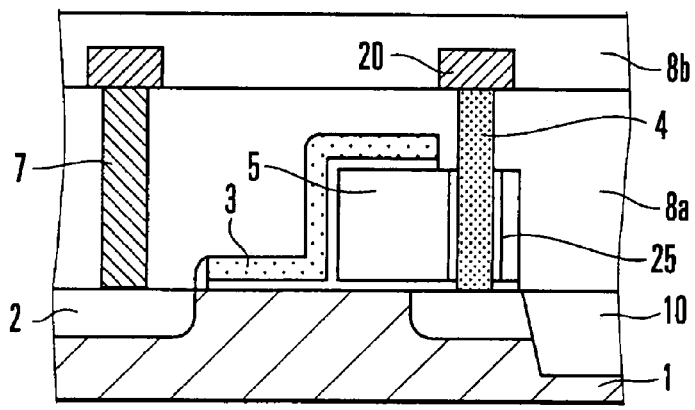
Figure 37A:
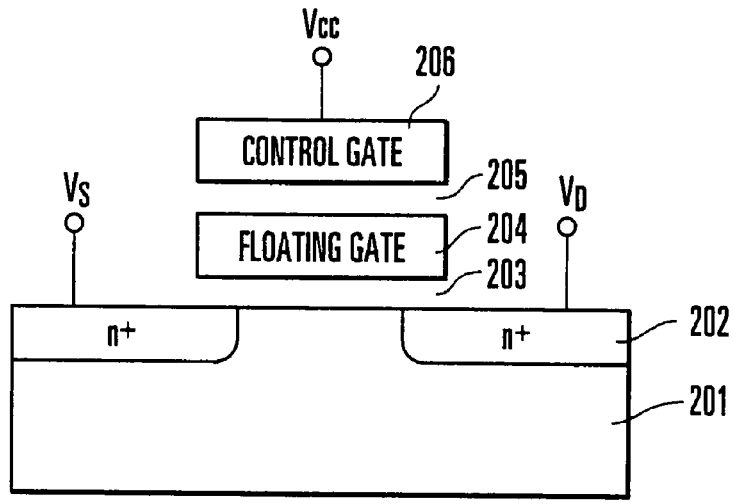
FIG. 37A is a sectional view of a prior art.
Figure 37B:
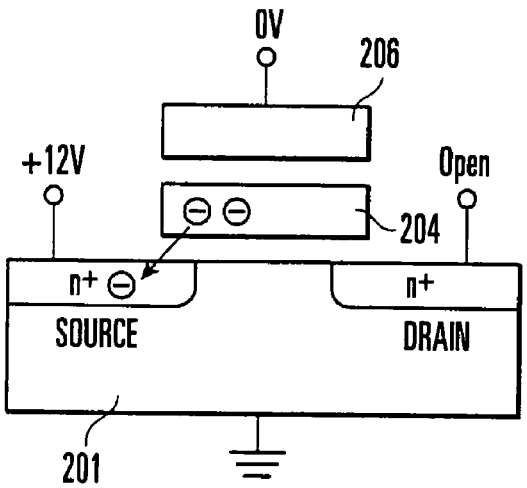
FIGS. 37B and 37C are explanatory views of the operation of the prior art.
Figure 37C:
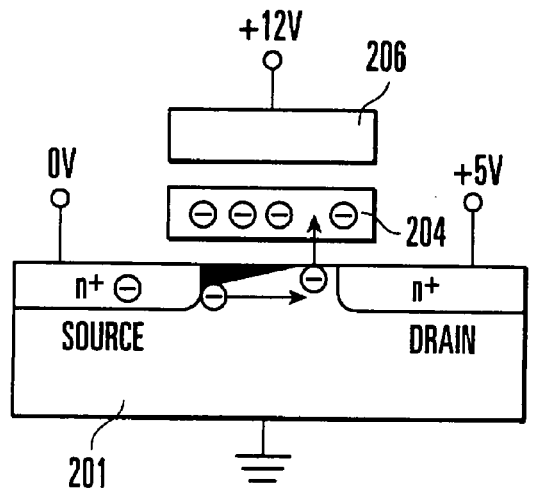

The second interlayer dielectric film 8b, floating gate 5, and first interlayer dielectric film 8a are selectively etched by photolithography to form a contact hole on the drain region [FIG. 33B]. A silicon oxide film 25 serving as a gate insulating film is formed in the inner surface of the floating gate 5 by thermal oxidation [FIG. 33C]. The silicon oxide film on the bottom surface of the contact hole is removed by anisotropic etching. After surface treatments, an n-type single-crystal silicon film 4d is grown in the contact hole by selective growth. $T_2O_5$ is deposited by collimate sputtering to form an insulating film 4c in the contact hole. Deposition and etch-back (or CMP) of polysilicon are done to bury an n-type polysilicon film 4a, thereby forming a drain leader line 4 including the n-type single-crystal silicon film 4d, insulating film 4c, and n-type polysilicon film 4a. The second and first interlayer dielectric films 8b and 8a are selectively etched to form a contact hole on the source region. A metal is deposited to fill the contact hole. A source leader line 7 is formed by etch-back (or CMP) [FIG. 33D]. One or a plurality of layers of interconnections and interlayer dielectric films are formed on the structure as needed.

EXAMPLE 31

Example 9 of Production Method

FIGS. 34A to 34F are sectional views for explaining steps in Example 9 of the production method. First, an element isolation region 10 to define active regions is formed in the surface region of a p-type silicon substrate 1. A gate insulating film is formed by thermal oxidation. Polysilicon and titanium are deposited and patterned by photolithography to form, on the active region, a control gate electrode 3 including a polysilicon film 3a and a metal film 3b. Silicon oxide is deposited and etched by anisotropic etching to form a sidewall on the side surface of the control gate electrode 3. Ion implantation is executed by using the control gate electrode and sidewall as a mask to form n-type (diffusion layers 2 serving as source and drain regions [FIG. 34A]. After surface treatments, a silicon oxide film 26 is formed by thermal oxidation and deposition of silicon oxide. Polysilicon is deposited and patterned to form a floating gate 5 partially overlapping the control gate electrode 3. Silicon oxide is deposited and planarized to form a first interlayer dielectric film 8a [FIG. 34B].

The first interlayer dielectric film 8a and floating gate 5 are selectively etched by photolithography to form a contact hole on the drain region. A silicon oxide film 25 is formed in the inner surface of the floating gate 5 by thermal oxidation [FIG. 34C]. After anisotropic etching and surface treatments, a silicon crystal is grown by selective growth to form an n-type single-crystal silicon film 4d in the contact hole [FIG. 34D]. Polysilicon is deposited and patterned to leave an n-type polysilicon film 4a, thereby forming a drain leader line 4 including the n-type single-crystal silicon film 4d and n-type polysilicon film 4a. An insulating film such as a silicon oxide film is deposited to form a second interlayer dielectric film 8b. The surface of the n-type polysilicon film 4a is exposed by etch-back (or CMP) [FIG. 34E]. The second interlayer dielectric film 8b and first interlayer dielectric film 8a are selectively etched to form a contact hole on the source region. A metal is deposited by sputtering to fill the contact hole. A source leader line 7 is formed by etch-back (or CMP). After that, a metal film of, e.g., Al is deposited by sputtering and patterned to form a metal interconnection 20. An insulating film is deposited on the entire surface to form a third interlayer dielectric film 8c [FIG. 34F].

EXAMPLE 32

Example 10 of Production Method

FIGS. 35A to 35D are sectional views for explaining steps in Example 10 of the production method. First, an element isolation region 10 to define active regions is formed in the surface region of a p-type silicon substrate 1. A resist film having an opening on the drain formation region is formed by photolithography. Ion implantation is executed by using the resist film as a mask to form an n-type diffusion layer 2 serving as a drain region.

A gate insulating film is formed by thermal oxidation. Polysilicon is deposited and patterned by photolithography to form a control gate electrode 3. A silicon oxide film 26 is formed by surface treatments, thermal oxidation, and deposition of silicon oxide. Polysilicon is deposited and patterned to form a floating gate 5 which has a portion overlapping the control gate electrode 3 and runs on the drain region [FIG. 35A]. Silicon oxide is deposited and etched by anisotropic etching to form a sidewall on the side surface of the control gate electrode 3. Ion implantation is executed to form an n-type diffusion layer 2 serving as a source region. Silicon oxide is deposited and planarized to form a first interlayer dielectric film 8a [FIG. 35B].

The first interlayer dielectric film 8a and floating gate 5 are selectively etched by photolithography to form a contact hole on the drain region. A silicon oxide film 25 serving as a gate insulating film is formed in the inner surface of the floating gate 5 by thermal oxidation. After anisotropic etching and surface treatments, polysilicon is deposited. A drain leader line 4 made of n-type polysilicon is formed in the contact hole by etch-back (or CMP) [FIG. 35C]. The first interlayer dielectric film 8a is selectively etched to form a contact hole on the source region. A metal is deposited by sputtering to fill the contact hole. A source leader line 7 is formed by etch-back (or CMP). After that, a metal film of, e.g., Al is deposited by sputtering and patterned to form a metal interconnection 20. An insulating film is deposited on the entire surface to form a second interlayer dielectric film 8b [FIG. 35D].

EXAMPLE 33

Example 11 of Production Method

FIGS. 36A to 36D are sectional views for explaining steps in Example 11 of the production method. First, an element isolation region 10 to define active regions is formed in the surface region of a p-type silicon substrate 1. A resist film having an opening on the drain formation region is formed by photolithography. Ion implantation is executed by using the resist film as a mask to form an n-type diffusion layer 2 serving as a drain region.

After thermal oxidation, polysilicon is deposited and patterned by photolithography to form a floating gate 5 that covers the drain region. A gate insulating film is formed by surface treatments and thermal oxidation. Polysilicon is deposited and patterned to form a control gate electrode 3 having a portion overlapping the floating gate 5 [FIG. 36A]. Silicon oxide is deposited and etched by anisotropic etching to form a sidewall on the side surface of the control gate electrode 3. Ion implantation is executed to form an n-type diffusion layer 2 serving as a source region. Silicon oxide is deposited and planarized to form a first interlayer dielectric film 8a [FIG. 36B].

The first interlayer dielectric film 8a and floating gate 5 are selectively etched by photolithography to form a contact hole on the drain region. A silicon oxide film 25 serving as a gate insulating film is formed in the inner surface of the floating gate 5 by thermal oxidation. After anisotropic etching and surface treatments, polysilicon is deposited. A drain leader line 4 made of n-type polysilicon is formed in the contact hole by etch-back (or CMP) [FIG. 36C]. The first interlayer dielectric film 8a is selectively etched to form a contact hole on the source region. A metal is deposited by sputtering to fill the contact hole. A source leader line 7 is formed by etch-back (or CMP). After that, a metal film of, e.g., Al is deposited by sputtering and patterned to form a metal interconnection 20. An insulating film is deposited on the entire surface to form a second interlayer dielectric film 8b [FIG. 36D].

The preferred embodiment and examples of the present invention have been described above. The present invention is not limited to the embodiment and examples, and various changes and modifications can be made, as needed, without departing from the spirit and scope of the present invention. For example, the conductivity types in the examples may be inverted to reverse the polarities of application voltages.

The invention claimed is:

1. A nonvolatile semiconductor storage unit comprising:
a control transistor having a control gate electrode formed on a semiconductor substrate, and
source and drain regions formed in a semiconductor substrate region to sandwich said control gate electrode; and
a switching element having a current path leader line led from one of the source and drain regions to be substantially perpendicular to the substrate, an ON/OFF state control region essentially made of one of a semiconductor and an insulator as part of the current path leader line, and
a floating gate which has an annular shape surrounding at least part of the ON/OFF state control region of the current path leader line and controls an ON/OFF state of the ON/OFF state control region on the basis of a charge accumulation state.

2. A nonvolatile semiconductor storage unit according to claim 1, characterized in that a section of the current path of said switching element has a shape close to one of an elliptical shape and a rectangular shape or an elongate shape and is long in a gate width direction of said control transistor.

3. A nonvolatile semiconductor storage unit according to claim 2, characterized in that
the floating gate is essentially made of one of a metal, silicon of a first conductivity type which is the same as a conductivity type of the source and drain regions of said control transistor, and an insulator to accumulate charges,
the current path of said switching element has a first region serving as the ON/OFF state control region facing the floating gate, a second region existing on a semiconductor substrate side of the first region, and a third region existing on an interconnection side opposite to the semiconductor substrate side of the first region, and when the conductivity type of the source and drain regions of said control transistor is defined as the first conductivity type,
the second region, the first region, and the third region are formed from one of combinations of a semiconductor of the first conductivity type,
a semiconductor of the first conductivity type, and
a semiconductor of the first conductivity type;
a semiconductor of a second conductivity type,
a semiconductor of the first conductivity type, and
a semiconductor of the first conductivity type;
a semiconductor of the first conductivity type,
a semiconductor of the second conductivity type, and
a semiconductor of the first conductivity type;
a semiconductor of the first conductivity type, an insulator, and
a semiconductor of the first conductivity type;
a semiconductor of the first conductivity type, an insulator, and
a semiconductor of the second conductivity type; and a metal or sificide, an insulator, and a metal or silicide.

4. A nonvolatile semiconductor storage unit according to claim 3, characterized in that
when the current path is formed from the combination of
a semiconductor of the first conductivity type,
a semiconductor of the second conductivity type, and
a semiconductor of the first conductivity type, the first region of the second conductivity type has a longitudinal section with an inverted T-shape to form an overhang, the region of the second conductivity type and the region of the first conductivity type that contacts the region of the second conductivity type have a sectional area larger than that of the region of the first conductivity type except a portion contacting the region of the second conductivity type, and the floating gate overlaps the overhang.

5. A nonvolatile semiconductor storage unit according to claim 3, characterized in that
when the first region of the current path is made of an insulator, the insulating film is essentially formed from an insulating film having an electron barrier lower than that of a silicon oxide film.

6. A nonvolatile semiconductor storage unit according to claim 5, characterized in that
the insulating film is essentially made of a material selected from the group consisting of silicon nitride, tantalum oxide, zirconium oxide, hafnium oxide, and BST (Barium Strontium Titanate).

7. A nonvolatile semiconductor storage unit according to claim 3, characterized in that
a region of the current path, which is made of a semiconductor, is essentially made of single-crystal silicon.

8. A nonvolatile semiconductor storage unit according to claim 3, characterized in that
when the current path of said switching element uses a semiconductor of the first conductivity type, an impurity concentration in a region of the first conductivity type is at least $1\times10^{18}/cm^3$.

9. A nonvolatile semiconductor storage unit according to claim 3, characterized in that
a write/erase control interconnection is formed on an element isolation region spaced apart from a center line of the current path of said switching element by a distance substantially equal to that between the control gate electrode and the center line.

10. A nonvolatile semiconductor storage unit according to claim 9, characterized in that
the write/erase control interconnection is essentially made of the same material as the control gate electrode.

11. A nonvolatile semiconductor storage unit according to claim 9, characterized in that
the write/erase control interconnection is essentially made of the same material as the control gate electrode.

12. A nonvolatile semiconductor storage unit according to claim 9, characterized by further comprising
a region where at least one of the write/erase control interconnection and the control gate electrode faces the floating gate in a direction parallel to the substrate.

13. A nonvolatile semiconductor storage unit according to claim 12, characterized in that
the region where at least one of the write/erase control interconnection and the control gate electrode faces the floating gate in the direction parallel to the substrate is essentially made of a material selected from the group consisting of Sr, Y, Gd, Lu, Hf, Ti, Sm, Eu, Nd, Ce, Ba, Cs, and an alloy thereof.

14. A nonvolatile semiconductor storage unit according to claim 3, characterized in that
the floating gate has a thickness of not more than 50 nm.

15. A nonvolatile semiconductor storage unit according to claim 3, characterized in that
when the floating gate uses an insulator to accumulate charges, the insulating material contains at least one of silicon nitride and aluminum oxide.

16. A nonvolatile semiconductor storage unit according to claim 15, characterized in that
when the insulating material contains a ferroelectric material.

17. A nonvolatile semiconductor storage unit according to claim 15, characterized in that
the insulating material is essentially made of an insulator containing dots to accumulate charges.

18. A nonvolatile semiconductor storage unit according to claim 3, characterized in that
even an insulating film sandwiched between the floating gate and the current path of said switching element has a charge accumulation function.

19. A nonvolatile semiconductor storage unit according to claim 3, characterized in that
a bottom surface of the floating gate covers part of a channel region of said control transistor to easily inject hot carriers generated in the channel region of said control transistor and control a current flowing through said control transistor.

20. A nonvolatile semiconductor storage unit according to claim 3, characterized in that
the floating gate is formed at a higher level than the control gate electrode.

21. A nonvolatile semiconductor storage unit according to claim 3, characterized in that
the current path of said switching element and the source and drain regions of said control transistor are connected via a metal silicide layer formed on the source and drain regions of said control transistor.

22. A nonvolatile semiconductor storage unit according to claim 3, characterized in that
a control gate insulating film of said control transistor has a high-K insulating film.

23. A nonvolatile semiconductor storage unit according to claim 3, characterized in that
a plurality of sets each including said control transistor and said switching element are arrayed.

24. A nonvolatile semiconductor storage unit according to claim 3, characterized in that
a logic circuit unit and a nonvolatile semiconductor memory unit in which a plurality of sets each including said control transistor and said switching element are arrayed are arranged on a single semiconductor substrate.

* * * * *